(12) United States Patent
Ockerse et al.

(10) Patent No.: US 7,543,946 B2
(45) Date of Patent: Jun. 9, 2009

(54) DIMMABLE REARVIEW ASSEMBLY HAVING A GLARE SENSOR

(75) Inventors: Harold C. Ockerse, Holland, MI (US);
Jon H. Bechtel, Holland, MI (US);
Joseph S. Stam, Holland, MI (US);
Darin D. Tuttle, Byron Center, MI (US);
Wayne J. Rumsey, Holland, MI (US);
Jeremy A. Walser, Grand Rapids, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

(21) Appl. No.: 10/833,900

(22) Filed: Apr. 28, 2004

(65) Prior Publication Data

US 2005/0024729 A1 Feb. 3, 2005

Related U.S. Application Data

(63) Continuation-in-part of application No. 10/068,540, filed on Feb. 6, 2002, now Pat. No. 6,831,268, which is a continuation-in-part of application No. 10/043,977, filed on Jan. 10, 2002, now Pat. No. 6,679,608.

(51) Int. Cl.
*G02B 5/08* (2006.01)
*B60R 1/08* (2006.01)

(52) U.S. Cl. .................. 359/604; 250/216; 250/239

(58) Field of Classification Search ......... 359/601–603, 359/265–275; 250/216, 239
See application file for complete search history.

(56) References Cited

U.S. PATENT DOCUMENTS

| | | | |
|---|---|---|---|
| 3,260,849 A | 7/1966 | Polye | |
| 3,749,477 A | 7/1973 | Willoughby et al. | |
| 4,023,368 A | 5/1977 | Kelly | |
| 4,140,142 A | 2/1979 | Dormidontov et al. | |
| 4,208,668 A | 6/1980 | Krimmel | |
| 4,225,782 A | 9/1980 | Kuppenheimer et al. | |
| 4,293,877 A | 10/1981 | Tsunekawa et al. | |
| 4,315,159 A | 2/1982 | Niwa et al. | |
| 4,465,370 A | 8/1984 | Yuasa et al. | |
| 4,475,036 A * | 10/1984 | Bauer et al. | 250/239 |
| 4,603,946 A * | 8/1986 | Kato et al. | 349/195 |
| 4,669,826 A | 6/1987 | Itoh et al. | |
| 4,678,938 A | 7/1987 | Nakamura | |
| 4,684,222 A | 8/1987 | Borrelli et al. | |

(Continued)

FOREIGN PATENT DOCUMENTS

EP 0869032 10/1998

(Continued)

*Primary Examiner*—Alessandro Amari
*Assistant Examiner*—Mark Consilvio
(74) *Attorney, Agent, or Firm*—Price, Heneveld, Cooper, DeWitt & Litton, LLP

(57) ABSTRACT

A rearview assembly of the present invention may include a housing adapted to be mounted to the vehicle, a rearview element disposed in the housing for providing an image to the driver of the rearward view from the vehicle, and a glare sensor positioned to receive light from passing through the rearview element. The glare sensor may be a surface-mounted to a circuit board. An optional secondary optical element may be disposed between the rearview element and the glare sensor. The optional secondary optical element may have an anamorphic lens for providing different fields of view horizontally versus vertically.

9 Claims, 49 Drawing Sheets

U.S. PATENT DOCUMENTS

| | | | |
|---|---|---|---|
| 4,690,508 A | 9/1987 | Jacob | |
| 4,697,883 A | 10/1987 | Suzuki et al. | |
| 4,701,022 A * | 10/1987 | Jacob | 359/603 |
| 4,799,768 A | 1/1989 | Gahan | |
| 4,819,071 A | 4/1989 | Nakamura | |
| 4,916,307 A | 4/1990 | Nishibe et al. | |
| 5,036,437 A | 7/1991 | Macks | |
| 5,105,207 A | 4/1992 | Nelson | |
| 5,172,206 A | 12/1992 | Iizuka | |
| 5,204,778 A | 4/1993 | Bechtel | |
| 5,214,274 A | 5/1993 | Yang | |
| 5,235,178 A | 8/1993 | Hegyi | |
| 5,243,215 A | 9/1993 | Enomoto et al. | |
| 5,338,691 A | 8/1994 | Enomoto et al. | |
| 5,386,128 A | 1/1995 | Fossum et al. | |
| 5,410,455 A | 4/1995 | Hashimoto | |
| 5,416,318 A | 5/1995 | Hegyi | |
| 5,426,294 A | 6/1995 | Kobayashi et al. | |
| 5,434,407 A * | 7/1995 | Bauer et al. | 250/227.24 |
| 5,451,822 A | 9/1995 | Bechtel et al. | |
| 5,471,515 A | 11/1995 | Fossum | |
| 5,488,416 A | 1/1996 | Kyuma | |
| 5,526,190 A * | 6/1996 | Hubble et al. | 359/719 |
| 5,550,677 A * | 8/1996 | Schofield et al. | 359/604 |
| 5,625,210 A | 4/1997 | Lee et al. | |
| 5,644,418 A | 7/1997 | Woodward | |
| 5,659,423 A * | 8/1997 | Schierbeek et al. | 359/604 |
| 5,661,303 A * | 8/1997 | Teder | 250/341.8 |
| 5,666,028 A | 9/1997 | Bechtel et al. | |
| 5,712,685 A | 1/1998 | Dumas | |
| 5,760,962 A | 6/1998 | Schofield et al. | |
| 5,789,737 A | 8/1998 | Street | |
| 5,796,094 A | 8/1998 | Schofield et al. | |
| 5,808,350 A | 9/1998 | Jack et al. | |
| 5,841,126 A | 11/1998 | Fossum et al. | |
| 5,841,159 A | 11/1998 | Lee et al. | |
| 5,841,177 A | 11/1998 | Komoto et al. | |
| 5,869,883 A | 2/1999 | Mehringer et al. | |
| 5,904,493 A | 5/1999 | Lee et al. | |
| 5,923,027 A | 7/1999 | Stam et al. | |
| 6,027,955 A | 2/2000 | Lee et al. | |
| 6,097,023 A | 8/2000 | Schofield et al. | |
| 6,114,688 A * | 9/2000 | Tanaka et al. | 250/216 |
| 6,320,182 B1 | 11/2001 | Hubble, III et al. | |
| 6,359,274 B1 | 3/2002 | Nixon et al. | |
| 6,376,824 B1 * | 4/2002 | Michenfelder et al. | 250/214 R |
| 6,379,013 B1 | 4/2002 | Bechtel et al. | |
| 6,441,886 B2 | 8/2002 | Suzuki et al. | |
| 6,504,142 B2 | 1/2003 | Nixon et al. | |
| 6,521,916 B2 | 2/2003 | Roberts et al. | |
| 6,548,808 B2 * | 4/2003 | Ozawa | 250/239 |

FOREIGN PATENT DOCUMENTS

| | | |
|---|---|---|
| EP | 0711683 | 3/2000 |
| EP | 0675345 | 6/2001 |
| WO | WO 97/35743 | 10/1997 |

* cited by examiner

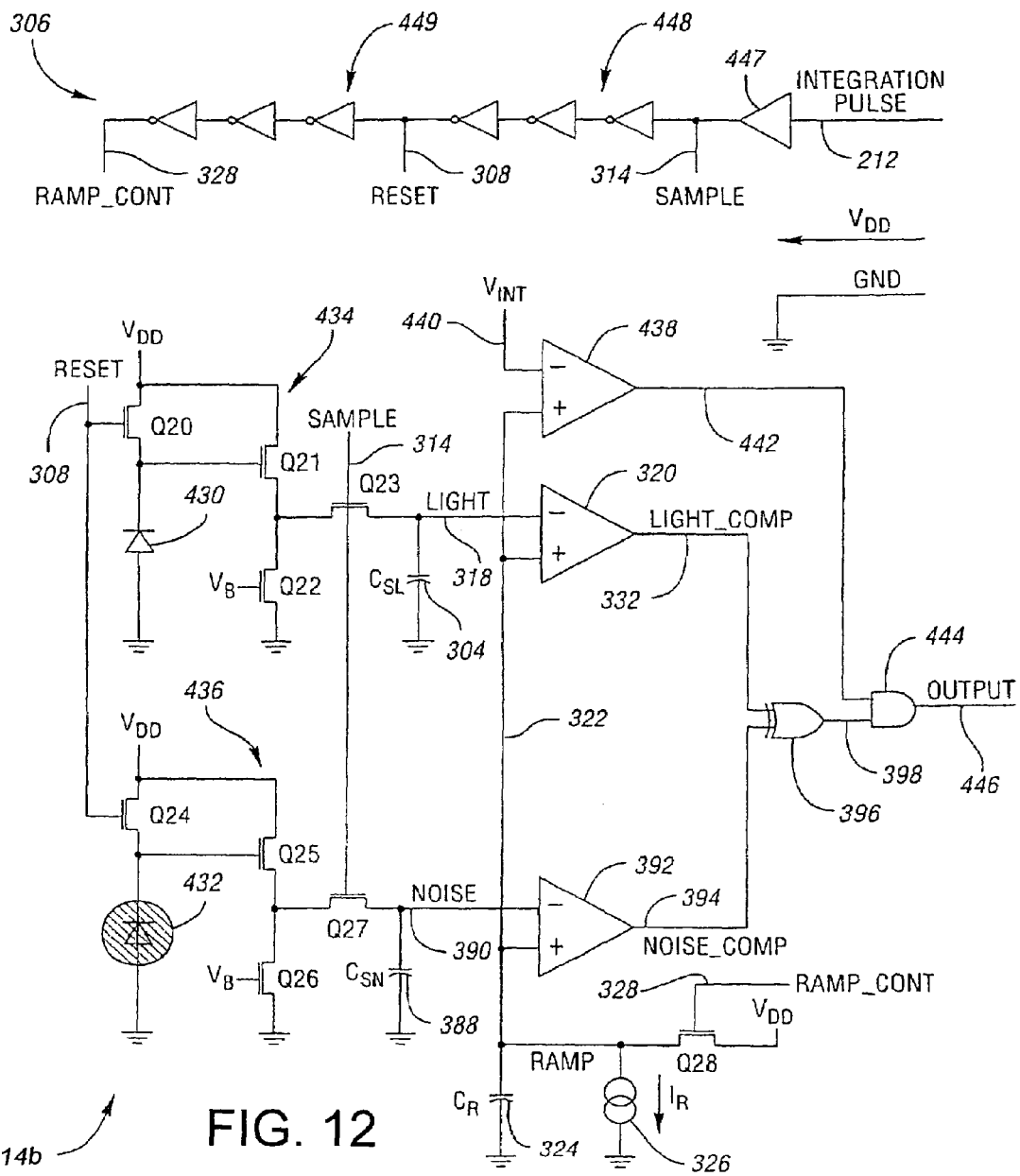
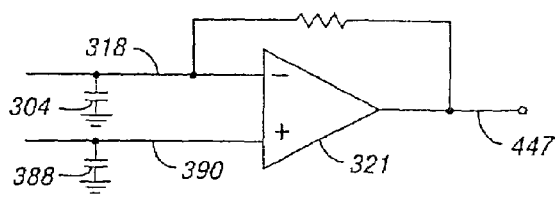
FIG. 12
FIG. 12A

FIG. 20
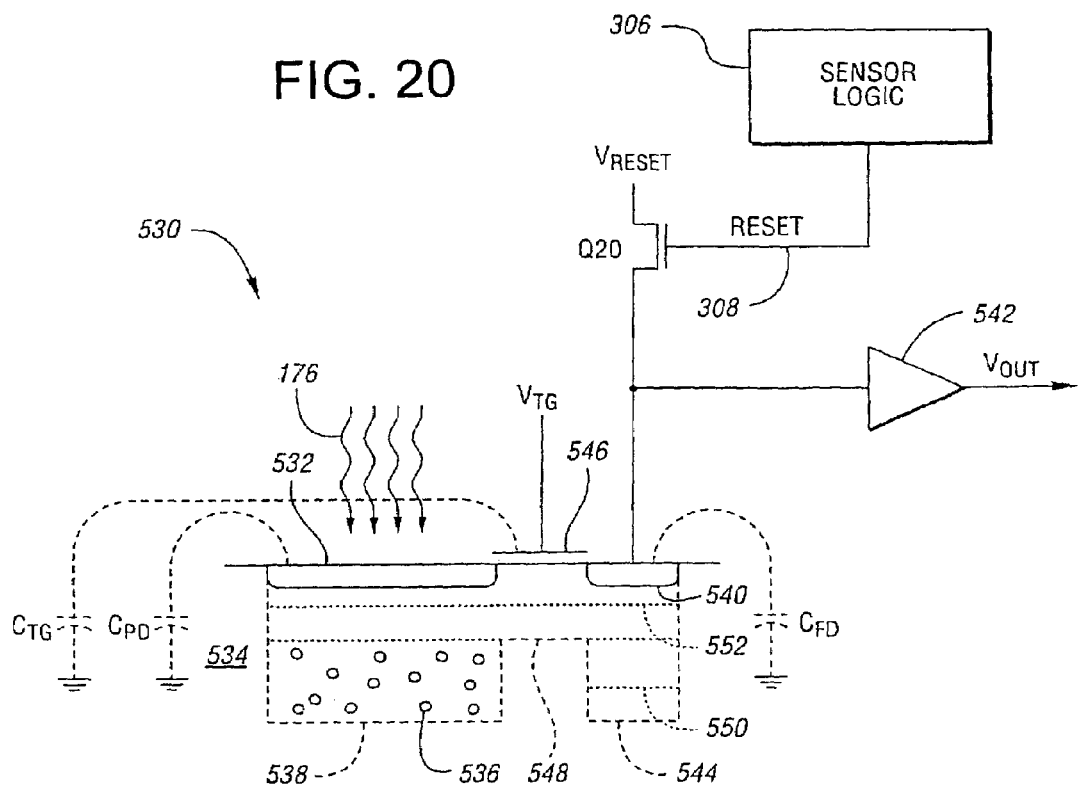
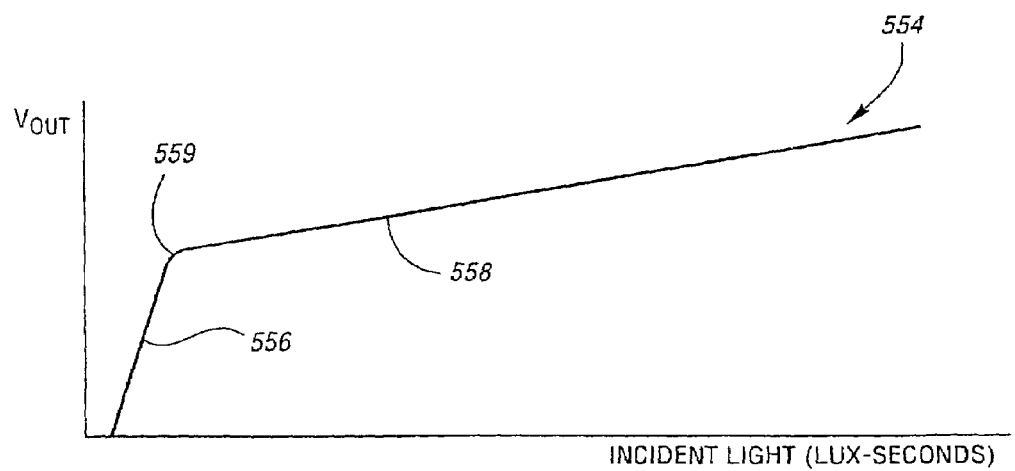
FIG. 21

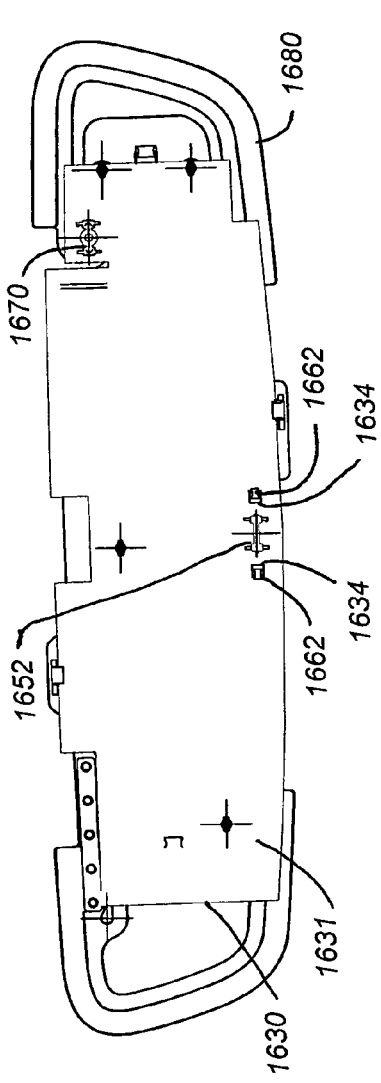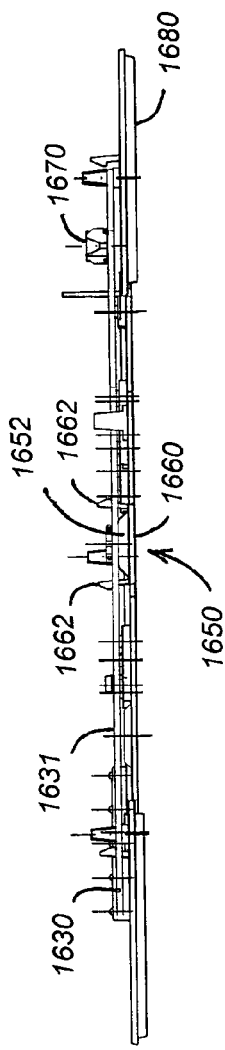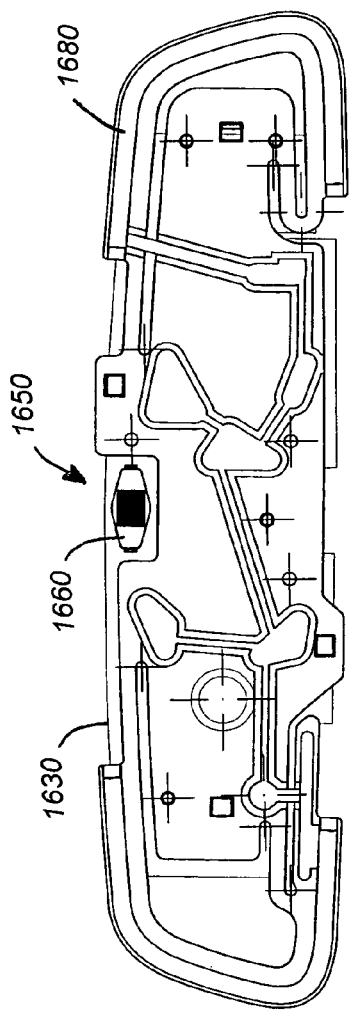

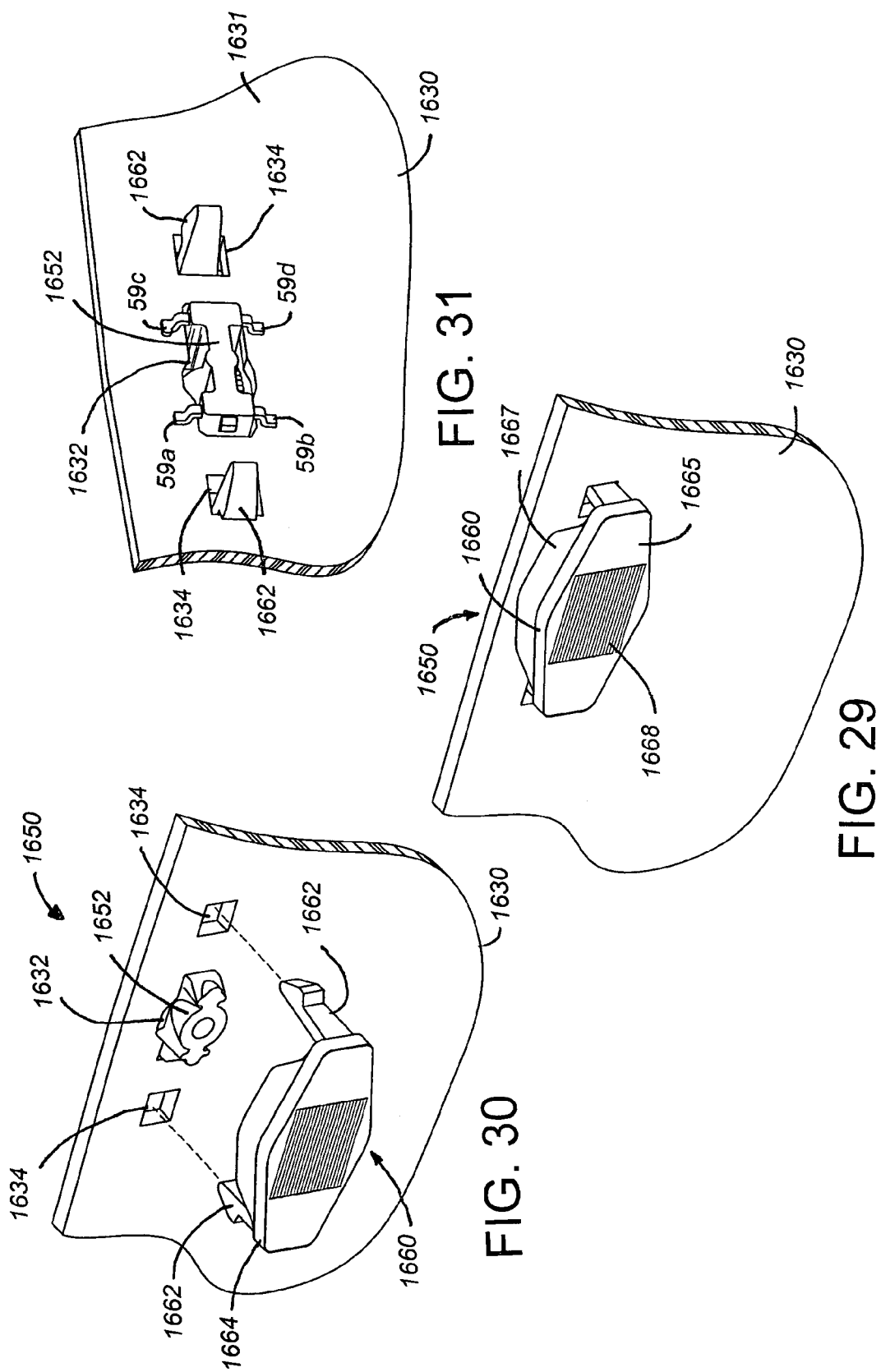

ps to the sensor often compromises the electrical design. In
DIMMABLE REARVIEW ASSEMBLY HAVING A GLARE SENSOR

CROSS-REFERENCE TO RELATED APPLICATIONS

This application is a continuation-in-part of U.S. patent application Ser. No. 10/068,540 filed on Feb. 6, 2002, now U.S. Pat. No. 6,831,268 which is a continuation-in-part of U.S. patent application Ser. No. 10/043,977 filed on Jan. 10, 2002, now U.S. Pat. No. 6,679,608. The entire disclosure of each of the above applications is incorporated herein by reference.

BACKGROUND OF THE INVENTION

The present invention generally relates to an optical radiation sensor device, and more particularly to a sensor device incorporating a photosensor.

Light sensors are used in a large number of different applications. In such light sensing applications, several characteristics of the sensing mechanism need to be in acceptable ranges and some further need to be characterized for specific light sensing applications. Other characteristics of the sensor may increase the range of applications for which the sensor is suitable and/or may provide for easier or more economical design applications. One characteristic for which general requirements vary significantly from one application to another is the angular response characteristic, i.e., the angular response profile, of the sensor which is needed for the particular application. A second characteristic is the optical gain, which for low light level measurements is preferably high enough to make stable measurements of the lowest light levels which need to be detected by the system. A third characteristic is the need to provide a relatively small, aesthetically attractive, space efficient aperture in the device for entrance of the light to be measured. A fourth characteristic is to allow substantial and preferably variable distance to separate the aperture from the electronic sensing device. A fifth characteristic is to utilize separate components to sense the light and to characterize the angular response characteristic so that the sensor may be used in a broad range of applications leading to increased standardization of the light sensing component.

Sensor devices of the type used to detect light are constructed in a variety of packages. For example, photoresistive sensors are often mounted on a circuit board with or without a separate lens positioned in front of the sensor. Some photodiodes have been constructed in which the sensor die is mounted to a lead frame and is encapsulated by a clear epoxy. A portion of the epoxy encapsulant is molded into a lens so as to focus incident light onto the sensor die. Such lenses have been either spherical or other surfaces of revolution that are symmetric about an axis which is generally perpendicular to the surface of the active sensing element. Unlike a sensor construction in which a separate lens is spaced from the sensor, the lens in these types of sensor devices is an integral part of the sensor and the space separating the sensor and the lens has been eliminated. The main design difference which results from filling the space between the lens and the sensor with plastic is that the speed of propagation of the light rays is reduced being inversely proportional to the index of refraction of the lens material. This effectively increases the focal length of the lens in proportion to the index of refraction of the material.

FIGS. 4a and 4b illustrate two general sensing configurations, each with similar angular response characteristics but with widely differing optical gains. In the first sensor configuration in FIG. 4a, the sensor is close to the aperture and has desirably high optical gain. Placement of the sensor close to the aperture often leads to the added cost of additional parts and assembly processes, and longer electrical connecting paths to the sensor often compromises the electrical design. In the second sensor configuration in FIG. 4b, the sensor is placed at an appreciable distance from the aperture and has undesirably low optical gain. The placement of the sensor may be convenient and less costly but for the overall design the reduction in optical gain, which may be severe, may compromise or even prevent satisfactory performance.

The angles between lines 41a and 42a and between lines 41b and 42b are the same in each of the illustrative examples and denote the nominal angle between the 50 percent response points in the optical angular response profile for each of the sensors. Light blocking portions of the housing 44a and 45a are depicted in FIG. 4A in fragmentary view on opposing sides of the aperture which contains a lens 43a. With the sensing element 48a placed closer to the case than the point 49a of intersection of the lines 41a and 42a which depict the optical aperture, the lens, possibly combined with diffusion and/or de-focusing, may serve to decrease the viewing aperture from the angle between lines 46a and 47a to that between lines 41a and 42a as targeted by the design. The lens 43a serves to concentrate light impinging on the sensor thereby increasing its optical gain. Thus, the desired reduction in the overall field of view is accomplished while increasing the optical gain of the system. The general requirement for this to work with a single, thin lens in a non-light piped mode is for the sensor 48a to be located closer to the aperture than the apex 49a of the conic surface depicted by lines 46a and 47a in FIG. 4A. The conic surface may be non-circular and is used only as a temporary gage for illustrative or design purposes. With the lens and/or filter removed, the conic surface is aligned in the required viewing direction and inserted as far as possible into the aperture opening which is provided. (The regions which are generally closer to the apertures than the points 49a or 49b may be referred to as the near field regions of the respective aperture.)

Light blocking portions of the housing 44b and 45b are depicted in FIG. 4B in fragmentary view on opposing sides of the aperture which contains a diffusing lens and/or surface 43b. In this case, sensor 48b is farther from the aperture than the apex 49b. The property of point 49b is similar to that of 49a. An alternative way to describe it is as the point on the sensor side of the aperture which is the most distant point from the aperture from which the full field for which the sensor should respond to incident light or a substantial portion thereof may be seen prior to placing an optical element in the aperture. In this case, the sensor 48b is more distant from the aperture than the point 49b so that the angle between lines 46b and 47b is less than the angle between lines 41b and 42b. In three-dimensional terms, the solid angle subtended by the aperture at point 48b where the sensor is located is smaller than the solid angle subtended by the aperture at point 49b where the desired field for response to incident light may be seen through the aperture with the lens and/or filter removed. In this case, an optical element 43b, which has a diffusing effect, may be incorporated in the aperture and if the diffusing effect is pronounced enough to bend enough rays coming from representative directions 41b and 42b to the extent that they may strike the sensor 48b, a balance may be found for which the diffusing effect expands the effective viewing field from that indicated by the angle between 46b and 47b to that between 41b and 42b, as required to meet the design objective. The disadvantage is that instead of concentrating the light and adding optical gain as was accomplished in the first example, the light level is effectively attenuated because rays that would have come unobstructed through the aperture and struck the sensor before placing the diffuser in it are now spread out by the disbursing effect of the diffuser so that the proportion of the rays which reaches the sensor is diminished. Accordingly, there exists the need for a sensor device construction that may be placed within a housing a distance from an aperture through the housing without sacrificing optical gain.

One application for light sensors is as a glare sensor for a vehicle rearview assembly. Rearview assemblies may include an electrochromic mirror element and/or a display element. With an electrochromic mirror element, light levels sensed by a rearward facing glare sensor may be monitored and used to control the reflectivity of the electrochromic mirror element to prevent excessive glare from other vehicle headlights to be reflected to the eyes of the driver. The intensity of a display may likewise be varied as a function of the light levels sensed by a glare sensor.

U.S. patent application Ser. No. 10/068,540 discloses a sensor device that may be placed within a housing of a rearview assembly at a distance from an aperture through the housing without sacrificing optical gain. As disclosed in that patent, it may be advantageous to provide a diffuser across the aperture in the housing. In one particular embodiment, the sensor device is used as a glare sensor that senses light through an aperture formed in the bezel of a rearview mirror assembly where a diffuser may be provided in the aperture.

Although the construction disclosed in the '540 patent application works very well, some vehicle manufacturers prefer that the sensor device be positioned behind the mirror element or display element in order to minimize the apparent size of the bezel. In addition, some vehicle manufacturers are providing "theater seating" in some of their vehicles by which the rear seats are raised relative to the front seats. This has the consequence that it can reduce percentage of light from the rear window that may be sensed within the field of view of the glare sensor. Insofar as glare sensors sense an average light level across their field of view, theater seating reduces the average light level otherwise sensed by the glare sensor. In addition, in the same model vehicle, the seats may have either light or dark upholstery, which may affect the light levels sensed by the glare sensor when the seats are within the field of view of the sensor. Accordingly, there exists a need for a rearview construction by which the glare sensor may be positioned behind the mirror or display element and by which the performance of the glare sensor is improved to account for such positioning and to account for varying views from the rear window.

SUMMARY OF THE INVENTION

Accordingly, it is an aspect of the present invention to provide a rearview assembly for use in a vehicle, the rearview assembly comprising: a housing adapted to be mounted to the vehicle; a rearview element disposed in the housing for providing an image to the driver of the rearward view from the vehicle, the rearview element comprising a reflective surface, wherein a transparent window is formed in the reflective surface; and a glare sensor subassembly mounted behind the window in the rearview element so as to sense light passing through the window of the rearview element, the glare sensor subassembly comprising a glare sensor device and a secondary optical element positioned between the glare sensor device and the rearview element.

According to another embodiment of the present invention, a rearview assembly is provided for use in a vehicle, the rearview assembly comprising: a housing adapted to be mounted to the vehicle; a rearview element disposed in the housing for providing an image to the driver of the rearward view from the vehicle; a circuit board mounted within the housing; and a glare sensor device surface-mounted to one surface of the circuit board for sensing light from the rear of the vehicle.

According to another embodiment of the present invention, a rearview assembly is provided for use in a vehicle, the rearview assembly comprising: a housing adapted to be mounted to the vehicle; a rearview element disposed in the housing for providing an image to the driver of the rearward view from the vehicle; and a glare subassembly comprising a glare sensor device for sensing light levels to the rear of the vehicle, and a secondary optical element, wherein the secondary optical element is configured to function as an anamorphic lens.

According to another embodiment of the present invention, a rearview assembly is provided for use in a vehicle, the rearview assembly comprising: a housing adapted to be mounted to the vehicle; a rearview element disposed in the housing for providing an image to the driver of the rearward view from the vehicle; and a glare sensor device mounted behind the rearview element so as to sense light passing through the rearview element. The glare sensor device comprising: a support structure; a sensing circuit mounted on the support substrate for sensing light and generating an electrical output signal in response thereto; and an encapsulant encapsulating the sensing circuit on the support structure, the encapsulant being configured to define a lens portion for focusing incident light onto an active surface of the sensing circuit, and a light collector portion surrounding the lens portion for collecting and redirecting light that is not incident on the lens portion onto the active surface of the sensing circuit.

According to another embodiment of the present invention, a rearview assembly is provided for use in a vehicle, the rearview assembly comprising: a housing adapted to be mounted to the vehicle; a rearview element disposed in the housing for providing an image to the driver of the rearward view from the vehicle; and a glare sensor device mounted behind the rearview element so as to sense light passing through the rearview element. The glare sensor device comprising: a support structure; a sensing circuit mounted on the support substrate for sensing optical radiation and generating an electrical output signal in response thereto; and an encapsulant encapsulating the sensing circuit on the support structure, the encapsulant including an integral anamorphic lens.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 12 is a schematic diagram illustrating an implementation of the light sensor of FIG. 14 using photodiodes as light transducers;

FIG. 12A is a circuit schematic of an alternate circuit for converting the LIGHT and NOISE signals of FIG. 12 to an output signal;

FIG. 20 is a schematic diagram illustrating different transducer capacitances for different amounts of light-induced charge to achieve variable sensitivity;

FIG. 21 is a graph of the output potential as a function of accumulated incident light for the transducer of FIG. 20;

FIG. 28C is an elevational view of the forward facing surface of the support/circuit board subassembly shown in FIGS. 28A and 28B;

FIG. 28D is an elevational view of a side of the support/circuit board subassembly shown in FIGS. 28A-28C;

FIG. 28E is an elevational view of the rearward facing surface of the support/circuit board subassembly shown in FIGS. 28A-28D;

FIG. 29 is a close-up perspective view of the rearward facing surface of a secondary optical element mounted to a circuit board relative to a glare sensor within the rearview mirror assembly shown in FIGS. 26-28E;

FIG. 30 is a close-up perspective view of the glare sensor mounted to the circuit board with the secondary optical element shown in FIG. 29 removed;

FIG. 31 is a close-up perspective view of the opposite side of the circuit board showing the mechanical connections of the glare sensor and the secondary optical element to the circuit board;

DETAILED DESCRIPTION OF THE PREFERRED EMBODIMENTS

Figure 1:
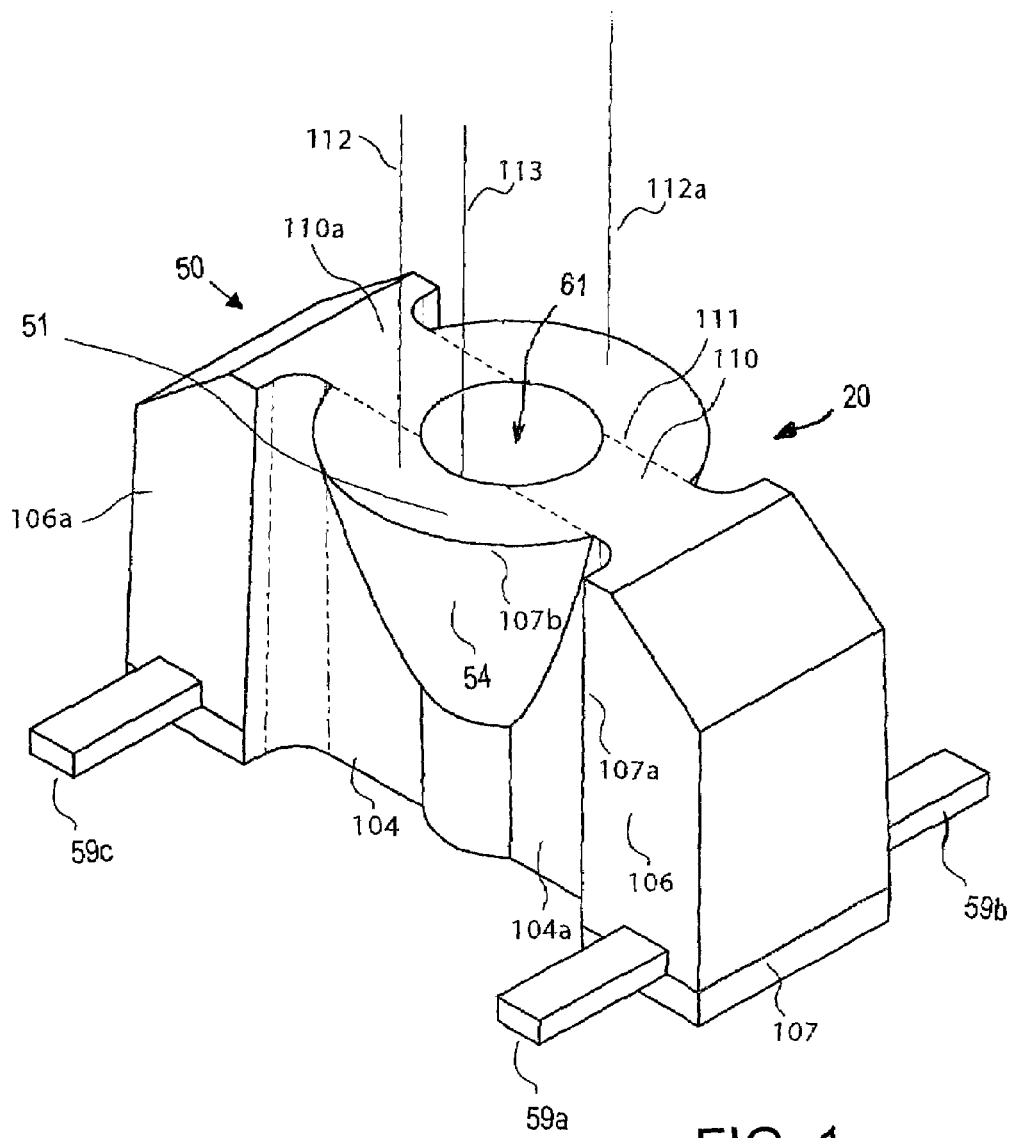
FIG. 1 is a perspective view of a sensor device constructed in accordance with the present invention.

Reference will now be made in detail to the present preferred embodiment of the invention, an example of which is illustrated in the accompanying drawings. Wherever possible, the same reference numerals will be used throughout the drawings to refer to the same or like parts.

Figure 2:
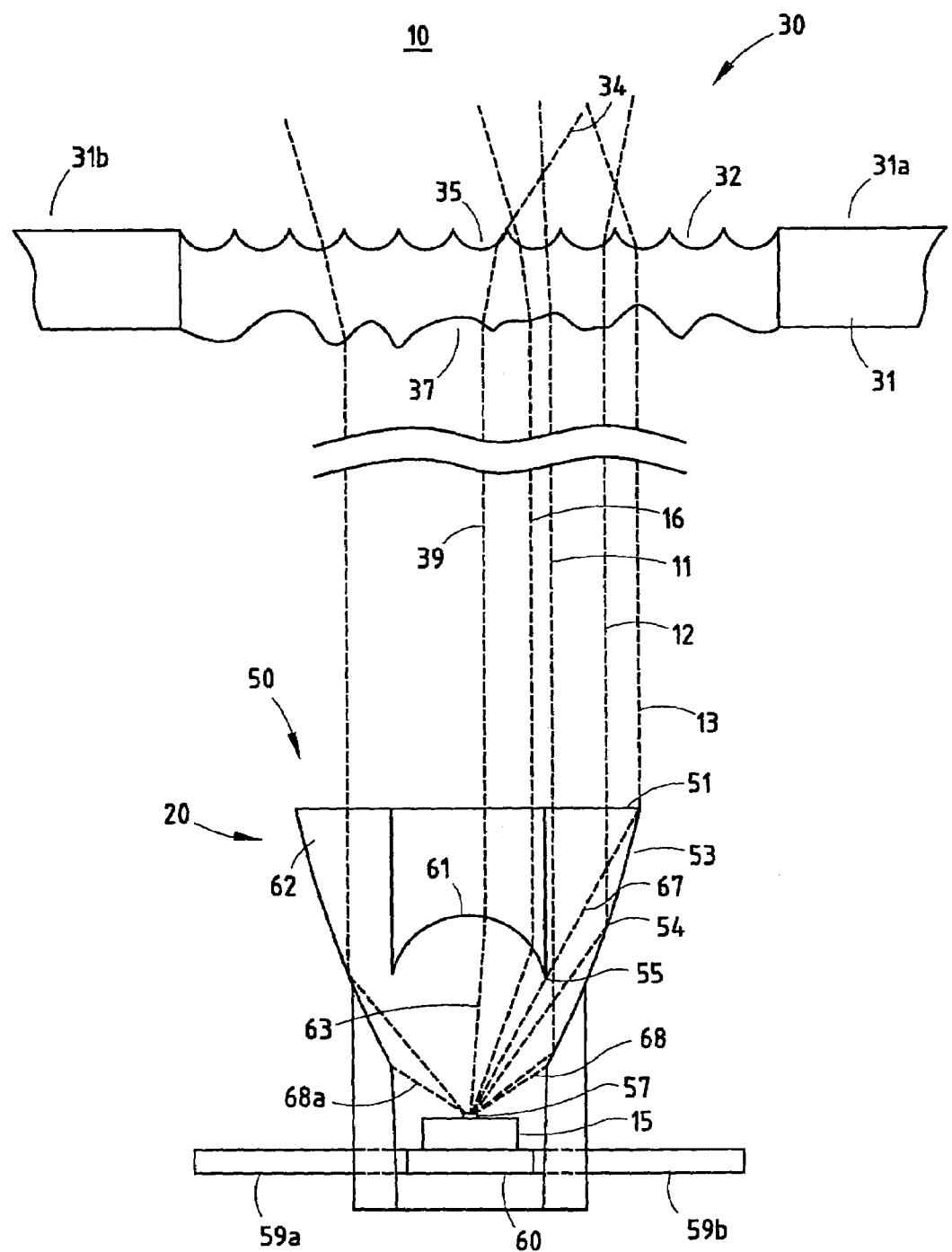
FIG. 2 is a side cross-sectional view of the sensor device shown in FIG. 1 illustrating various light ray tracings that first pass through a diffuser.

A sensor device 50 that is constructed in accordance with one embodiment of the present invention is shown in FIG. 1. A sensor subassembly 10 incorporating sensor device 50 is shown in FIG. 2. The sensor device 50 includes a support structure, such as a printed circuit board or a lead frame 60; an integrated sensing circuit 15 having an active sensing area 57 mounted on the support substrate for sensing optical radiation, preferably visible light; and an encapsulant 62 encapsulating the sensing circuit on the support structure. In general, the encapsulant 62 defines a lens structure 20 including an integral refracting lens portion 61 preferably having an elliptical refracting surface for focusing incident optical radiation onto active surface 57 of sensing circuit 15. Lens structure 20 further includes an optical radiation collector portion 53 surrounding the lens portion 61 for collecting and redirecting optical radiation that is not incident on lens portion 61 onto the active surface 57 of sensing circuit 15. The optical radiation collecting portion 53 includes a parabolic reflecting surface 54 that redirects incident optical radiation towards sensing circuit 15 by total internal reflection. Optical radiation collecting portion also includes an annular optical radiation receiving surface 51 that lies in a plane perpendicular to the major axis of elliptical lens portion 61 and is disposed around elliptical lens portion 61. The encapsulant is preferably formed of a clear polymer.

Figure 26:
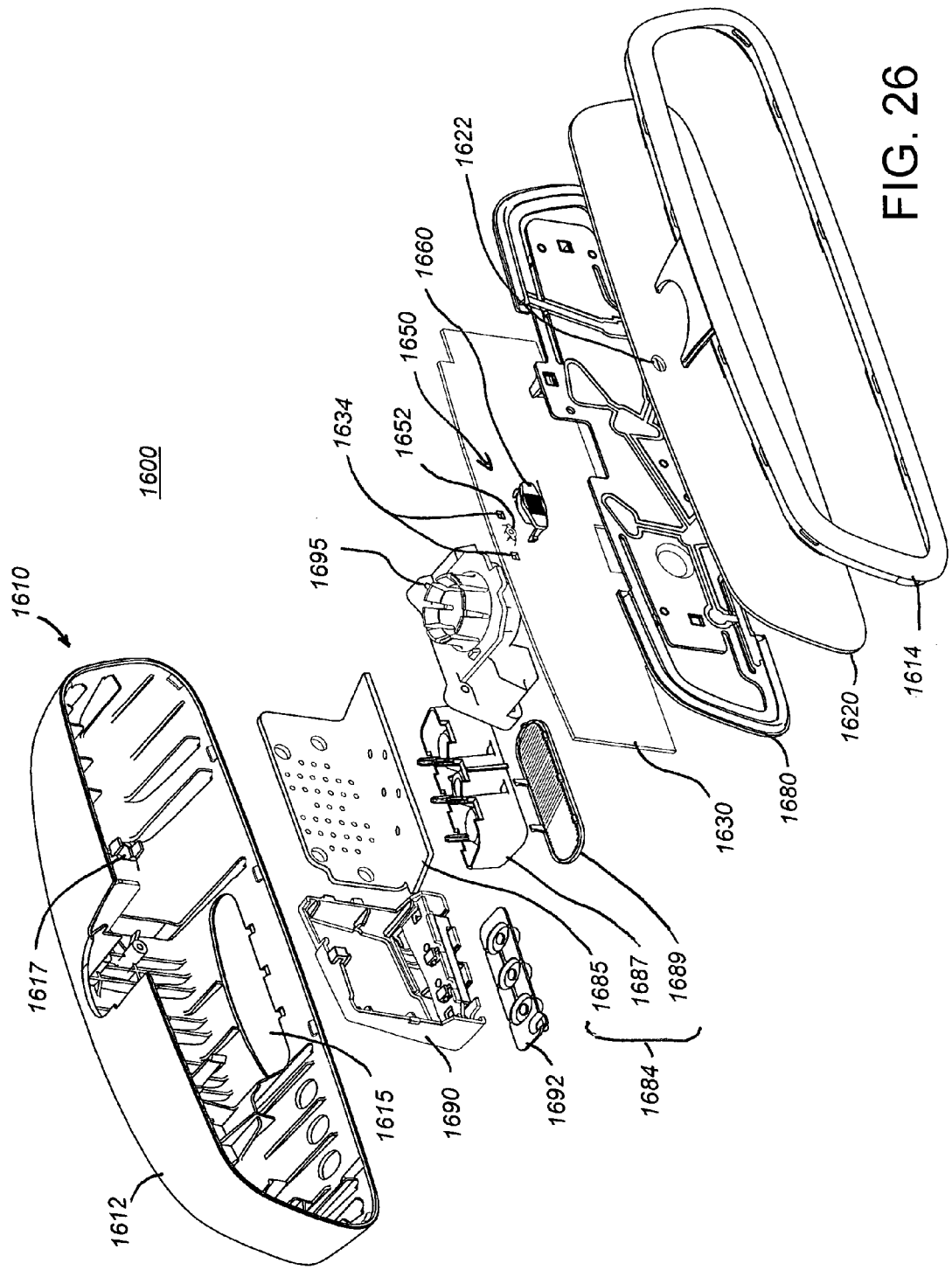
FIG. 26 is an exploded perspective view of a rearview mirror assembly constructed in accordance with the present invention.
Figure 27:
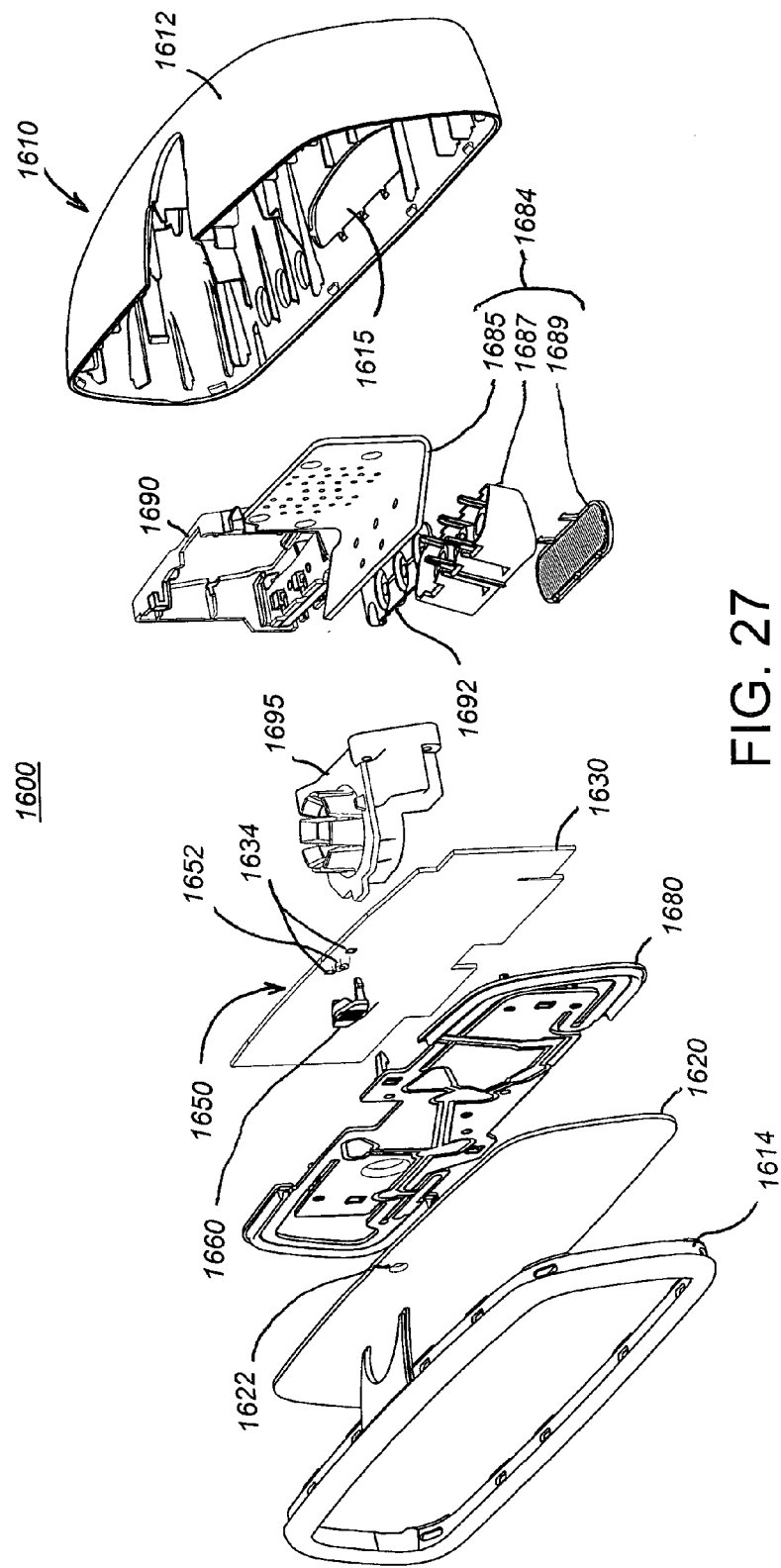
FIG. 27 is another exploded perspective view of the rearview mirror assembly shown in FIG. 26.
Figure 28B:
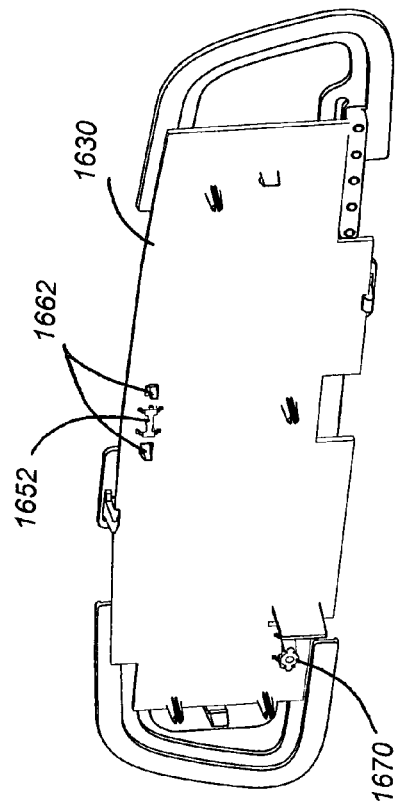
FIG. 28B is a perspective view of the forward facing surface of the support/circuit board subassembly shown in FIG. 28A.
Figure 28A:
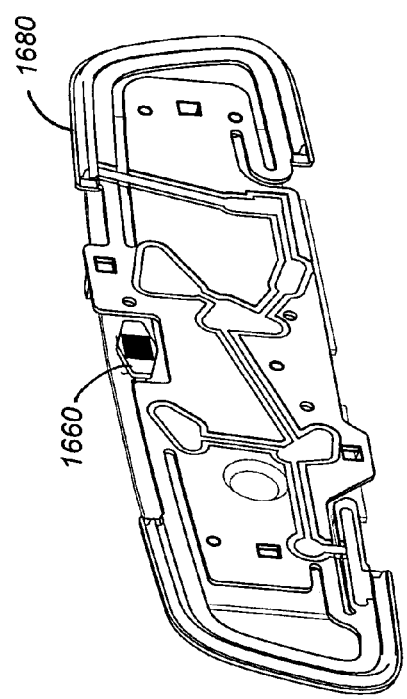
FIG. 28A is a perspective view of the rearward facing surface of a support/circuit board subassembly of the rearview mirror assembly shown in FIGS. 26 and 27.
Figure 36:
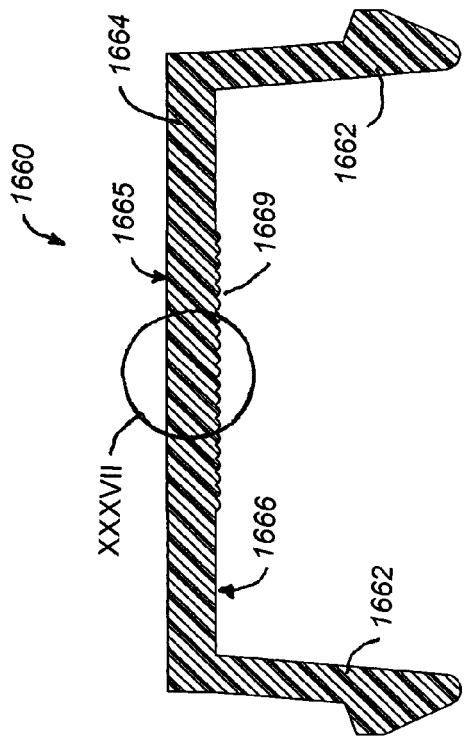
FIG. 36 is a cross-sectional view of the secondary optical element as taken along line XXXVI-XXXVI in FIG. 32.
Figure 38:
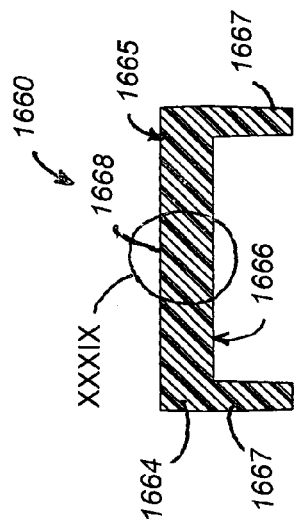
FIG. 38 is a cross-sectional view of the secondary optical element as taken along line XXXVIII-XXXVIII in FIG. 33.
Figure 32:
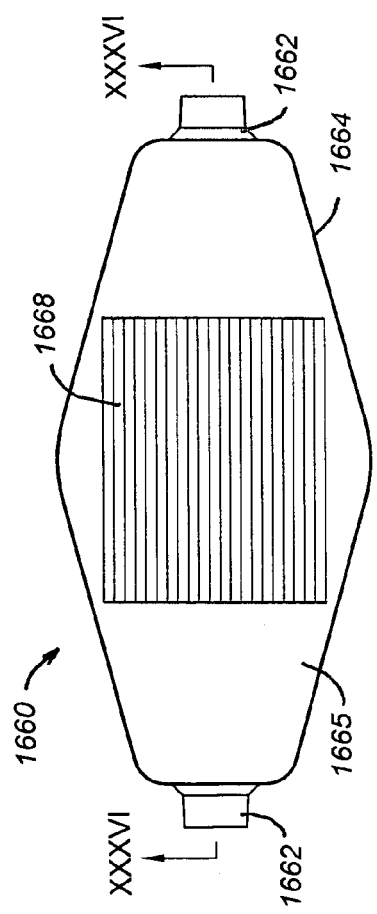
FIG. 32 is a top plan view of the secondary optical element used in the assembly shown in FIGS. 26-31.
Figure 33:
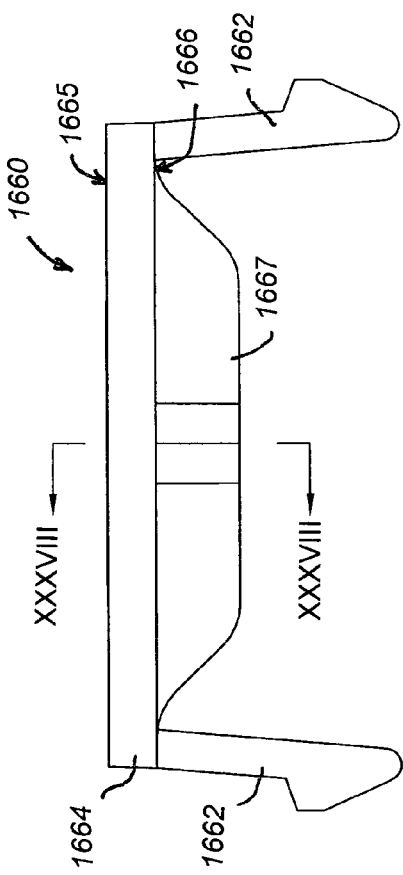
FIG. 33 is an elevational side view of the secondary optical element shown in FIG. 32.
Figure 35:
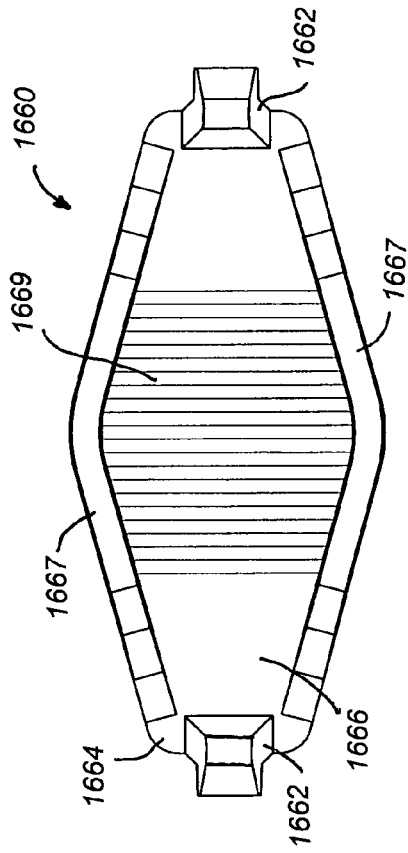
FIG. 35 is a bottom plan view of the secondary optical element shown in FIGS. 32-34.
Figure 39:
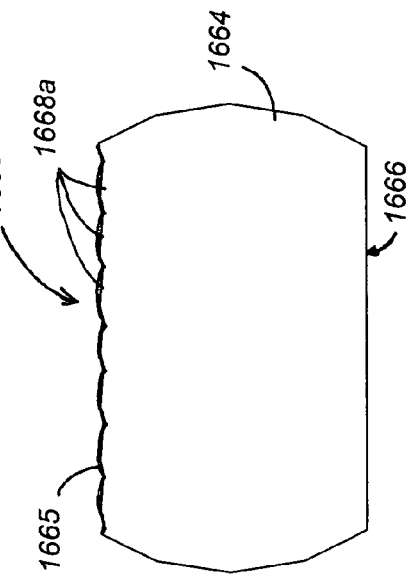
FIG. 39 is a close-up partial view of the region of the secondary optical element identified as XXXIX in FIG. 38.
Figure 34:
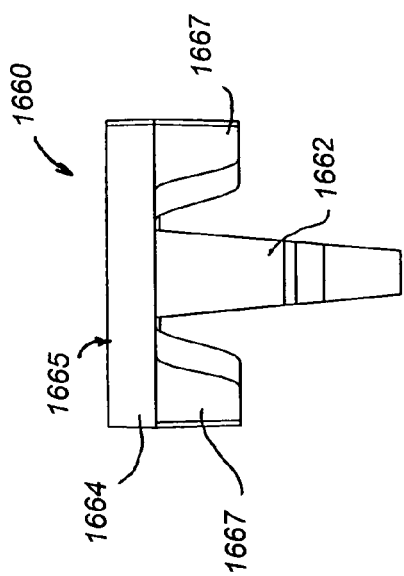
FIG. 34 is an elevational side view of the secondary optical element shown in FIGS. 32 and 33 as viewed from a different side than shown in FIG. 33.
Figure 37:
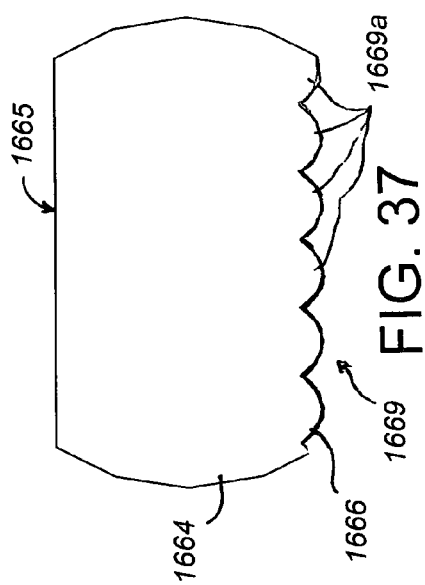
FIG. 37 is a close-up partial view of the region of the secondary optical element identified as XXXVII in FIG. 36.

Sensor subassembly 10 further includes a diffuser and aperture subassembly 30 that includes an aperture formed in a housing enclosure 31 and a diffuser 32 disposed in the aperture formed in enclosure 31. As shown in FIGS. 26 and 27, housing enclosure 31 may be that of a rearview assembly. As used herein, a "rearview assembly" may be a rearview mirror assembly having a mirror element, such as an electrochromic mirror element, a rearview display assembly having a display element for displaying images captured to the rear of the vehicle by a rearward facing camera, or a combined rearview mirror/display assembly that has both a mirror element and a display element for displaying a rearward image. Additional details of a preferred construction of a rearview assembly is are described further below following the more detailed description of the preferred sensor device.

Having generally described the structure of the sensor assembly of the present invention, a description of the optical properties, functions, and advantages of such structure is provided below.

Figure 4:
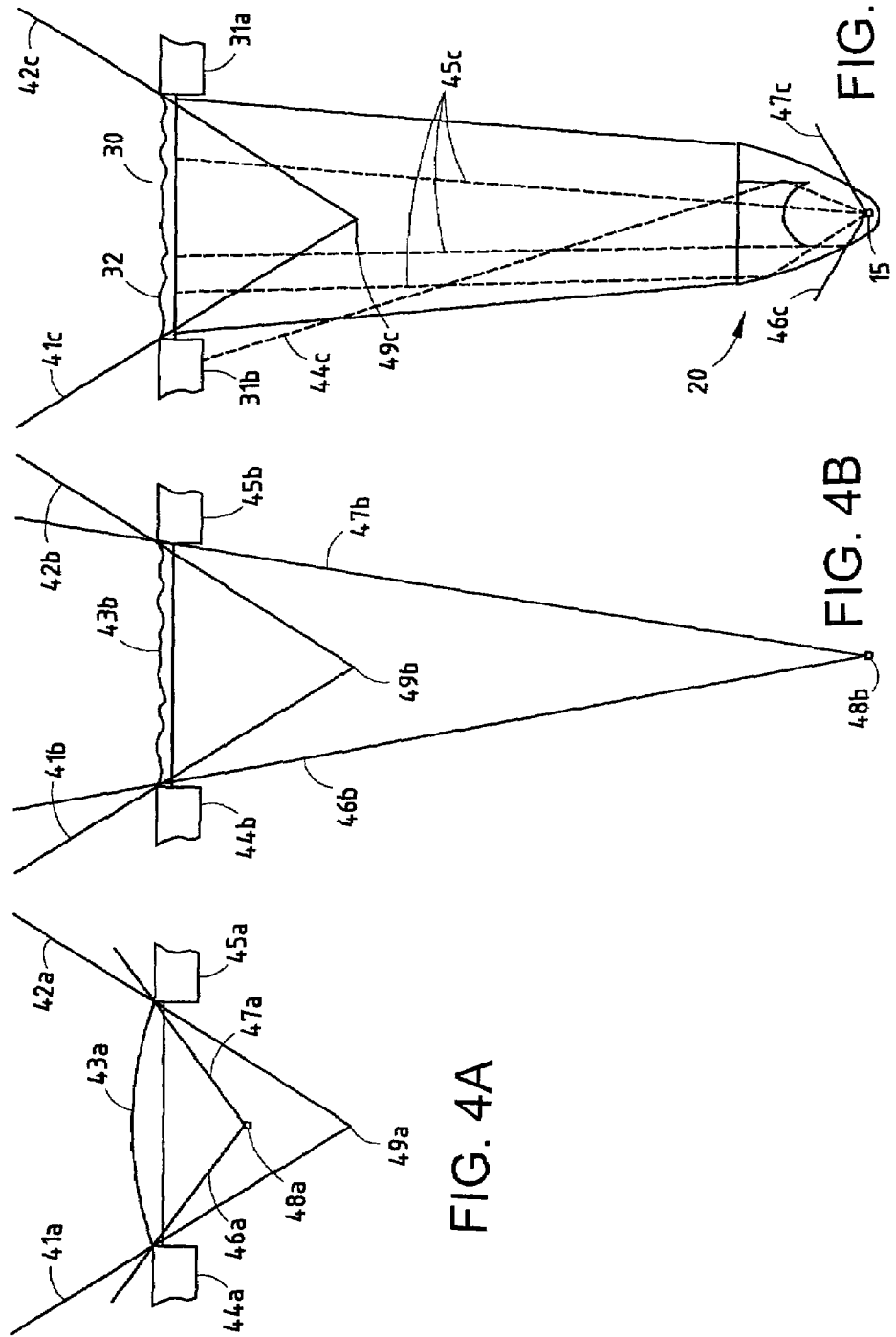
FIG. 4A is a side view of a sensor device disposed close to an aperture in which a lens is disposed.
FIG. 4B is a side view of a sensor device disposed farther from an aperture in which a diffuser is disposed.
FIG. 4C is a side view of a sensor device according to the present invention, which is spaced a substantial distance from an aperture in which a diffuser is disposed.

In the sensor configuration shown in FIG. 4C, a sensor constructed as described above is placed at an appreciable distance from the aperture and has desirably high optical gain. Features which lead to this desirable combination are portions of the invention described herein.

In the illustration in FIG. 4C, the positioning and definition of 49c is similar to that for 49a and 49b (FIGS. 4A and 4B), and the positioning of the small area sensing circuit 15 is similar to that of 48b. Other corresponding features are also comparable except that a lens structure which preferably encapsulates and preferably surrounds sensor circuit 15 is added and lens and/or diffusing element 32 is designed to generally obtain the desired profile of sensitivity versus angle for the total system. The resulting system gives substantially enhanced optical gain over that in FIG. 4B.

The lens structure 20 functions to project light rays entering through the aperture onto the active area 57 of sensor circuit 15 filling a substantial portion of a relatively large cone angle, the extremes of which are depicted by lines 46c and 47c in the illustrative example. The lens does not need to preserve imaging integrity but in some other respects parallels low F number photographic lens. It is also preferable to have an even lower F number than is normally practical with imaging optics. In the preferred structure, a majority of the rays of which 45c are representative which are focused by the lens structure 20 onto the sensor, originate from the desired field of view and enter the system through the aperture. Preferably rays, such as 44c, which do not enter through the aperture, make up a small to negligible portion of the light which the lens directs to the active area of the sensor circuit 15. In the foregoing, particularly when the angle between 41c and 42c is large, only a sampling of these rays will typically be directed to the active sensing area, but it is preferable that the majority of the rays which are directed to the active sensing area come from the directions for which the light level is to be measured. The lens and/or diffusing unit 32 is designed to have a dispersing effect so that a representative proportion of rays emanating from within the field delimited by the direction of 41c and 42c in the illustrative example are brought to an alignment whereby they are focused by the lens structure 20 onto the active area of sensor circuit 15. It is preferable that both the distribution and the extent of the scattering profile of the diffuser be such that the angle dependent magnitude and the general extremes of the response profile for the optical system meet design objectives. Since increased scattering reduces the overall optical gain, it is also preferable that the degree of scattering be reasonably close to the minimum amount needed to meet the response profile objectives.

In some embodiments of the invention, optical subassembly 30 may include a single negative or even a positive lens element. It is, however, preferable to have finer patterns. The pattern may be, for example, repetitious or random in the diffusing effect and produced by a fine array of small lens elements by a diffusant which is disbursed in the material which covers the aperture by a randomly or irregularly grained surface or even by an ultra fine structure which may be generated by replicating a micro pattern. A micro pattern may be generated by laser interference patterns and such diffusers may in turn employ interference patterns generated by the fine features of the optical surface in addition to or in place of reflective or refractive effects to achieve the desired light disbursing effect.

As shown in FIG. 2, light enters through aperture and diffuser subassembly 30 and after traveling some distance, a portion of the entering rays strikes the lens structure 20 of sensor device 50 where a portion of the rays which strikes the sensor is directed to the light sensing area 57 on sensing circuit 15. Leads 59a-59d are electrically attached to the sensing circuit 15 and to an associated electrical control circuit 66 (FIG. 5), which functions to read or otherwise respond to the level of the light which strikes the sensor. The diffuser and aperture subassembly 30 functions to shape the directional or spatial response profile of the sensor so that the profile of sensitivity versus direction is satisfactory for the application. For some embodiments of this invention, the lens structure 20 in sensor device 50 is designed so that it serves to direct a large enough portion of the rays which emanate from the diffusing element and strike the sensor on the light sensing area of the chip to make the overall optical gain of the system comparable to or in some instances greater than that which is normally attained when the sensor is positioned close to the sensing aperture, i.e. in the near field region. With the sensor positioned in the near field area, it is often readily possible to direct light from the field of view so that it fills a relatively large solid angle as it impinges on the active area of the sensor and thereby contributes to the overall optical gain. In the design of FIG. 2, it is desirable to provide a design which maintains reasonable, perhaps comparable, or better optical efficiency throughout a range of positioning options for the sensing circuit which may in some instances include the near field but which may in others extend to a much greater distance from the aperture than the farthest extent of the near field. One way to practice the invention is to provide a lens system which directs rays which emanate from the diffusing element to the light sensitive element 15 and to generally fill an effective solid angle which is comparable in size to that of the comparable system in the near field with these rays. In the discussion, the active region 57 of the sensor is more sensitive to rays which enter from some directions or positions on the active surface than from others, and the net effect on the output of a ray which strikes the active area of the sensor is equal to the product of the intensity of the ray with the efficiency with which a ray entering at the particular angle and at the particular position on the sensor surface is received by the sensor. This may be referred to as the response efficiency for responding to light to the particular point on the sensor and coming from a particular angle relative to the sensor. The lenses or combination of lenses and diffusing elements may also vary in the efficiency with which they direct rays to particular entrance angles and positions and this may be referred to as the collection efficiency for directing light to the particular point on the sensor and coming from a particular angle relative to the sensor. Thus, for a particular angle and point of entry, a reception efficiency may be defined as the product of the response efficiency and the collection efficiency. It would be most accurate to integrate the reception efficiency over the solid angle through which light enters the active sensing area and to use this integrated reception angle perhaps instead of the solid angle as a basis for comparison of the optical systems. The general point is that it is a desirable feature of the invention to generally fill a large solid angle relative to the sensing circuit 15 with light, and for this solid angle to generally include the regions of high sensitivity of the sensor to incoming light. Since the sensor may have an approximate cosine response characteristic for which the response efficiency is highest for normal rays and for which the response approaches zero for rays which are nearly parallel or tangent to the sensing surface, it is generally preferable to favor directions normal to the sensing surface for the portions of the total solid angle over which incident rays are directed to the sensor. The angle between lines 68 and 68a generally denotes the outer extent of the cone angle over which rays are collected in the illustrative embodiment. As will be discussed later, a rib to encapsulate the lead frame connections prevents filling of some portions of the cone delimited by lines 68 and 68a.

In the illustrative diffuser and aperture assembly 30, fragmentary portions 31a and 31b of the preferably opaque housing enclosure 31 are shown. Surface 35 of diffuser 32 contains generally parallel grooves. These grooves serve to increase the dispersion of light in a direction generally parallel to the sheet of paper. The lower surface 37 of diffuser assembly 30 is an irregular surface which serves to diffuse the light approximately equally in every direction. Ray 34 is refracted at surfaces 35 and 37, and continues as ray 39 through refracting lens 61 which focuses it as ray 63 onto the active sensing surface 57. Ray 16 is likewise refracted by lens 61 and focused onto the active area 57. Ray 16 is closer than ray 39 to the outer extent 55 of the refracting lens 61. Rays 11, 12, and 13 enter the upper surface of lens structure 20 and are reflected by total internal reflection at reflecting surface 54 striking the active sensing area 57. The order of the reflected rays is reversed from the order of the incoming rays. The lens 61 is set at a depth such that the outer reflected ray 67 just misses the edge 55. In the lens structure 20, the refracting portion 61 fills in the center portion of the cone of rays which is directed toward active sensing area 57. The parabolic reflecting surface 54 fills in the outer portion of the cone. The combined reflecting and refracting lenses complement each other to generally fill the area between lines 68 and 68a. The resulting dispersion is greater in the direction parallel to the paper due to the combined and generally additive effects of the unidirectional dispersion of surface 35 and the multi-directional dispersion of surface 37. The result is a sensor with a substantially wider field of view in the direction parallel to the paper than in the direction perpendicular to the paper.

The integrated sensing circuit 15, of which the active sensing area 57 is a part, is attached to lead frame 60. The active sensing area 57 may be small, for example, 100 microns in diameter. The sensing area is shown as a raised portion in the illustration only to make it stand out. In the actual part, it is likely to be flush or even very slightly recessed. The attachment of sensor circuit 15 to lead frame 60 may be made using conductive epoxy completing one of the electrical connections with the other connections completed by lead bonds or, alternately, all of the connections may be made with lead bonds. Leads 59a-59d extend from the package to make electrical connection to the printed circuit board and to attach the part to the printed circuit board. Preferably, leads 59a-59d are configured for surface-mounting to a circuit board. Surface-mounting an electronic component, such as sensor device 50, is desirable over through-hole mounting in which the leads are inserted through holes in the circuit board and then soldered to the circuit board on a side thereof that is opposite the component. Surface-mounting, on the other hand, is performed entirely on one side of the circuit board.

FIG. 1 is an isometric drawing of sensor device 50. Representative ray 112 enters top surface 51 and is reflected by total internal reflection at surface 54 to the active sensing area 57 of the sensor circuit 15. Likewise, ray 112a is reflected by a similar surface at the back of the device and also strikes the active sensing area. Ray 113 enters through the recessed refracting lens 61 and is focused to the active sensing area. Rib portion 104 serves to house the lead frame and allow clearance for the mold to be retracted from the part. Section 106 is one of two sections of the rib which is widened to provide support for leads 59a and 59b. Leads 59c and 59d extend from the symmetrically placed enlarged section 106a. The dashed lines 111 are included for illustrated purposes to delimit areas 110 and 110a. The areas are above the ribs 104 and 104a which join with the parabolic reflector 54. Rays entering this area are not generally directed to the active sensing area. The part is preferably made in a two-part mold which has parting lines generally depicted by representative lines 107, 107a, and 107b.

Figure 3:
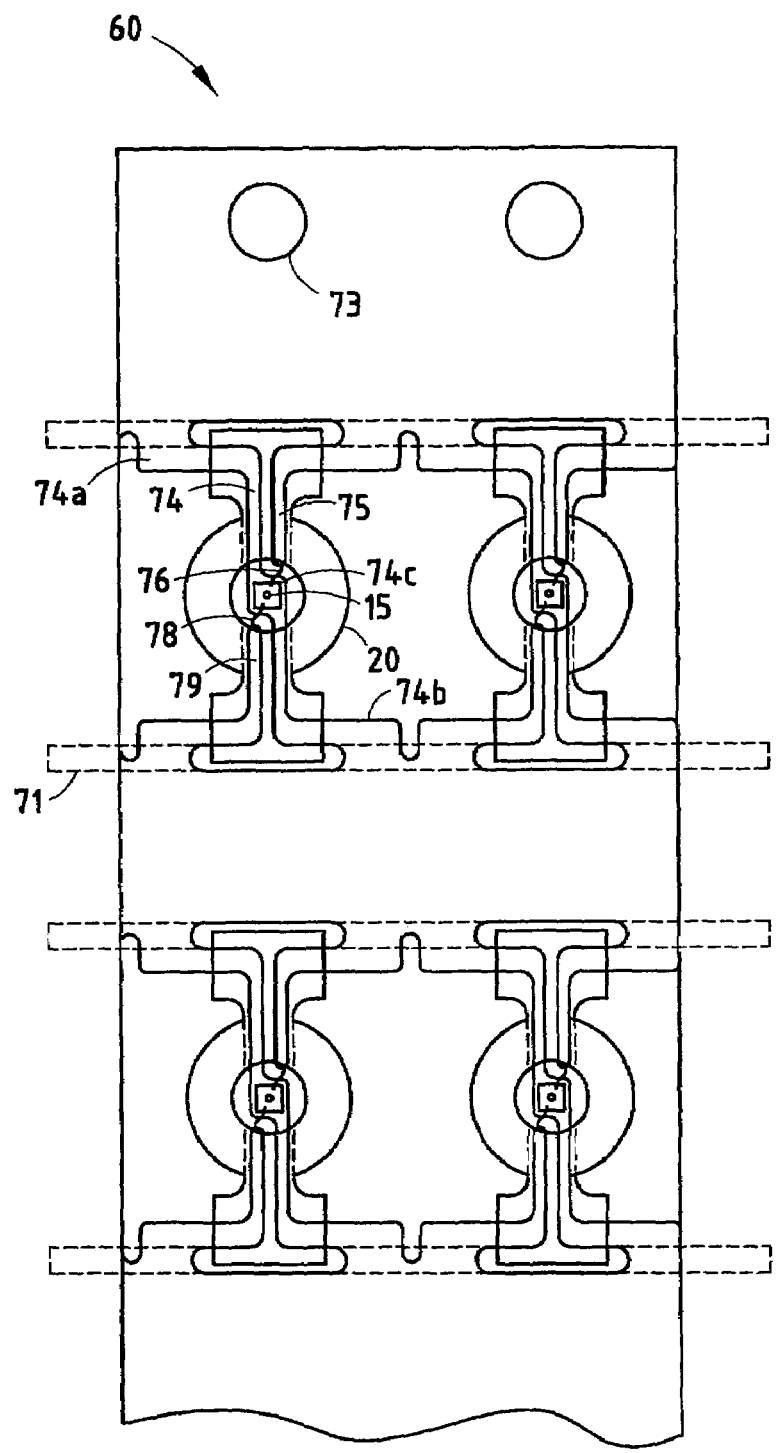
FIG. 3 is a top plan view of a lead frame component used to construct several sensor devices in accordance with the present invention.

FIG. 3 illustrates a portion of a lead frame subassembly 60 on which integrated sensor circuit 15 has been bonded. Only four of the devices have been shown. The actual assembly would include the number of devices, perhaps 64; which would fit in one of the transfer mold sections. The lead frame assembly includes holes (of which 73 is representative) that are used for locating and holding the lead frame during the assembly processes. Element 74 of the lead frame subassembly provides two connecting pins 74a and 74b and a pad 74c on which the silicon sensor circuit 15 is mounted. The element 74 also serves as the cross-connecting link to hold the lead frame assembly together prior to separation of the parts. The dashed rectangles of which 71 is representative denote the areas that are punched out in order to separate the parts after the molding process is complete. Lead bond wires 76 and 78 connect bonding pads on the silicon sensor circuit 15 to connecting pins 75 and 79, respectively. Upon separation of the devices, pins 74a and 74b serve as leads 59c and 59b, respectively, while pins 75 and 79 serve as leads 59d and 59a, respectively. The circular element 20 depicts the outline feature of the plastic lens which will be molded over the part. After the light sensing dies are bonded to the lead frame and connections are made, the lead frame is placed in a transfer mold and the plastic lens assembly depicted in FIGS. 1, 2, and 4C is transfer molded onto the lead frame. The lens has the advantage of being in one piece and serving to encapsulate the part. It may also be molded with a conventional two-part mold. After the parts are molded, they are cut apart and de-flashed to form individual parts as depicted in FIG. 1.

In the preferred configuration, the lens system is designed to focus light entering from a narrow beam angle which is approximately parallel to the axis of the lens system onto the active sensing area. For this system, the reflecting portion is a parabola whose focus is approximately centered on the light sensitive area of the receiver. The refracting lens is preferably elliptical in shape, being designed to focus light rays which are parallel to the axis of the system onto the center of the light sensitive area. An elliptical shaped lens having its major axis coincident with the axis of the lens system, having the foci which is most distant from the tip of the lens coincident with the center of the light sensing area, and having a ratio of major diameter to minor diameter chosen to give the best focus for light of a color for which the system is optimized is a design choice which will serve this purpose well. The focal length of the parabola is chosen so that rays parallel to the axis of the lens which strike the active portion of the parabola at points which are closest to the center axis of the lens are reflected at an angle which fills in the outer extent of the cone of light which the optical system is designed to focus onto the sensor. When the location of the focus of the ellipse and the alignment of the major axis and the ratio of the major diameter to the minor diameter are chosen as outlined above, one is still free to scale the overall size of the ellipse. It is preferable to scale the size of the ellipse so that the outer edge of the elliptical lens is just high enough in the lens structure to clear rays which are reflected to the sensing surface from the outermost extent of the parabolic surface. As the diameter of the refracting lens is increased, the slope at its outer extent becomes too high. Stated another way, there is a maximum practical cone angle which can be filled by a single surface lens made of a material of a given refractive index. This is the major factor which influences the choice of the balance between the diameter of the refracting lens and the diameter of the parabolic reflector. The overall size of the lens assembly may be scaled. It should not be so small that tolerances are unnecessarily tight and also needs to be large enough that the encapsulated sensor assembly will fit under the refracting lens. Also, the parabolic reflector needs to be large enough that the area taken from the reflector by the rib which encapsulates the connecting leads is not an undesirably large portion of the total reflector area. Example dimensions are as follows: the semi-major diameter of elliptical lens 61 is 1.529 mm and the semi-minor diameter of elliptical lens 61 is 1.163 mm; the focal length of parabolic reflector 54 is 0.2887 mm; the radius of refracting lens 61 is 1.0 mm; the radius of parabolic reflector 54 at top is 2.2 mm; and the index of refraction of the plastic encapsulant 62 is 1.54.

The encapsulant 62 may be made of single material or may be made of more than one material as disclosed in commonly assigned U.S. Pat. No. 6,679,608 filed on Jan. 10, 2002, by Jon H. Bechtel et al. entitled "SENSOR DEVICE HAVING AN ANAMORPHIC LENS," the disclosure of which is incorporated herein by reference in its entirety.

The sensing circuit 15 may comprise any form of photosensor device such as a photodiode, cadmium sulfide CdS cell, etc. A preferred sensing element is the photodiode disclosed in commonly assigned U.S. Pat. No. 6,379,013 filed on Jan. 25, 2000, by Jon H. Bechtel et al. entitled "VEHICLE EQUIPMENT CONTROL WITH SEMICONDUCTOR LIGHT SENSOR," and U.S. Pat. No. 6,359,274 filed on May 7, 1999, by Robert H. Nixon et al. entitled "PHOTODIODE LIGHT SENSOR," the entire disclosures of which are incorporated herein by reference. The structural components of the sensor device 50 and of a processing circuit 66 that interfaces with sensing circuit 15 is discussed below with reference to FIGS. 5-22.

Figure 5:
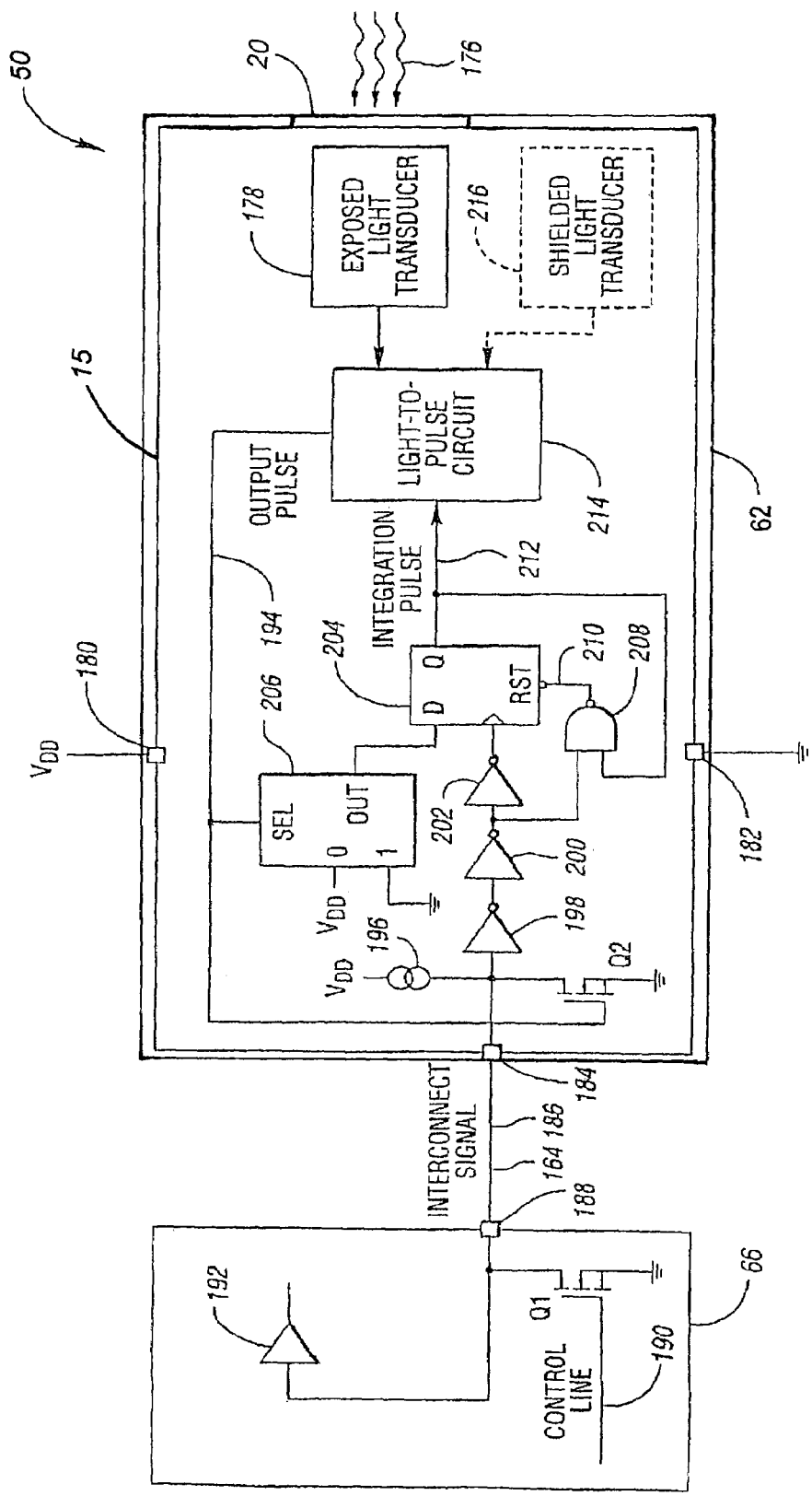
FIG. 5 is an electrical circuit diagram in block and schematic form showing circuitry permitting a processing circuit and a sensing circuit, which may be used in the inventive sensor device structure to be interconnected by a single line carrying both sensitivity control and sensor output.

Referring now to FIG. 5, the processing circuit 66 and sensing circuit 15 will be described in greater detail. The processing circuit 66 and sensor circuit 15 are interconnected by a single line 164 that carries interconnect signals 186, which can advantageously include both light sensor sensitivity control signals and resultant light sensor output signals. A microcontroller may be used to implement processing circuit 66 and would include a transistor element Q1 and a buffer 192 connected to an output pin 188, or other input/output (I/O) pin structure, which is connected to signal line 164. The transistor element Q1 may be implemented using a suitable transistor such as a field effect transistor (FET) connected between signal pin 188 and ground. Transistor Q1 is controlled by control line 190, which is connected to the base of transistor Q1. Buffer 192 is also connected to signal pin 188 to isolate the signal line 164 from signal levels present in the microcontroller.

As described above, sensor device 50 includes an encapsulant 62, which encapsulates the integrated sensing circuit 15. Encapsulant 62 includes a lens 61 for admitting light 176, which impinges upon an exposed light transducer 178. Encapsulant 62 also admits and retains power pin 180, ground pin 182, and signal pin 184, which are preferably part of lead frame 12. The use of only three pins 180, 182, and 184 greatly reduces the cost of sensor device 50 and associated processing circuit 66.

Sensing circuit 15 is connected to processing circuit 66 through bus 164, which carries interconnection signal 186 between signal pin 184 in sensing circuit 15 and signal pin 188 in processing circuit 66. As will be described below, signal pins 184, 188 are tri-state ports permitting interconnect signal 186 to provide both an input to sensing circuit 15 and an output from sensing circuit 15.

Within sensing circuit 15 is a transistor Q2, which can be implemented using a suitable transistor such as an FET element. Transistor Q2 is connected between signal pin 184 and ground. Transistor Q2 is controlled by output pulse 194 connected to the gate of Q2. Constant current source 196 is connected to signal pin 184 so that if neither transistor Q1 nor transistor Q2 are ON (high logic level), interconnect signal 186 is pulled to a high logic level. Constant current source 196 nominally sources about 0.5 mA to pull up interconnect signal 186. The input of Schmidt trigger inverter 198 is connected to signal pin 184. Inverters 200 and 202, which are connected in series, follow Schmidt trigger inverter 198. The output of inverter 202 clocks D flip-flop 204. The output of multiplexer 206 is connected to the D input of flip-flop 204. The select input of multiplexer 206 is driven by output pulse 194 such that when output pulse 194 is asserted, the D input of flip-flop 204 is unasserted, and when output pulse 194 is not asserted, the D input of flip-flop 204 is asserted. The output of NAND gate 208 is connected to low asserting reset 210 of flip-flop 204. The output of flip-flop 204 is integration pulse 212. Integration pulse 212 and the output of inverter 200 are inputs to NAND gate 208. Light-to-pulse circuit 214 accepts integration pulse 212 and the output of exposed light transducer 178 and produces output pulse 194.

Sensing circuit 15 may advantageously include a shielded light transducer 216, which does not receive light 176. Shielded light transducer 216 has substantially the same construction as exposed light transducer 178, being of the same size and material as transducer 178. Light-to-pulse circuit 214 uses the output of shielded light transducer 216 to reduce the effects of noise in exposed light transducer 178.

Figure 6:
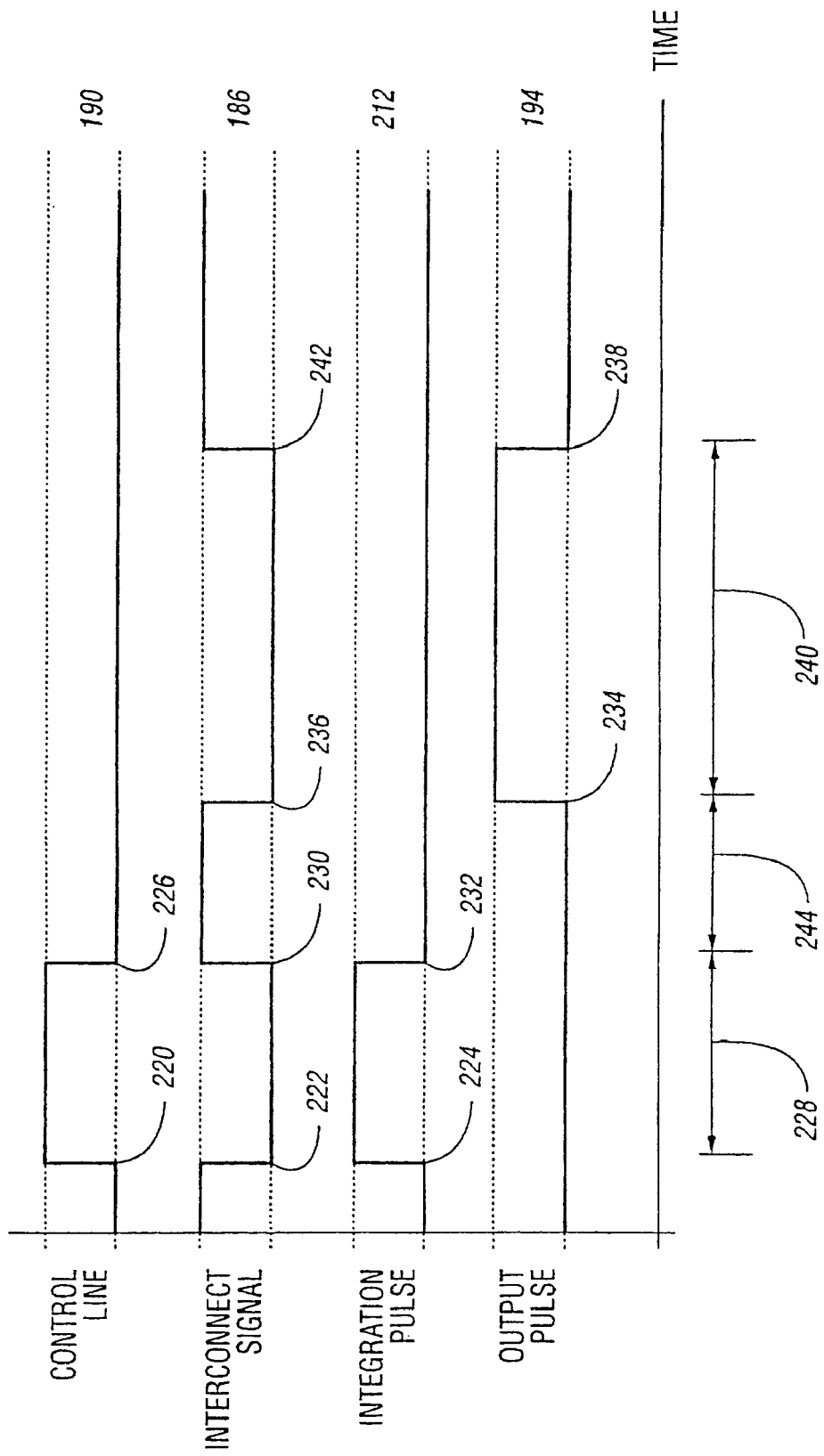
FIG. 6 is a timing diagram illustrating operation of the circuitry of FIG. 5.

Referring now to FIG. 6, a timing diagram illustrating operation of the circuitry of FIG. 5 is shown. Initially, low asserting interconnect signal 186 is high The state of flip-flop 204 must be zero for, if the state is one, both inputs to NAND gate 208 would be high, asserting reset 210 and forcing the state of flip-flop 204 to zero.

At time 220, control logic 66 asserts control line 190 turning transistor Q1 on. Interconnect signal 186 is then pulled low at time 222. The output of inverter 202 transitions from low to high setting the state of flip-flop 204 to one (i.e., a high logic level) which causes integration pulse 212 to become asserted at time 224. Light-to-pulse circuit 214 begins integrating light 176 incident on exposed light transducer 178. At time 226, control line 190 is brought low turning transistor Q1 off. The difference between time 226 and time 220 is integration period 228 requested by control logic 66. Since both transistors Q1 and Q2 are off, interconnect signal 186 is pulled high by current source 196 at time 230. Since the output of inverter 200 and integration pulse 212 are both high, reset 210 is asserted causing the state of flip-flop 204 to change to zero and integration pulse 212 to become unasserted at time 232. This signals light-to-pulse circuit 214 to stop integrating light 176 incident on exposed light transducer 178.

At time 234, light-to-pulse circuit 214 asserts output pulse 194 to begin outputting light intensity information. Asserting output pulse 194 turns transistor Q2 on, pulling interconnect signal 186 low at time 236. This causes inverter 202 to output a low-to-high transition clocking a zero as the state of flip-flop 204. Light-to-pulse circuit 214 deasserts output pulse 194 at time 238. The difference between time 238 and time 234 is light intensity period 240 indicating the amount of light 176 incident on exposed light transducer 178 over integration period 228. Transistor Q2 is turned off when output pulse 194 goes low at time 238. Since both transistors Q1 and Q2 are off, interconnect signal 186 is pulled high at time 242. Buffer 192 in control logic 66 detects the transitions in interconnect signal 186 at times 236 and 242. The difference in time between times 242 and 236 is used by control logic 66 to determine the intensity of light 176 received by sensing circuit 15.

If shielded light transducer 216 is included in sensing circuit 15, the difference in time between the deassertion of integration pulse 212 at time 232 and the assertion of output pulse 194 at time 234 is due, in part, to the thermal noise in sensing circuit 15. This difference is expressed as thermal noise period 244. Thermal noise period 244 may be used by control logic 66 to determine the temperature of sensing circuit 15 or may be more simply used to determine when the noise level in sensing circuit 15 is too high for a reliable reading. Control logic 66 may disable automatic control of vehicle equipment if the temperature of sensing circuit 15 exceeds a preset limit.

Figure 7:
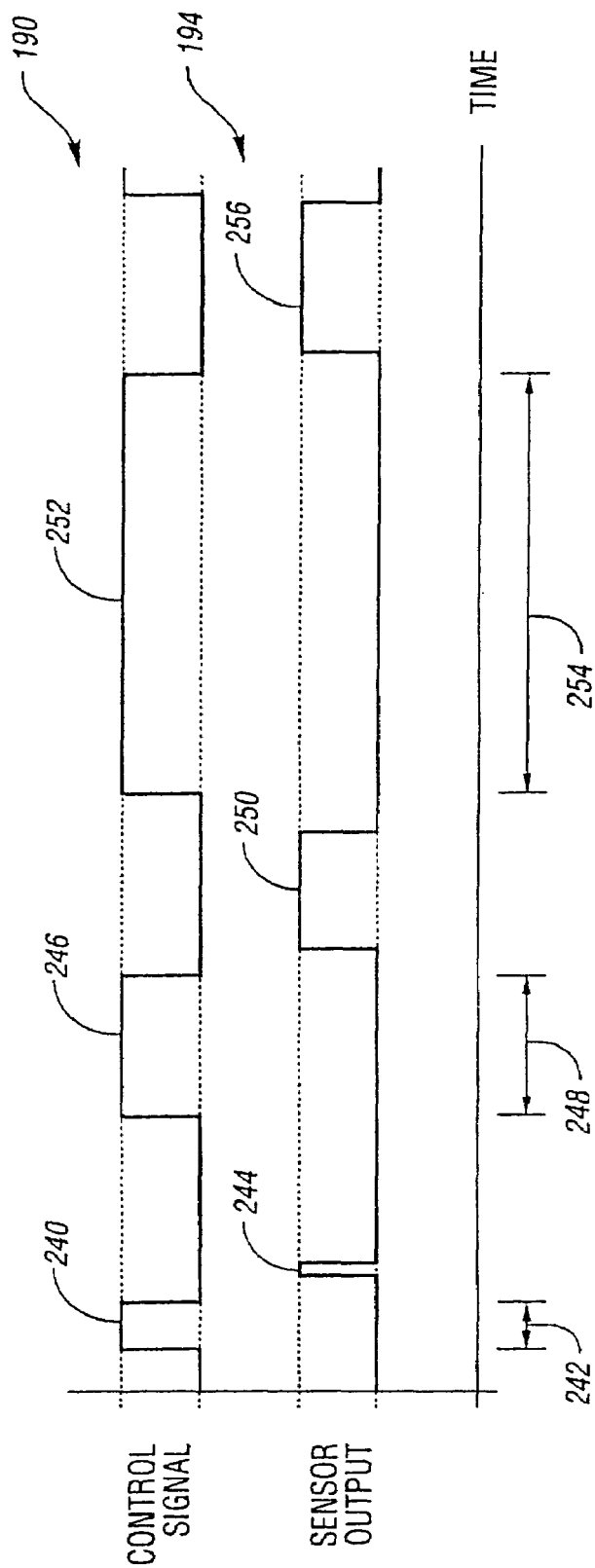
FIG. 7 is a timing diagram illustrating integration duration control and sensor output for a light sensor.

FIG. 7 illustrates a timing diagram of integration duration control and sensor output for a light sensor. Charge accumulating sensing circuit 15 exhibits increased sensitivity and increased dynamic range through variable integration periods. The total amount of light-induced charge, which can be effectively measured, is limited. Therefore, in the presence of bright light, a short integration time is desirable to prevent saturation. However, if a short integration time is used in low light conditions, the charge signal may be lost in noise inherent in sensing circuit 15 (i.e., the signal-to-noise ratio will be so low that the signal level will be undetectable).

Control line 190 includes a sequence of integration periods having varying lengths. In the example shown, short integration pulse 240 having short integration period 242 is generated. A semiconductor light sensor may output a short pulse in a completely dark environment due to noise. Therefore, any sensor output pulse 194, such as short signal pulse 244, having a duration less than a threshold is ignored by control logic 66. Next, medium integration pulse 246 having medium integration period 248 is generated. Resulting medium signal pulse 250 has a duration indicative of the amount of light incident on sensing circuit 15 during medium integration period 248. Long integration pulse 252 having long integration period 254 is generated. If sensing circuit 15 is sufficiently bright, saturation will result. Therefore, long signal pulse 256 having a duration greater than a threshold is also ignored by control logic 66. The signal represented by control line 190 may be generated outside of sensing circuit 15, such as by control logic 66, or may be generated by sensor logic within sensing circuit 15. By varying the integration period, the sensitivity is adjusted. Varying the sensitivity by providing successive integration periods of different durations allows the appropriate sensitivity to be detected and, responsive thereto, selected. A significant advantage of the sensor having bi-directional interconnect signal 186 is that the control logic 66 can control the sensitivity of the sensing circuit 15 to dynamically compensate for different light conditions by varying the integration periods for the sensor.

Figure 8:
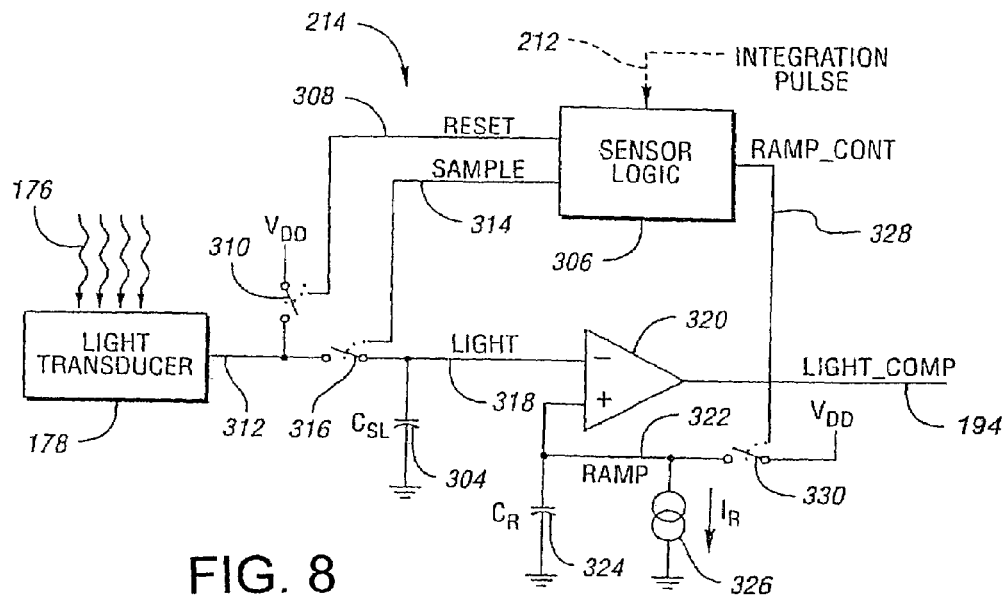
FIG. 8 is a schematic diagram of a light-to-pulse circuit for use in the sensing circuit shown in FIG. 5.

FIG. 8 is a schematic diagram illustrating the light-to-pulse circuit 214, which includes exposed light transducer 178 for converting light 176 incident on exposed light transducer 178 into charge accumulated in light storage capacitor 304, indicated by $C_{SL}$. Exposed light transducer 178 may be any device capable of converting light 176 into charge, such as the photogate sensor described in U.S. Pat. No. 5,471,515 entitled "ACTIVE PIXEL SENSOR WITH INTRA-PIXEL CHARGE TRANSFER" to E. Fossum et al. Light transducer 178 may be a photodiode such as is described below. Except as noted, the following discussion does not depend on a particular type or construction for exposed light transducer 178.

Light-to-pulse circuit 214, which is connected to transducer 178, receives an integration pulse 212, and outputs a light comparator signal which is proportional to the amount of light 176 impacting transducer 178 during integration period pulse 212. Light-to-pulse circuit 214 operates under the control of sensor logic 306. Sensor logic 306 generates reset signal 308 controlling switch 310 connected between exposed light transducer output 312 and $V_{DD}$. Sensor logic 306 also produces sample signal 314 controlling switch 316 between exposed light transducer output 312 and light storage capacitor 304. The voltage across light storage capacitor 304, light storage capacitor voltage 318, is fed into one input of comparator 320. The other input of comparator 320 is ramp voltage 322 across ramp capacitor 324. Ramp capacitor 324 is in parallel with current source 326 generating current $I_R$. Sensor logic 306 further produces ramp control signal 328 controlling switch 330 connected between ramp voltage 322 and $V_{DD}$. Comparator 320 produces comparator output 194 based on the relative levels of light storage capacitor voltage 318 and ramp voltage 322. Sensor logic 306 may generate reset signal 308, sample signal 314, and ramp control signal 330 based on internally generated timing or on externally generated integration pulse 212.

Figure 9:
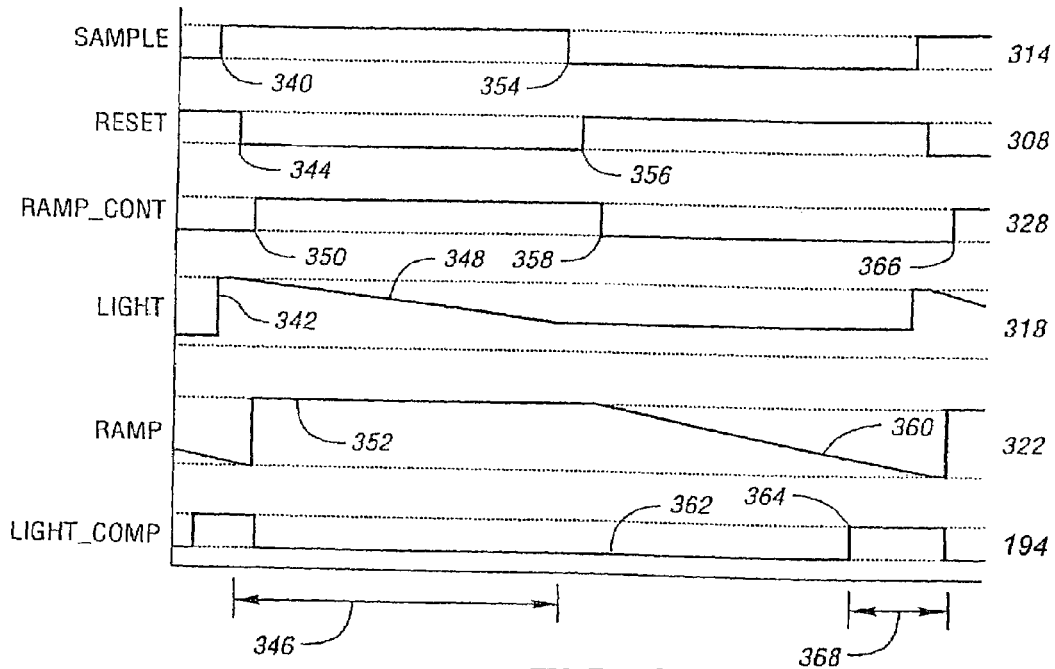
FIG. 9 is a timing diagram illustrating operation of the light-to-pulse circuit of FIG. 8.

Referring now to FIG. 9, a timing diagram illustrating operation of the light-to-pulse circuit 214 of FIG. 8 is shown. A measurement cycle is started at time 340 when sample signal 314 is asserted while reset signal 308 is asserted. This closes switch 316 to charge light storage capacitor 304 to $V_{DD}$ as indicated by voltage level 342 in light storage capacitor voltage 318. Reset signal 308 is then deasserted at time 344, opening switch 310 and beginning integration period 346. During integration period 346, light 176 incident on exposed light transducer 178 generates negative charge causing declining voltage 348 in light storage capacitor voltage 318. At time 350, ramp control signal 328 is asserted closing switch 330 and charging ramp capacitor 324 so that ramp voltage 322 is $V_{DD}$ as indicated by voltage level 352.

Sample signal 314 is deasserted at time 354, causing switch 316 to open, thereby ending integration period 346. At some time 356 following time 354 and prior to the next measurement cycle, reset signal 308 must be asserted closing switch 310. At time 358, ramp control signal 328 is deasserted opening switch 330. This causes ramp capacitor 324 to discharge at a constant rate through current source 326 as indicated by declining voltage 360 in ramp voltage 322. Initially, as indicated by voltage level 362, comparator output 332 is unasserted because ramp voltage 194 is greater than light storage capacitor voltage 318. At time 364, declining voltage 360 in ramp voltage 322 drops below light storage capacitor voltage 318 causing comparator output 194 to become asserted. Comparator output 194 remains asserted until time 366 when ramp control signal 328 is asserted closing switch 330 and pulling ramp voltage 322 to $V_{DD}$. The difference between time 366 and time 364, indicated by pulse duration 368, is inversely related to the amount of light 176 received by exposed light transducer 178 during integration period 346. The integration period 346 can be set directly by the integration pulse 212 or a signal derived from integration pulse 212. It is envisioned that the integration period 346 will be proportional to the width of the integration pulse 212, which is proportional to the pulse width of the control line signal 190 in the circuit of FIG. 5.

Figure 10:
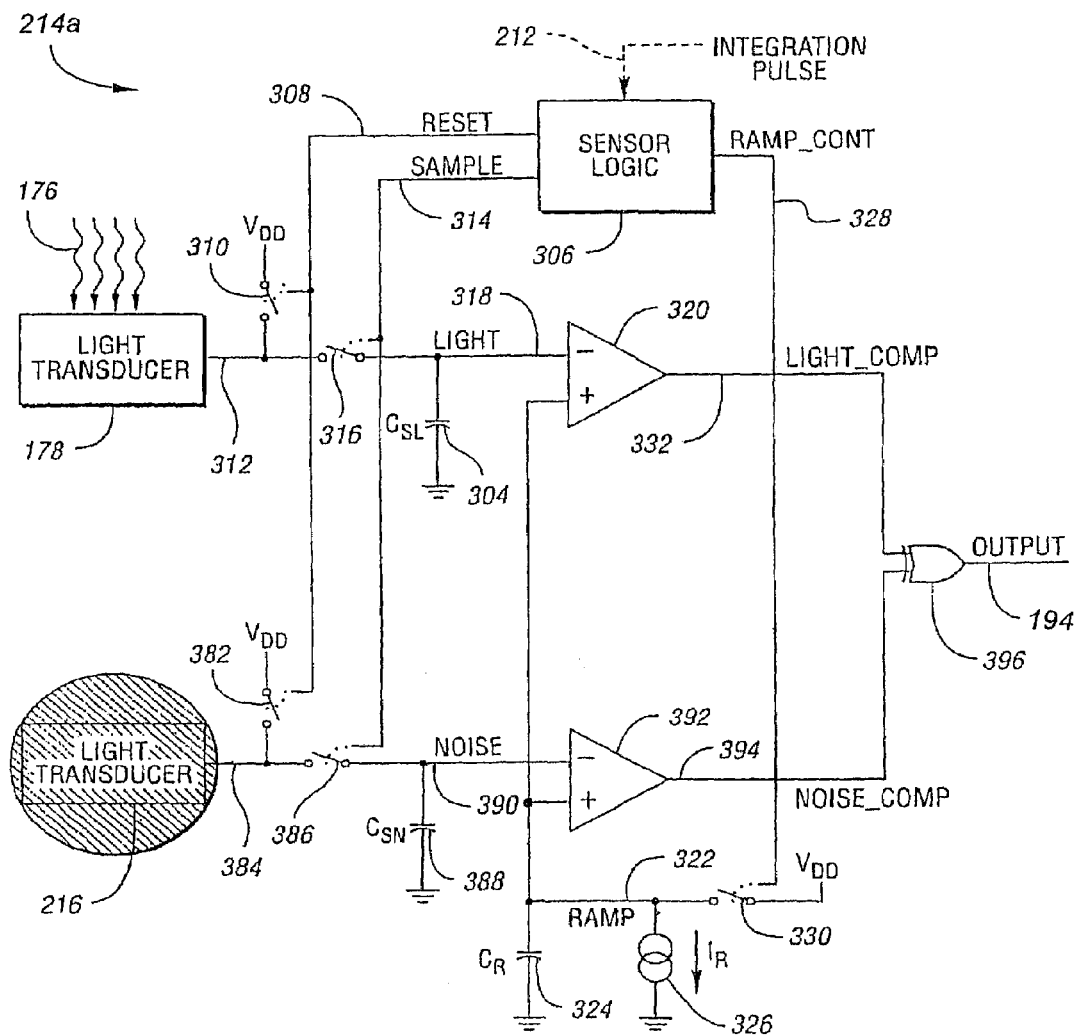
FIG. 10 is a schematic diagram of an optional light-to-pulse circuit with noise compensation for use in the sensing circuit shown in FIG. 5.

FIG. 10 is a schematic diagram of a modified light-to-pulse circuit 214a with noise compensation. Modified light-to-pulse circuit 214a improves upon light-to-pulse circuit 214 by incorporating shielded light transducer 216 and associated electronics. Shielded light transducer 216 preferably has the same construction as exposed light transducer 178. However, shielded light transducer 216 does not receive light 176. Charge generated by shielded light transducer 216, therefore, is only a function of noise. This noise is predominately thermal in nature. By providing shielded light transducer 216 having the same construction as exposed light transducer 178, such that the exposed and shielded transducers have the same surface area and material composition and may be deposited on the same die, the noise signal produced by shielded light transducer 216 will closely approximate the noise within the signal produced by exposed light transducer 178. By subtracting the signal produced by shielded light transducer 216 from the signal produced by exposed light transducer 178, the effect of noise in light transducer 178 can be greatly reduced.

Reset signal 308 controls switch 382 connected between shielded transducer output 384 and $V_{DD}$. Sample signal 314 controls switch 386 connected between shielded transducer output 384 and noise storage capacitor 388 indicated by $C_{SN}$. The noise storage capacitor voltage 390, which is the voltage across noise storage capacitor 388, is one input to comparator 392. The second input to comparator 392 is ramp voltage 322. The outputs of comparator 392, noise comparator output 394, and comparator output 194 serve as inputs to exclusive-OR gate 396. Exclusive-OR gate 396 generates exclusive-OR output 194 indicating the intensity of light 176.

Figure 11:
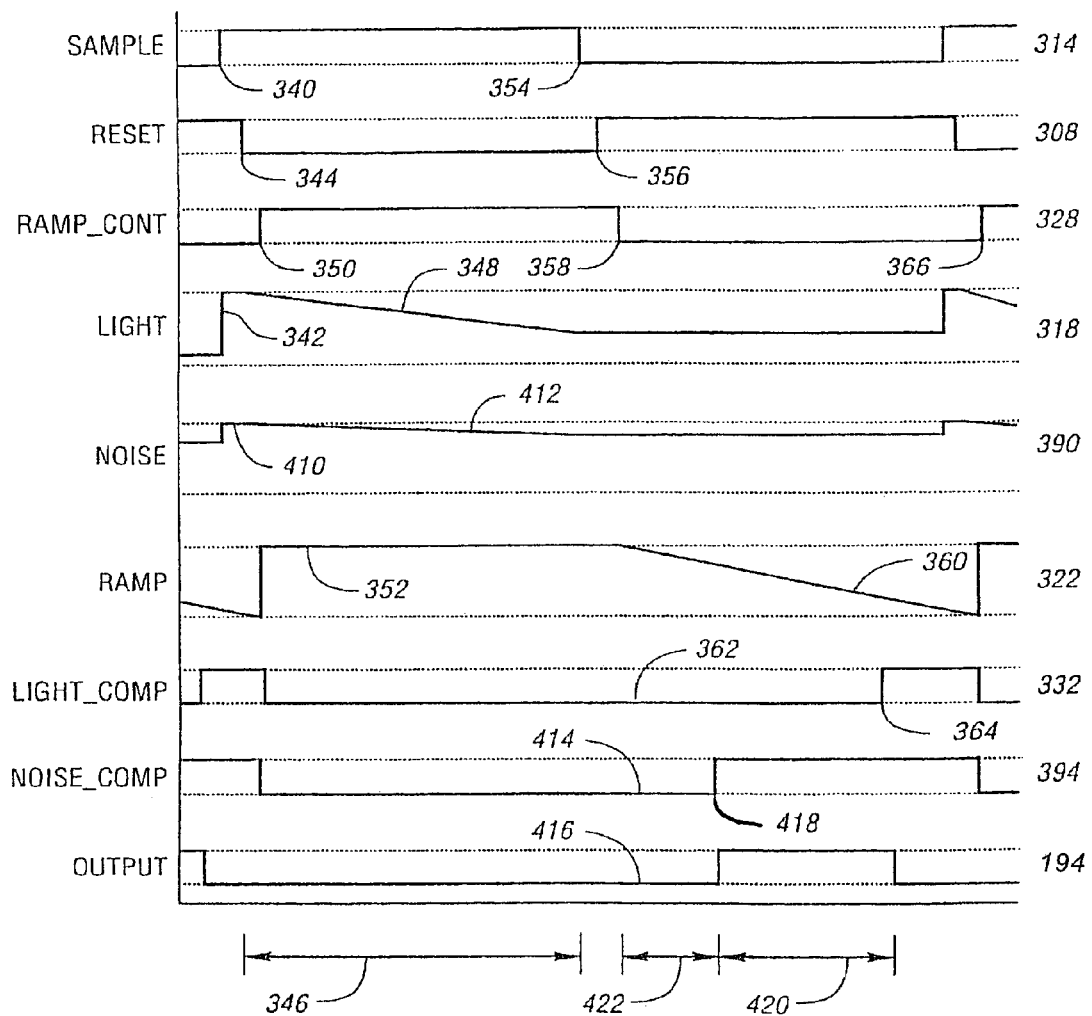
FIG. 11 is a timing diagram illustrating operation of the light-to-pulse circuit of FIG. 10.

FIG. 11 shows a timing diagram illustrating operation of the light-to-pulse circuit 214a of FIG. 10. Light-to-pulse circuit 214a functions in the same manner as light-to-pulse circuit 214 with regard to reset signal 308, sample signal 314, light storage capacitor voltage 318, ramp voltage 322, ramp control signal 328, and comparator output 194. At time 340, sample signal 314 is asserted while reset signal 308 is asserted. Switches 382 and 386 are both closed charging noise storage capacitor 388 to $V_{DD}$ as indicated by voltage level 410 in noise storage capacitor voltage 390. At time 344, reset signal 308 is deasserted opening switch 382 and causing declining voltage 412 in noise storage capacitor voltage 390 from charge produced by shielded light transducer 216 due to noise. At time 354, sample signal 314 is deasserted ending integration period 346 for noise collection. At time 358, ramp control signal 328 is deasserted causing declining voltage 360 in ramp voltage 322. Initially, as indicated by voltage level 414, noise comparator output 394 is unasserted because ramp voltage 322 is greater than noise storage capacitor voltage 390. Since comparator output 332 is also unasserted, output 194 from comparator 396 is unasserted as indicated by voltage level 416. At time 418, ramp voltage 322 drops below the level of noise storage capacitor voltage 390, causing noise comparator output 394 to become asserted. Since noise comparator output 394 and comparator output 332 are different, output 194 from comparator 396 is asserted. At time 364, ramp voltage 322 drops beneath the level of light storage capacitor voltage 318, causing comparator output 194 to become asserted. Since both noise comparator output 394 and comparator output 194 are now asserted, output 194 from exclusive-OR gate 396 now becomes unasserted. The difference between time 364 and time 418, output pulse duration 420, has a time period proportional to the intensity of light 176 incident on exposed light transducer 178 less noise produced by shielded light transducer 216 over integration period 346. The duration between time 418 and time 358, noise duration 422, is directly proportional to the amount of noise developed by shielded light transducer 216 over integration period 346. Since the majority of this noise is thermal noise, noise duration 422 is indicative of the temperature of shielded light transducer 216. At time 366, ramp control signal 328 is asserted, deasserting both noise comparator output 394 and comparator output 194.

In circuits where very high light levels may impinge on the sensor, it may be preferable to include a comparator (not shown) to end the output pulse when the voltage 318 falls below a predetermined threshold. This has the effect of limiting the maximum duration 420 of the output pulse at signal 194.

Referring now to FIG. 12, a schematic diagram of an implementation of the sensing circuit 15 of FIG. 10 using photodiodes as light transducers is shown. Light-to-pulse circuit 214b is implemented using exposed photodiode 430 for exposed light transducer 178 and shielded photodiode 432 for shielded light transducer 216. The anode of exposed photodiode 430 is connected to ground and the cathode connected through transistor Q20 to $V_{DD}$. The base of transistor Q20 is controlled by reset signal 308. Hence, transistor Q20 functions as switch 310. Transistors Q21 and Q22 are connected in series between $V_{DD}$ and ground to form a buffer, shown generally by 434. The base of transistor Q21 is connected to the collector of exposed photodiode 430. The base of load transistor Q22 is connected to fixed voltage $V_B$. The output of buffer 434 is connected through transistor Q23 to light storage capacitor 304. The base of transistor Q23 is driven by sample signal 314, permitting transistor Q23 to function as switch 316. The anode of shielded photodiode 432 is connected to ground and the cathode is connected to $V_{DD}$ through transistor Q24. The base of transistor Q24 is driven by reset signal 308 permitting transistor Q24 to function as switch 382. Transistors Q25 and Q26 form a buffer, shown generally by 436, isolating the output from shielded photodiode 432 in the same manner that buffer 434 isolates exposed photodiode 430. Transistor Q27 connects the output of buffer 436 to noise storage capacitor 388. The base of transistor Q27 is driven by sample signal 314 permitting transistor Q27 to function as switch 386. Typically, light storage capacitor 304 and noise storage capacitor 388 are 2 pF. Ramp capacitor 324, typically 10 pF, is charged to $V_{DD}$ through transistor Q28. The base of transistor Q28 is driven by ramp control signal 328 permitting transistor Q28 to function as switch 330. Ramp capacitor 324 is discharged through current source 326 at an approximately constant current $I_R$ of 0.01 µA when transistor Q28 is off.

Sensor power-up response is improved, and the effective dynamic range of the sensor is extended, by including circuitry to inhibit output if ramp voltage 322 drops beneath a preset voltage. Light-to-pulse circuit 214b includes comparator 438 comparing ramp voltage 322 with initialization voltage ($V_{INIT}$) 440. Comparator output 442 is ANDed with exclusive-OR output 396 by AND gate 444 to produce AND gate output 446. During operation, if ramp voltage 322 is less than initialization voltage 440, output 446 is deasserted (i.e., is held to a low logic level). The use of comparator 438 and AND gate 444 guarantees that output 446 is not asserted regardless of the state of light-to-pulse circuit 214b following power-up. In a preferred embodiment, the initialization voltage is 0.45 V.

Sensor logic 306 generates control signals 308, 314, 328 based on integration pulse 212, which may be generated internally or provided from an external source. Buffer 447 receives integration pulse 212 and produces sample control 314. An odd number of sequentially connected inverters, shown generally as inverter train 448, accepts sample control 314 and produces reset control 308. A second set of odd-numbered, sequentially connected inverters, shown generally as inverter train 449, accepts reset signal 308 and produces ramp control signal 328. The circuit shown in FIG. 12 has a resolution of at least 8 bits and a sensitivity of approximately 1 V per lux-second. The maximum output pulse duration 420 is independent of integration period 346 provided by the duration of integration pulse 212.

It is envisioned that the light signal 318 across capacitor 304 in FIG. 12 and the noise signal 390 across capacitor 388 may be input to differential operational amplifier 321 (FIG. 12A). The output of differential amplifier 321 is an analog signal representative of the difference between the light signal 318 and the noise signal 390. This circuit can be used where the control logic 66 includes an analog-to-digital converter that can convert these digital signals to analog signals.

Figure 13:
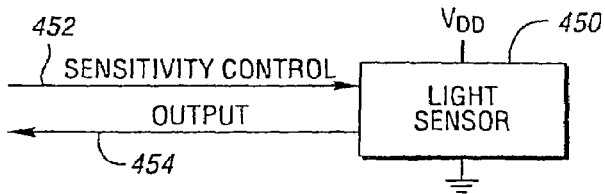
FIGS. 13-16 are block diagrams illustrating various embodiments for light sensor packaging, output, and control.
Figure 14:
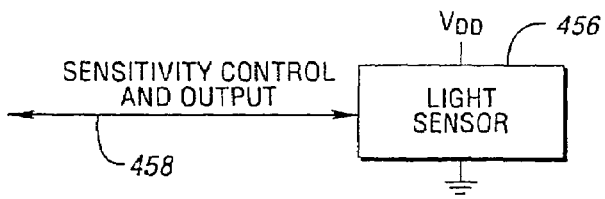
Figure 15:
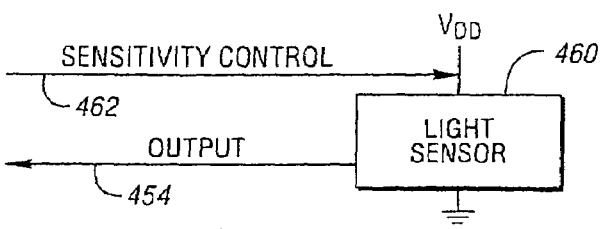
Figure 16:
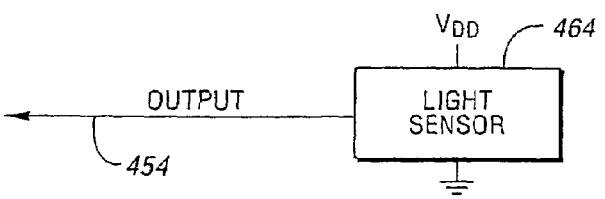

Referring now to FIGS. 13-16, various embodiments for light sensor packaging, output, and control are shown. Each embodiment may include light-to-pulse circuitry as described above. In FIG. 13, light sensor package 450 accepts four pins for supply voltage $V_{DD}$, ground, sensitivity control signal 452, and output signal 454. Sensitivity control signal 452 may be integration pulse 212 used by light-to-pulse circuit 214, 214a, 214b to produce output 398, which is sent as output signal 454. In FIG. 14, light sensor package 456 requires only three pins for $V_{DD}$, ground, and combined sensitivity control and output signal 458. Combined signal 458 may be interconnect signal 186 as described above. In FIG. 15, light sensor package 460 admits three pins for output signal 454, ground, and combined $V_{DD}$ and sensitivity control signal 462. As is known in the art, combined signal 462 may be separated into power supply voltage $V_{DD}$ and sensitivity control signal 452 through the use of filters. For example, a low-pass and high-pass filter can be used to separate the signals. In FIG. 16, light sensor package 464 admits three pins for $V_{DD}$, ground, and output signal 454. Sensitivity control signal 452 is generated within light sensor package 464 as described below.

Figure 17:
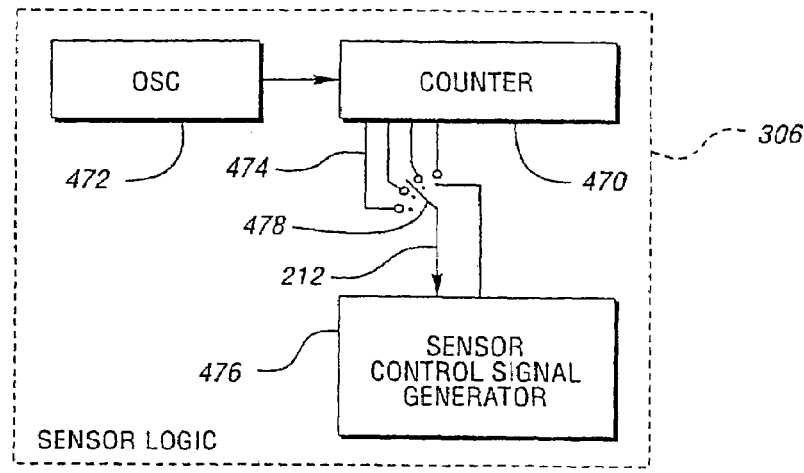
FIG. 17 is a block diagram illustrating sensor logic for internally determining the integration period signal.

Referring now to FIG. 17, a block diagram of sensor logic for determining the integration period signal within sensing circuit 15 is shown. Sensor logic 306 may include free-running counter 470 driven by internal oscillator 472. Counter 470 may have taps, one of which is indicated by 474, connected to different counter bits. For example, one tap 474 may be connected to the $n^{th}$ bit, the next tap 474 to the $n^{th}+2$ bit, the next tap 474 connected to the $n^{th}+4$ bit, and so on, with each successive tap thereby providing a pulse with a period four times longer than the preceding tap 474. Sensor control signal generator 476 controls switch 478 to determine which tap 474 will be used to produce integration pulse 212. Typically, sensor control signal generator 476 sequences through each tap 474 repeatedly. Sensor control signal generator 476 then uses integration pulse 212 to generate control signals such as reset signal 308, sample signal 314, and ramp control signal 328 as described above. It will be recognized that where the sensor generates the integration pulse internally to vary the sensor sensitivity, although the control logic will be unable to alter the integration period, the control logic will receive short, intermediate, and long output pulses from the sensor responsive to which measured light levels can be determined bright, intermediate and low light levels.

Figure 18:
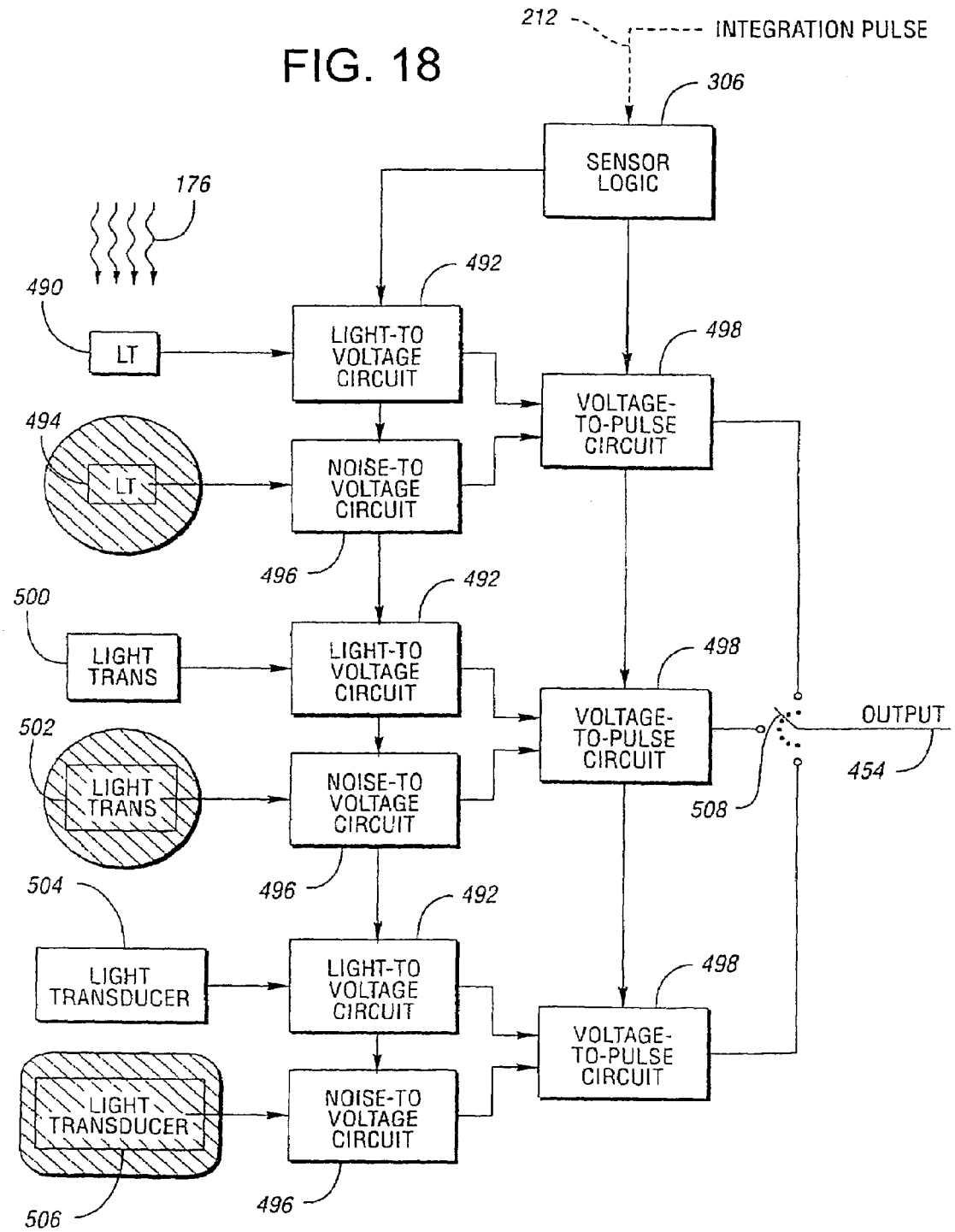
FIG. 18 is a block diagram illustrating the use of light transducers having different effective areas to achieve differing sensitivity.

Referring now to FIG. 18, an alternate embodiment of the sensing circuit 15 is illustrated wherein light transducers having different effective areas are used to achieve variable sensitivity. As an alternative to varying the integration time, or together with varying the integration time, pairs of exposed light transducer 178 and shielded light transducer 216 having different effective areas may be used. If photodiodes 430, 432 are used as light transducers 178, 216, the effective area is the photodiode collector area. Small exposed light transducer 490 produces charge, which is converted to a voltage by light-to-voltage circuit 492. Light-to-voltage circuit 492 may be implemented using switches 310, 316, and light storage capacitor 304 as described above. Charge produced by small shielded light transducer 494 is converted to voltage by noise-to-voltage circuit 496. Noise-to-voltage circuit 496 may be implemented using switches 382, 386 and noise storage capacitor 388 as described above. The outputs of light-to-voltage circuit 492 and noise-to-voltage circuit 496 are converted to a pulse by voltage-to-pulse circuit 498, with a width based on charge accumulated over an integration period by small exposed light transducer 490 less charge due to noise integrated by small shielded light transducer 494. Voltage-to-pulse circuit 498 may be implemented using comparators 320, 392, capacitor 324, current source 326, and gate 396 as described above. Medium exposed light transducer 500 has an effective area larger than the effective area for small exposed light transducer 490, resulting in increased sensitivity. For example, if the effective area of medium exposed light transducer 500 is four times larger than the effective area of small exposed light transducer 490, medium exposed light transducer 500 will be four times more sensitive to light 176 than will be small exposed light transducer 490. Medium shielded light transducer 502 has an effective area the same as medium exposed light transducer 500. Additional light-to-voltage circuit 492, noise-to-voltage circuit 496, and voltage-to-pulse circuit 498 produce a noise-corrected output pulse with a width based on light 176 incident on medium exposed light transducer 500 over the integration period. Similarly, large exposed light transducer 504 and large shielded light transducer 506 provide still increased sensitivity over medium exposed light transducer 500 and medium shielded light transducer 502 by having still greater effective areas.

Switch 508 under the control of sensor logic 306 sets which output from voltage-to-pulse circuits 498 will be used for output signal 454. Output signal 454 may be selected based on a signal generated within sensor logic 306 or may be based on a signal provided from outside of sensor logic 306. In particular, a control signal may be provided by control logic 66 that controls switch 508 to select one of the small, medium, and large light transducers for connection to output 454.

In an alternative embodiment, only one shielded light transducer 216 is used The output of shielded light transducer 216 is scaled prior to each noise-to-voltage circuit 496 in proportion to the varying effective areas of exposed light transducers 178. It will be recognized by one of ordinary skill in the art that although the examples shown in FIG. 18 have three pairs of exposed light transducers 178 and shielded light transducers 216, any number of pairs may be used.

Figure 19:
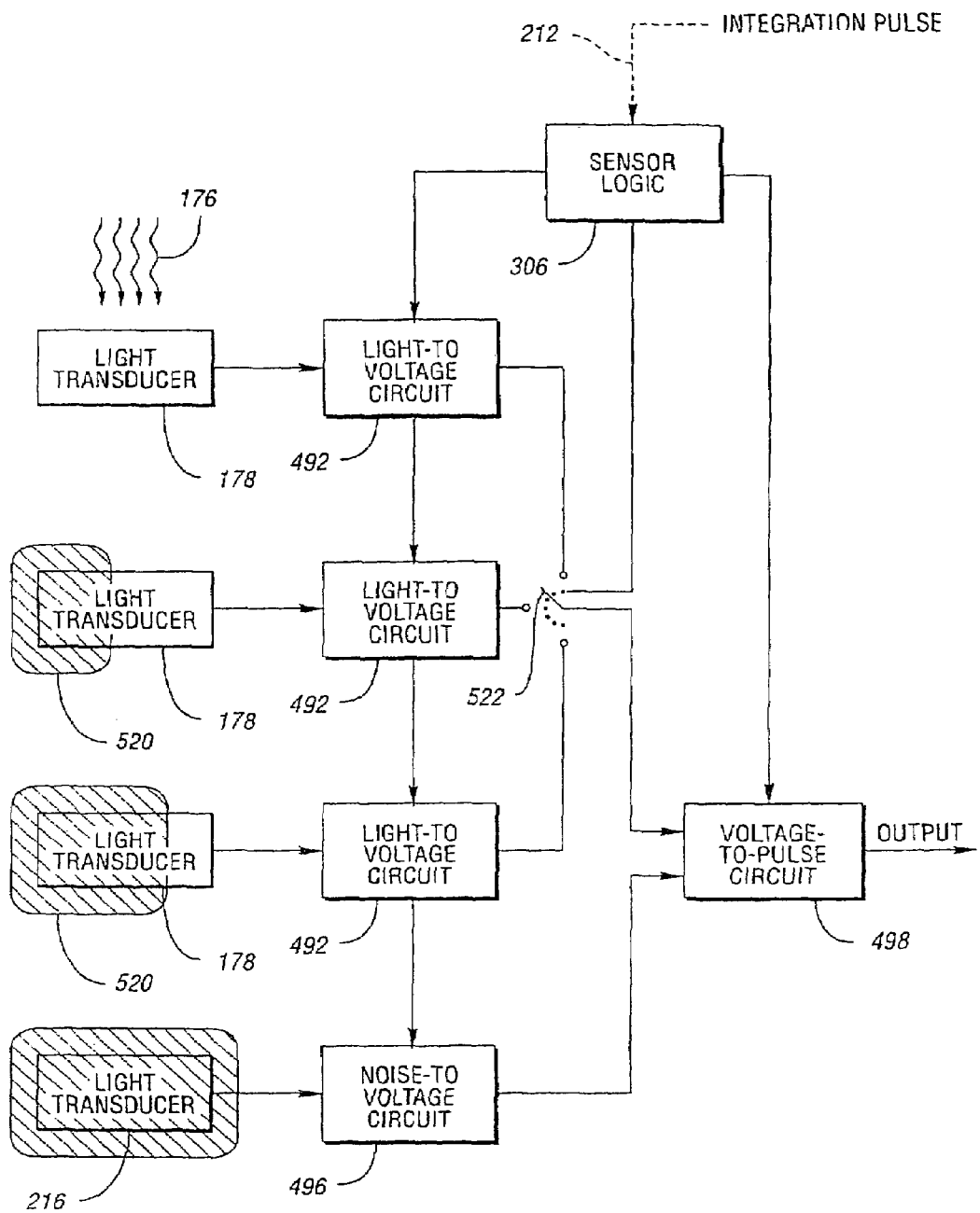
FIG. 19 is a block diagram illustrating the use of light transducers having different apertures to achieve increased dynamic range.

Referring now to FIG. 19, a block diagram illustrating the use of light transducers having different apertures to achieve increased dynamic range is shown. As an alternative to or together with specifying the integration period, exposed light transducers 178 having the same effective area may each have a different aperture admitting area for admitting light 176. Varying apertures may be produced using partial shield 520 blocking light 176 from reaching a portion of exposed light transducer 178. Each exposed light transducer 178 produces charge converted to a voltage by a corresponding light-to-voltage circuit 492. Switch 522 under the control of sensor logic 306 selects which light-to-voltage circuit 492 output is connected to voltage-to-pulse circuit 498. Voltage-to-pulse circuit 498 produces output signal 454 compensated for noise sensed by shielded light transducer 216 and processed by noise-to-voltage circuit 496. Sensor logic 306 may select output of light-to-voltage circuits 492 based on an internally generated control signal or on a control signal received from control logic 66.

In the embodiments with multiple transducers 178, 490, 500, 504, sensing circuit 15 detects incident light within a target spatial distribution. Each transducer 178, 490, 500, 504 views the same target spatial distribution. Hence, control logic 66 generates at least one equipment control signal 166 based on light signal 164 without mapping light signal 164 to an area within the target spatial distribution.

Referring now to FIG. 20, a transducer that can be used to achieve variable sensitivity is shown. A photodiode, shown generally by 530, is formed by n-type diffusion 532 in p-type substrate 534. Light 176 incident on photodiode 530 generates charge 536 which may be accumulated in photodiode well 538 beneath n-type diffusion 532. Photodiode 530 has intrinsic photodiode capacitance $C_{PD}$. Floating diffusion 540 is also formed by diffusing n-type material in substrate 534. Floating diffusion 540 is connected through transistor Q20 to reset voltage $V_{RESET}$. The gate of transistor Q20 is connected to reset signal 308 under the control of sensor logic 306. Floating diffusion 540 is also connected to the input of buffer 542. The output of buffer 542 is transducer output $V_{OUT}$. Floating diffusion 540 defines diffusion well 544 formed in a region of substrate 534 when reset signal 308 is asserted. Floating diffusion 540 has an intrinsic floating diffusion capacitance $C_{FD}$. Transmission gate 546 is positioned between diffusion 532 and floating diffusion 540. Transmission gate 546 is held at voltage $V_{TG}$ to form transmission well 548 thereunder. Transmission well 548 has a depth shallower than photodiode well 538 and diffusion well 544. Transmission gate 546 has an intrinsic transmission gate capacitance $C_{TG}$.

When reset signal 308 is asserted, bringing floating diffusion 540 to $V_{RESET}$, charge is eliminated in diffusion well 544. Further, when charge is reset in diffusion well 544, any charge 536 in photodiode well 538 above the depth of transmission well 548 flows through transmission well 548, through floating diffusion 540, and is eliminated. During a light integration period, reset signal 308 is unasserted, causing the voltage of floating diffusion 540 to float based on the amount of charge 536 in diffusion well 544. As light 176 strikes diffusion 532, charge 536 is created. Since charge 536 in photodiode well 538 up to the level of transmission well 548 was not eliminated by charge reset, additional charge 536 produced by incident light 176 flows from photodiode well 538 through transmission well 548 and into diffusion well 544. At charge level 550, beneath the level of transmission well 548, only diffusion well 544 is filling with charge 536. Hence, the voltage of floating diffusion 540 is inversely proportional to floating gate capacitance $C_{FD}$. When enough charge 536 has been generated to fill diffusion well 544 above the level of transmission well 548 such as, for example, level 552, diffusion well 544, transmission well 548, and photodiode well 538 all fill with charge 536. Hence, the voltage of floating diffusion 540 is now inversely proportional to the sum of floating diffusion capacitance $C_{FD}$, transmission gate capacitance $C_{TG}$, and photodiode capacitance $C_{PD}$. The result is a light sensor with a sensitivity determined from the magnitude of the resulting light signal.

Referring now to FIG. 21, a graph of output potential as a function of accumulated incident light for the transducer of FIG. 20 is shown. A curve, shown generally by 554, shows transducer output $V_{OUT}$ as a function of light 176 incident on diffusion 532 and, possibly, floating diffusion 540 over the integration period. During steep portion 556, charge 536 is accumulating in diffusion well 544 alone. Since the conversion gain is based only on floating diffusion capacitance $C_{FD}$, photodiode 530 appears to have a high sensitivity to incident light 176. During shallow portion 558, charge 536 is accumulated in diffusion well 544, transmission well 548, and photodiode well 538. Since the conversion gain is now dependent on the parallel combination of capacitances $C_{FD}$, $C_{TG}$, and $C_{PD}$, photodiode 530 now appears less sensitive to incident light 176. By adjusting voltages $V_{RESET}$ and $V_{TG}$, knee point 559 between steep portion 556 and shallow portion 558 can be shifted affecting the dynamic range. For example, if the maximum voltage swing for floating diffusion 540 is 1 volt; the ratio of $C_{FD}$ to the sum of $C_{FD}$, $C_{TG}$, and $C_{PD}$ is 1:100; and knee point 559 is set at 0.5 volts, the dynamic range of photodiode 530 is increased about 50 times over the dynamic range of a similar photodiode without dual capacitance.

Figure 22:
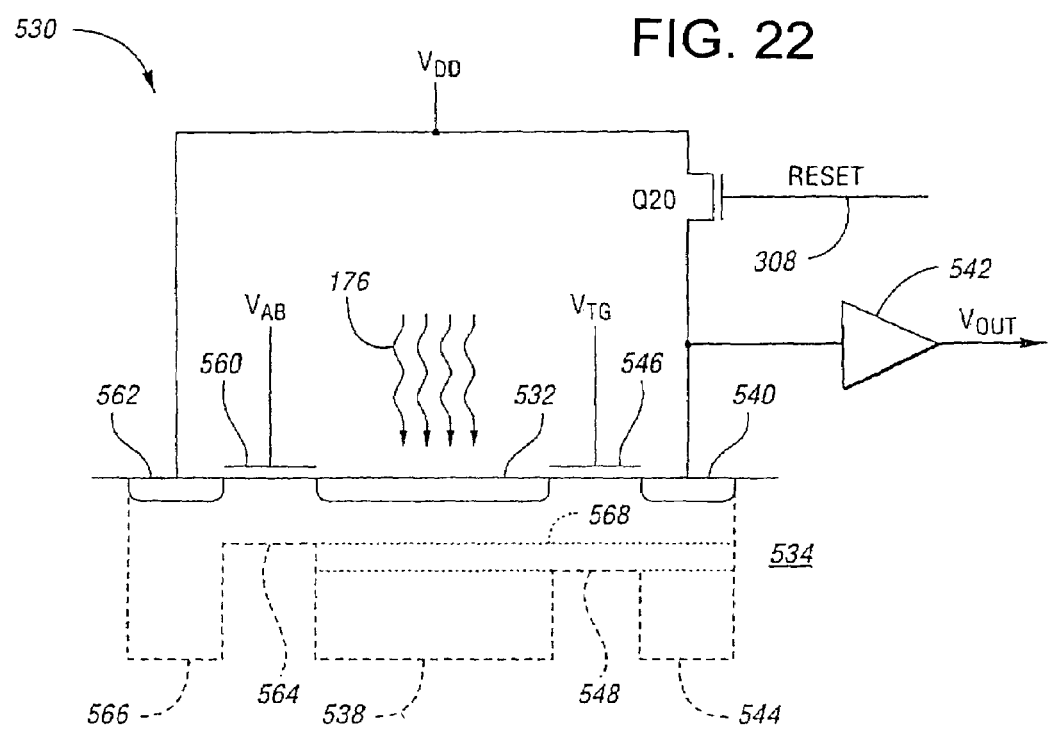
FIG. 22 is a schematic diagram illustrating a photodiode transducer incorporating an anti-bloom gate.

Referring now to FIG. 22, a schematic diagram illustrating a photodiode transducer incorporating an anti-bloom gate is shown. Anti-bloom gate 560 is formed between diffusion 532 and source voltage diffusion 562 tied to $V_{DD}$. Anti-bloom gate 560 is tied to anti-bloom voltage $V_{AB}$. Anti-bloom gate 560 forms anti-bloom well 564 in substrate 534 between photodiode well 538 and source diffusion well 566. Anti-bloom voltage $V_{AB}$ is less than transmission gate voltage $V_{TG}$ well 564, making anti-bloom well 564 shallower than transmission well 548. When accumulated charge generated by photodiode 530 exceeds charge level 568 equal to the depth of anti-bloom well 564, the excess charge flows beneath anti-bloom gate 560 into source voltage diffusion 562 and is eliminated. Anti-bloom gate 560 prevents output voltage $V_{OUT}$ from dropping below a level detectable by comparator 320 in light-to-pulse circuits 214, 214a, 214b.

Additional details of the operation of processing circuit 66, sensing circuit 15, and light-to-pulse circuits 214, 214a, 214b are disclosed in the above referenced U.S. Pat. Nos. 6,379,013 and 6,359,274, the entire disclosures of which are incorporated herein by reference.

Although a specific and preferred example of a sensing circuit is disclosed above, the term "sensing circuit" as used herein is not limited to any such structure, but rather may include any form of photosensor. Similarly, although the "support structure" is described above as being a lead frame or portion thereof, the support structure may be any structure on which a sensing circuit may be supported and encapsulated.

The sensor device of the present invention may be used in many of the applications in which conventional sensor devices are employed. Commonly assigned U.S. Pat. No. 6,379,013 discloses various automotive applications of such sensors, the entire disclosure of which is incorporated herein by reference.

Figure 23A:
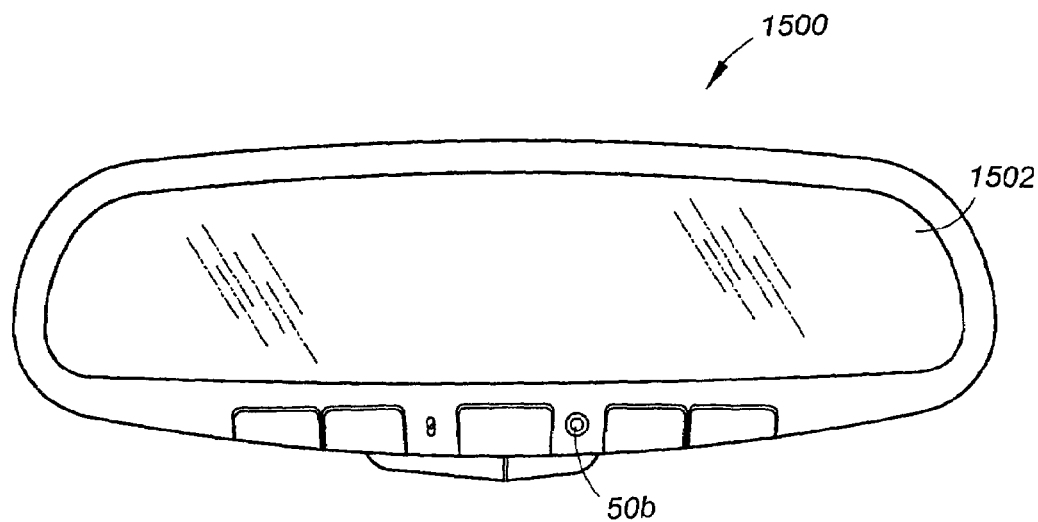
FIG. 23A is an elevational view of the front of a rearview mirror assembly incorporating the sensor device of the present invention.

FIGS. 23A-23D, 24, and 25 show several such automotive applications. Specifically, a rearview mirror assembly 1500 is shown in FIGS. 23A-23D, which incorporates an electrochromic rearview mirror 1502 that has a reflectivity that is controlled by a processing circuit 66 (FIGS. 5 and 24) as a function of an ambient light level sensed by a forward facing ambient sensor 50a (FIG. 23B) and a rearward facing glare sensor 50b (FIG. 23A). Either one or both of sensors 50a and 50b may have any of the constructions shown in FIGS. 1-4. By utilizing a sensor having the construction shown in either of FIGS. 1-4, the horizontal field of view may be widened or narrowed relative to the vertical field of view as may be desirable for the particular sensor.

Figure 23B:
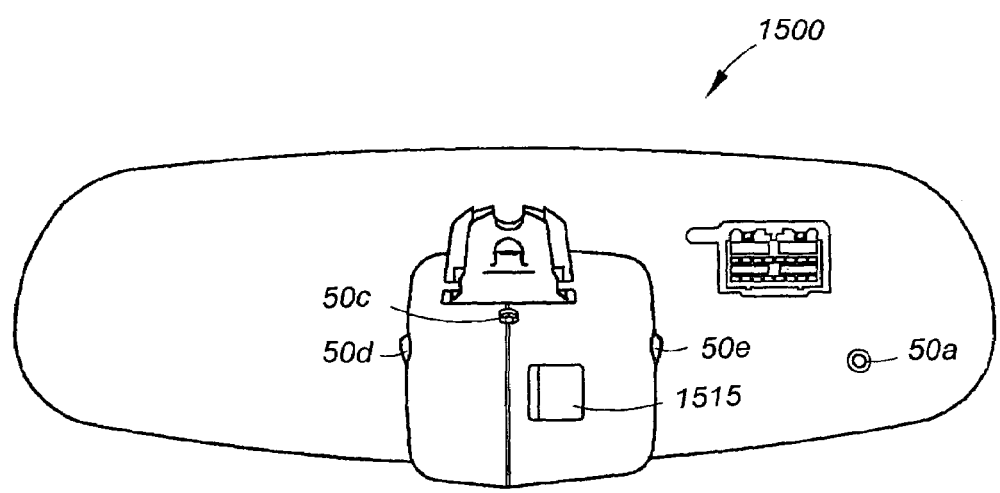
FIG. 23B is an elevational view of the rear of a rearview mirror assembly incorporating the sensor device of the present invention.
Figure 23C:
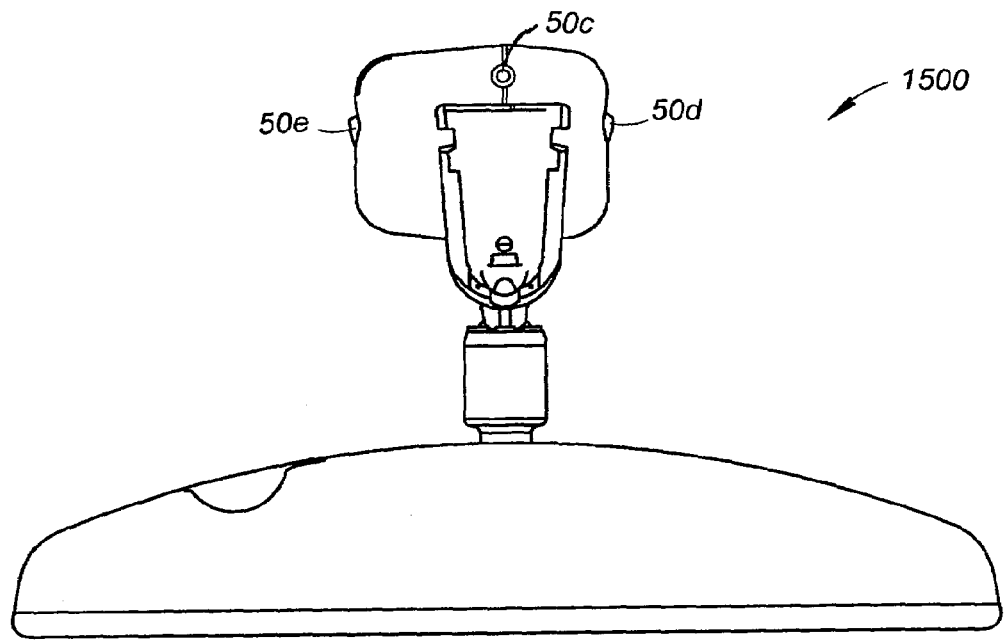
FIG. 23C is a top plan view of the rear of a rearview mirror assembly incorporating the sensor device of the present invention.
Figure 23D:
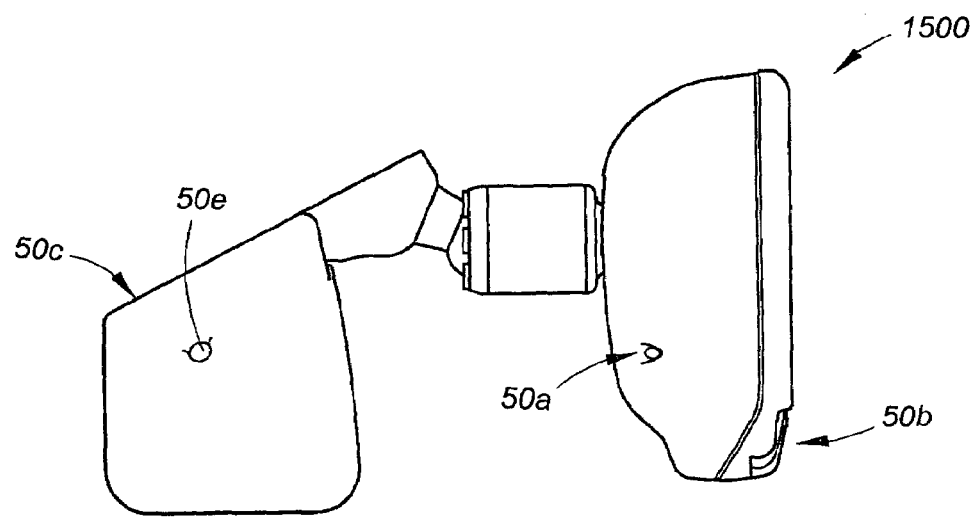
FIG. 23D is an elevational view of the side of a rearview mirror assembly incorporating the sensor device of the present invention.
Figure 24:
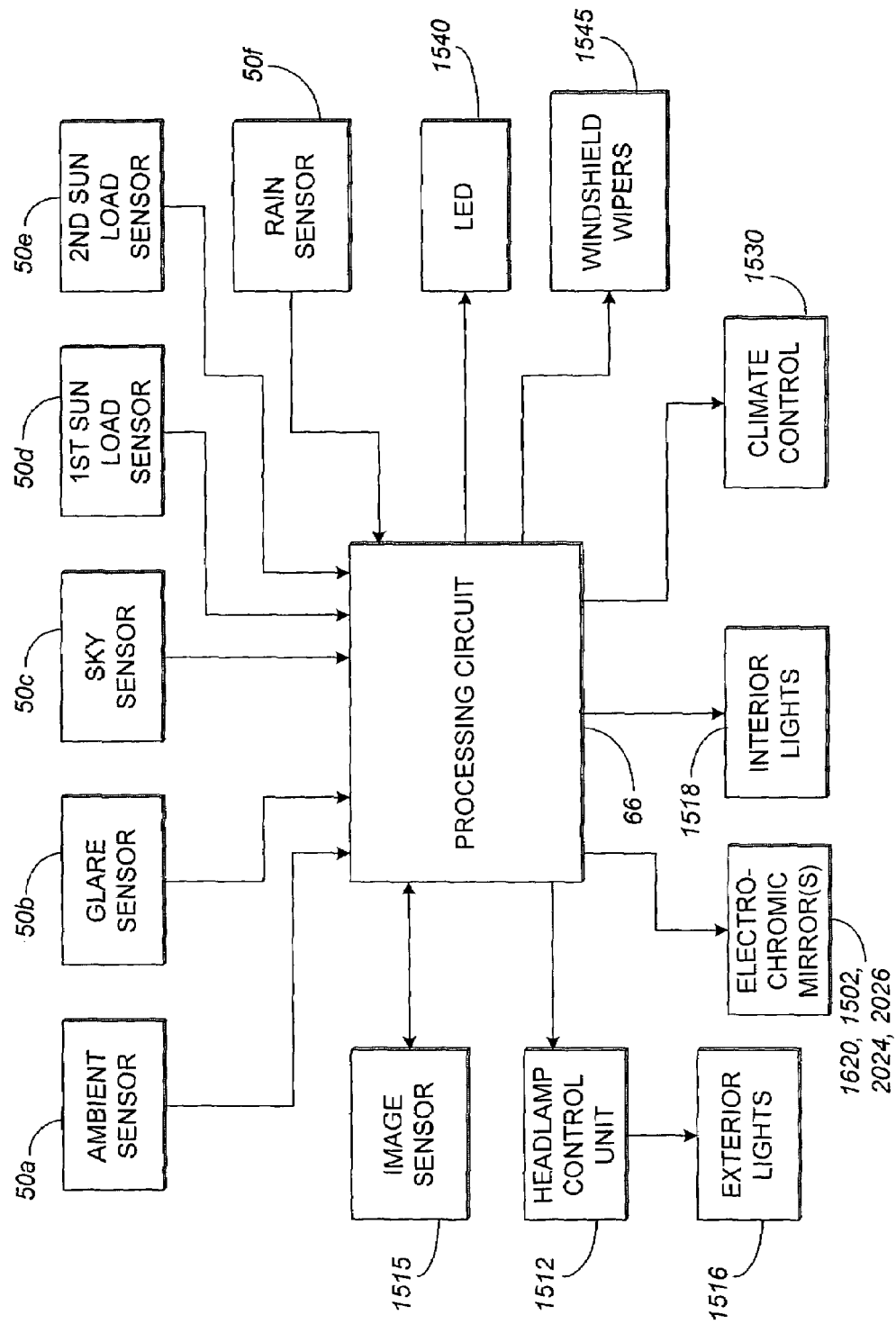
FIG. 24 is an electrical circuit diagram in block form illustrating a vehicle equipment control system employing the sensor device of the present invention.

As shown in FIGS. 23B-23D, the rearview mirror may further include a sky sensor 50c that is aimed upward at the sky. Such a sky sensor is useful in a headlamp control system for detecting tunnels and thereby ensures that headlamps are appropriately turned on when the vehicle is in a tunnel and turned off upon exiting the tunnel. Sky sensor 50c may also advantageously employ the construction shown in FIG. 1 and described above. Sky sensor 50c is coupled to a processing circuit 66 (FIGS. 5 and 24) which, in turn, may be coupled to a headlamp control unit 1512 to thereby turn the vehicle headlamps on and off in response to the ambient light level and sky light level sensed by sensors 50a and 50c. The headlamp control system may further include an image sensor 1515 for sensing images forward of the vehicle for purposes of controlling the brightness of the high beam headlamps and/or activating or aiming the headlamps or other exterior lights 1516 to change the beam pattern produced by the exterior lights based upon light sources detected by the image sensor 1515. An example of such a headlamp control system is disclosed in commonly assigned U.S. Pat. No. 6,587,573 filed on Mar. 5, 2001, entitled "SYSTEM FOR CONTROLLING EXTERIOR VEHICLE LIGHTS" filed by Joseph S. Stam et al., the entire disclosure of which is incorporated herein by reference. The output of the sensors 50a, 50b, and/or 50c may also be used to control other vehicle lights such as the interior lights 1518 of the vehicle and more particularly to control the brightness of the display lights of the various displays in the instrument panel and other vehicle accessories.

As also shown in FIGS. 23B-23D, two or more additional sensors 50d and 50e may be employed to sense sun loading. Sun loading sensors 50d and 50e are aimed upward toward the sky above the vehicle and are aimed slightly to different sides of the vehicle to sense whether the sun load on one side of the vehicle is greater than on the other side of the vehicle. A processing circuit 66 (FIGS. 5 and 24) is coupled to sun load sensors 50d and 50e and is coupled to a climate control system 1530 of the vehicle for adjusting the fan speeds and/or temperature settings for respective sides of the vehicle based upon the light levels sensed by the sun load sensors 50d and 50e. Sun load sensors 50d and 50e may also be configured as described above and shown in FIGS. 1-4. The light levels sensed by any one of the above sensors may be used to control some aspect of the operation of climate control system 1530. For example, sky sensor 50c and ambient sensor 50a may be used to detect an approaching tunnel to thereby cause the headlamps to turn on and the climate control to enter a recirculation mode.

Figure 25:
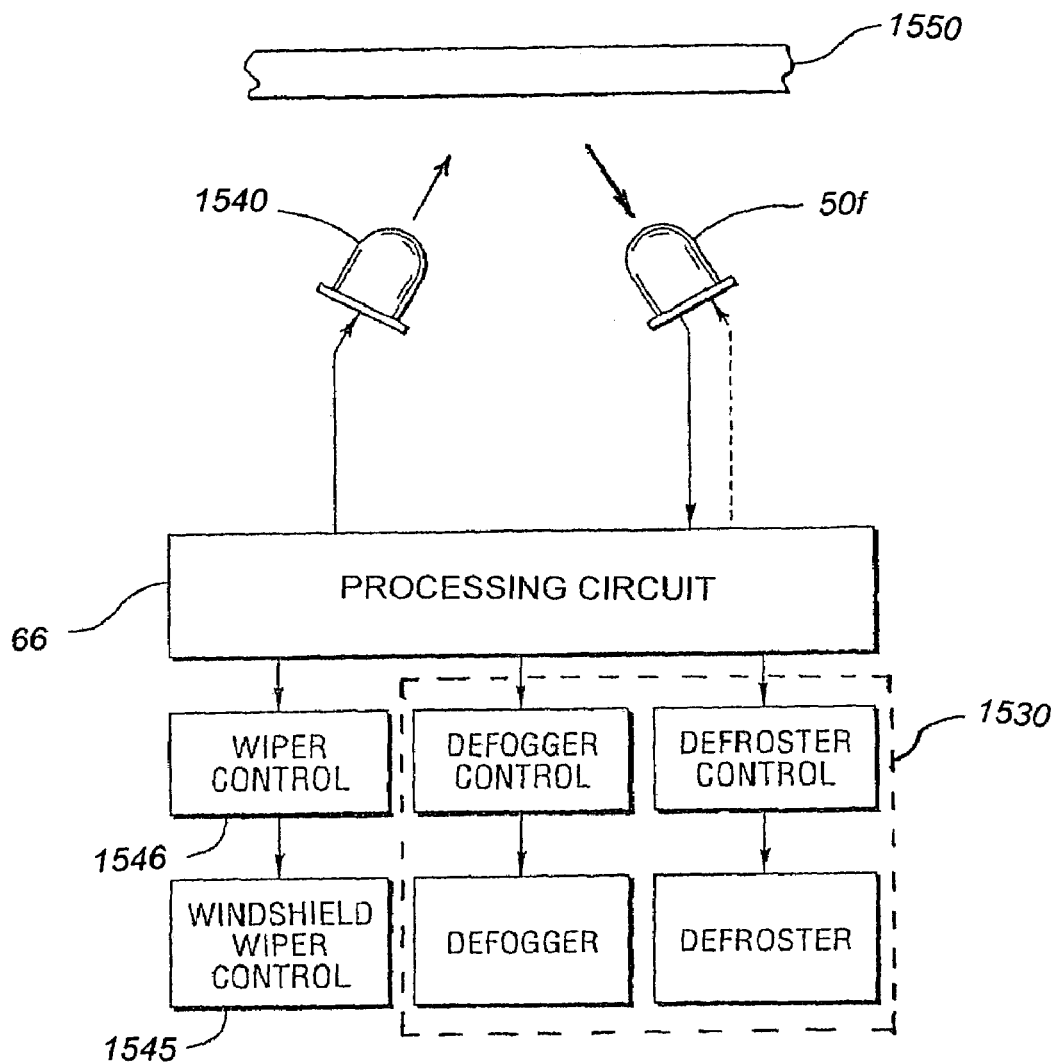
FIG. 25 is a side elevational view of a moisture detecting system employing the sensor device of the present invention.

FIG. 25 shows yet another automotive application for utilizing the inventive sensor construction. Specifically, FIG. 25 shows a moisture sensing system for detecting moisture (i.e., rain, mist, fog, frost, and snow) on the vehicle windshield. The system includes a light source such as an LED 1540 and a sensor 50*f*. Optical radiation (i.e., visible light, or infrared or ultraviolet radiation) emitted from LED 1540 enters the windshield 1550 and is internally reflected therein and exits to impinge upon sensor 50*f*. If moisture is present on the windshield, the light from LED 1540 does not reach sensor 50*f* and a processing circuit 66 (FIGS. 5 and 24) actuates the vehicle windshield wipers 1545 via wiper control 1546 and/or the windshield defogger of the vehicle climate control system 1530.

While the above examples of automotive applications are described as being disposed in a rearview assembly, it will be appreciated that some of the above applications may be implemented, in whole or in part, in other locations or vehicle accessories in the vehicle, such as the vehicle instrument panel, an A-pillar, a sun visor, or in an overhead console located on the headliner or on or near the windshield. Additionally, the sensor of the present invention may be employed in any other non-automotive application and the invention as broadly defined is not limited to any such application.

Preferred constructions of an inventive rearview assembly 1600 and glare sensor subassembly 1650 are shown in FIGS. 26-39 and are discussed further below.

As shown in FIGS. 26 and 27, rearview assembly 1600, which is depicted as an electrochromic rearview mirror assembly, includes a housing 1610 having a rear casing 1612 and a bezel 1614, which are secured together to house an electrochromic mirror element 1620 and a circuit board 1630 on which the glare sensor subassembly 1650 and an ambient light sensor 1670 (FIGS. 28B, 28C, and 28D) are mounted. A support plate 1680 may optionally be provided to support circuit board 1630 and/or electrochromic mirror element 1620 within housing 1610. A layer of double-sided tape or adhesive may be used to secure electrochromic mirror element 1620 to support plate 1680 or, as in the embodiment shown, the support plate 1680 may snap around opposing edges of mirror element 1620.

In the example shown in FIGS. 26 and 27, a switch support 1690 is included in the mirror assembly to support pushbutton switches 1692 that are disposed along the bottom of housing 1610. A mounting socket 1695 (or a mounting ball (not shown)) may also be incorporated within housing 1610 for engaging a ball (or socket) of a mirror mount (not shown) such that the housing 1610 may be pivoted in two dimensions relative to the mirror mount.

Housing 1610 may house many other components as are known in the art. In the example illustrated in FIGS. 26 and 27, a large aperture 1615 is provided in rear casing 1612 for mounting of a map light assembly 1684. Such a map light assembly may include an LED subassembly (not shown), a heat sink/mounting plate 1685, a reflector 1687, and a lens 1689. Examples of such map light assemblies are disclosed in U.S. Pat. No. 6,670,207, the entire disclosure of which is incorporated herein by reference. Also, a smaller aperture 1617 is provided that opens to the rear of the rear casing 1612 (and towards the front of the vehicle) so as to allow light to pass through to ambient light sensor 1670, which is preferably constructed in the manner discussed above, and which is surface-mounted to the rear surface 1631 of circuit board 1630. A secondary optical element (not shown) may be provided across small aperture 1617 to function as a diffuser and/or lens.

FIGS. 28A-28E show various views of the combined structure of circuit board 1630 and support plate 1680. As shown, support plate 1680 may include resilient tabs to allow circuit board 1630 to be snapped in place and secured by support plate 1680. As illustrated, the sensors 1652 and 1670 as well as secondary optical element 1660 may all be secured to the circuit board 1630 prior to installation in housing 1610. By configuring these elements to be pre-installed on the circuit board, they may be tested on the circuit board prior to assembly within the mirror assembly. This lowers scrap cost in the event that the sensors or circuitry is not operating at the desired performance levels.

Glare sensor subassembly 1650 is shown in more detail in FIGS. 29-39. As shown in FIGS. 29-39, glare sensor subassembly 1650 includes a sensor device 1652 and a secondary optical element 1660 mounted to circuit board 1630. Circuit board 1630 includes a first hole 1632 though which sensor device 1652 extends such that sensor device may be surface mounted to the rear surface 1631 of circuit board 1630 and yet sense light coming from the rear of the vehicle. This allows both ambient light sensor 1670 and glare sensor device 1652 to be surface-mounted to the same surface (1631) of circuit board 1630. Circuit board 1630 further includes a pair of holes 1634 through which a corresponding pair of resilient legs 1662 of secondary optical element 1660 extends. Holes 1634 allow secondary optical element 1660 to be snapped into circuit board 1630 so as to extend in front of glare sensor device 1652 as shown in FIG. 29. FIG. 30 shows the disposition of glare sensor device 1652 with secondary optical element 1660 removed from circuit board 1630.

Referring back to FIG. 27, it can be seen that glare sensor subassembly 1650 is mounted to circuit board 1630 so as to be in optical alignment with a region 1622 of mirror element 1620. Region 1622 may be a region in which a reflective layer of the mirror element has been removed either partially or entirely to allow light to pass through the mirror element to secondary optical element 1660 and then to glare sensor device 1652. U.S. Pat. No. 6,356,376 discloses an electrochromic mirror element with a glare sensor device mounted behind a region where a portion of the reflective layer had been removed. The entire disclosure of this patent is incorporated herein by reference. Alternatively, region 1622 may be a region of the reflective layer that is partially reflective and partially transmissive (or "transflective"). For that matter, the entire reflective layer may be transflective. Examples of transflective electrochromic mirrors are disclosed in U.S. Pat. No. 6,356,376, the entire disclosure of which is incorporated herein by reference. The region 1622 may be formed by masking the rear substrate while the reflector layer(s) are being deposited. A layer of indium tin oxide or a noble metal, such as ruthenium, may be applied over region 1622 to provide electrical conductivity across region 1622 so that the electrochromic medium darkens uniformly across the mirror element.

Secondary optical element 1660 is shown in detail in FIGS. 32-39. Secondary optical element 1660 is referred to as such because its optics are secondary to the optics integrated into sensor device 1652. Secondary optical element 1660 may be a simple diffuser or it may alternatively or additionally function as a lens. In the preferred example shown in FIGS. 32-39, secondary optical element 1660 functions as a lens, although it will be appreciated that one or both surfaces may be textured or a diffusant may be incorporated into the material used to construct element 1660 to diffuse light passing therethrough.

Secondary optical element 1660 comprises a relatively flat substrate 1664 having a front surface 1665 and a rear surface 1666. The pair of resilient legs 1662 extends rearward from two sides of substrate 1664. An apron 1667 extends rearward from the other sides of substrate 1664. Apron 1667 does not extend as far rearward as legs 1662 and thereby serves to limit the insertion depth into the holes of circuit board 1630 and to maintain spacing between its rear surface 1666 and the foremost surface of glare sensor device 1654.

In the example shown, a first lenticular lens 1668 is provided on front surface 1665 of substrate 1664, while a second lenticular lens 1669 may be provided on rear surface 1666. First lenticular lens 1668 includes a plurality of parallel enlongated first lenslets 1668a, while second lenticular lens 1669 includes a plurality of parallel enlongated second lenslets 1669a. First lenslets 1668a extend perpendicular to second lenslets 1669a so as to allow for different focal lengths in the horizontal and vertical planes. By providing different focal lengths in these different planes, the field of view of the glare sensor may be different horizontally than it is vertically. As a result, the field of view may be narrowed or broadened to attempt to limit the field of view to that field that is viewable through the rear window without also including other parts of the interior of the vehicle such as the rear seats as would otherwise occur particularly when the vehicle employs theater seating. As used herein, the term anamorphic lens element shall refer to a lens element that has different focal lengths in different planes and which provides a non-square or aspherical field of view. Although two perpendicular lenticular lenses are described above, other forms of anamorphic or spherical lenses may also be used. Such a lens may be plano-convex or bi-convex, cylindrical, spherical, parabolic, elliptical, or bi-radial, and may be in the form of a single lens, a lenticular lens, or a microgroove lens, such as a Fresnel lens. The particular form of lens employed (if any) will depend upon the particular application. By providing such a lens in a secondary optical element, the same glare sensor device 1652 may be used regardless of the vehicle in which it is installed whereas the secondary optical element 1660 may be selected and installed for a particular make/model of vehicle.

Although the constructions of glare sensor device 1652 and ambient light sensor 1670 have been described as including the integral lens structure 20 shown in FIGS. 1-3 and 4C, it will be appreciated that the integral lenses formed in the encapsulants of the devices may vary. For example, the encapsulant may be shaped to define a spherical lens or an anamorphic lens such as a cylindrical lens or bi-radial lens as shown in FIGS. 40-45 and described below.

Figure 40:
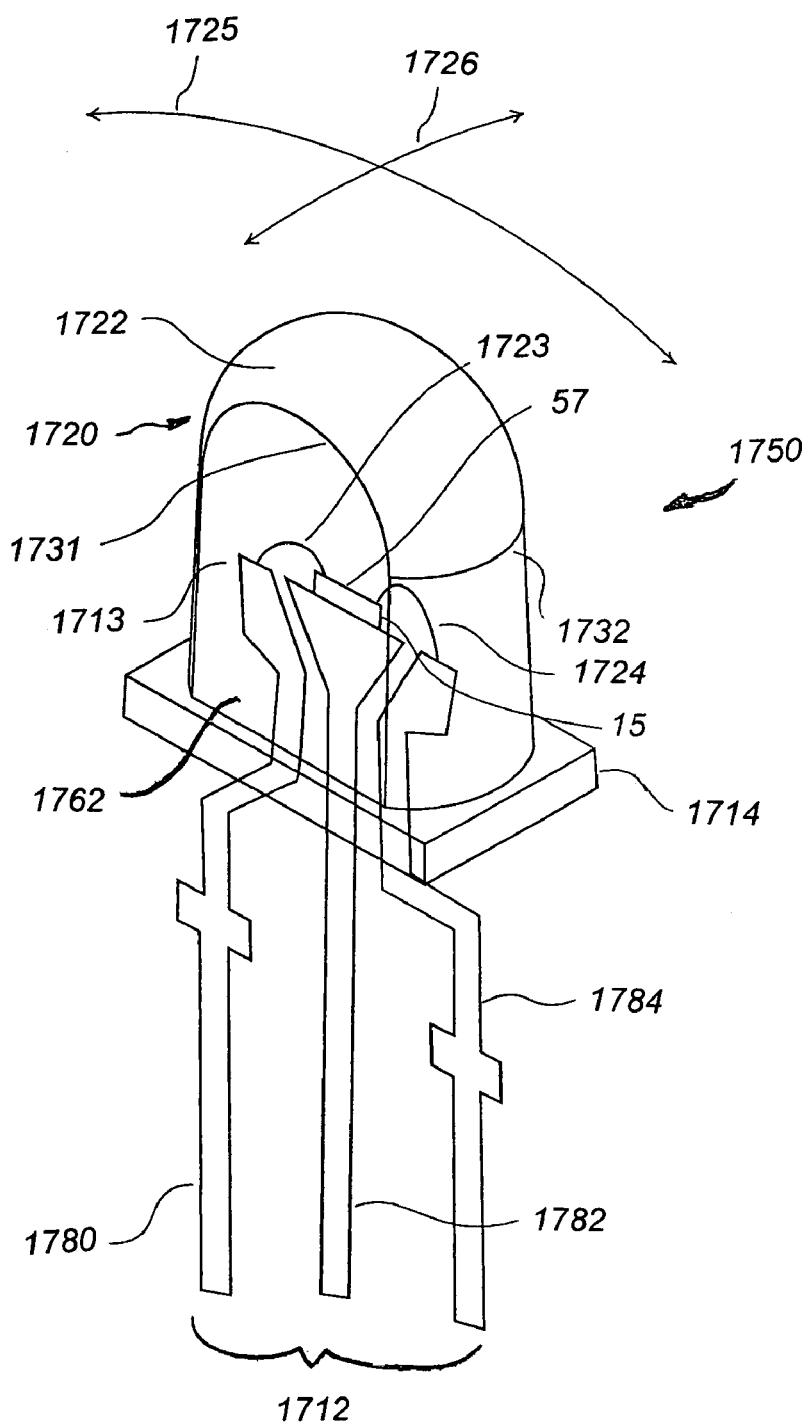
FIG. 40 is a perspective view of a sensor device constructed in accordance with a second embodiment of the present invention.

A sensor device 1750 constructed in accordance with a second embodiment of the present invention is shown in FIG. 40. The sensor device 1750 includes a support structure, such as a printed circuit board or a lead frame 1712, a sensing circuit 15 mounted on the support substrate for sensing optical radiation, preferably visible light, and an encapsulant 1762 encapsulating the sensing circuit 15 on the support structure. In general, the encapsulant 1762 includes an integral lens 1720 having an anamorphic surface 1722 to provide for different fields of view in transverse directions. According to the first embodiment, the anamorphic surface 1722 is biradial. For example, the design may be for a field of view of nominally 90 degrees included angle in the direction 1725 and nominally 45 degrees included angle in the direction 1726. For example, a toroidal lens surface 1722 having a radius of 1.5 mm in the direction indicated by 1732 and the larger radii depicted by 1731 may be generated by sweeping the center of the curve 1732 about an arc having a 1 mm radius. The lens formed by the toroidal surface 1722 has a focal length of roughly 4.5 mm in the plane which intersects the lens along its smaller radius and a focal length of roughly 7.5 mm in the plane which intersects the lens along its largest radius. The active sensing area 57 of sensing circuit 15 is small (i e., having a surface area of less than 1 $mm^2$) and is centrally located on the top surface of sensing circuit 15. Preferably, the active sensing area 57 has a diameter of, for example, 100 microns and an area of about 0.03 $mm^2$. The surface 22 may be of many forms and does not need to be toroidal. For example, the curve 1732 may be any aspheric shape, perhaps optimized for some aspect of lens performance. Then, the shape 1732 may optionally be rotated to form a surface of revolution in the other direction as with the toroidal surface 1722 or may be swept along some other curve. In a more general case, the surface profile does not even need to be circular in either direction. A surface which meets the intent of the specification of this invention is one which performs the desired function and which has a generally larger radius of curvature as measured at the intersection of a plane which is generally parallel to the direction of the widest field of view. As described further below in connection with the second embodiment of the invention, the integral lens may have a cylindrical surface.

For the lens that has surface profiles which differ in radius in different reference planes, ray fans projected into the lens from within these different planes come into general focus at differing distances from the lens surface. The position of sensing area 57 relative to the various focal distances of the lens has a strong effect on the resulting shape of the sensitivity profile of the sensor response. It is generally preferable to position the active sensing surface 57 as close or closer to the lens than the closest distance of a point for which there is a strong focusing characteristic. In the above-described example, this would be as close or closer than the nominal focal distance of 4.5 mm resulting from the 1.5 mm lens radius. Placement of the sensor surface short of the focal distance has a de-focusing effect which widens the response profile in the reference plane for which the particular focus applies. As the ratio of the distance of the active surface of the sensor from the lens to the focal length of a particular focus point is decreased, the optical gain in the corresponding orientation is generally decreased and the width of the response profile in the corresponding orientation is increased. Since the radius of curvature and the resulting focal length in a plane parallel to the direction 1725 is longer than the focal length corresponding to direction 1726, the ratio of the distance of the sensor from the lens to the longer focal distance is smaller and the corresponding response profile is wider, but the contribution to the overall optical gain of the sensor though significant is smaller. This is in line with the desire to have the wider response profile in the direction indicated by 1725.

Figure 41A:
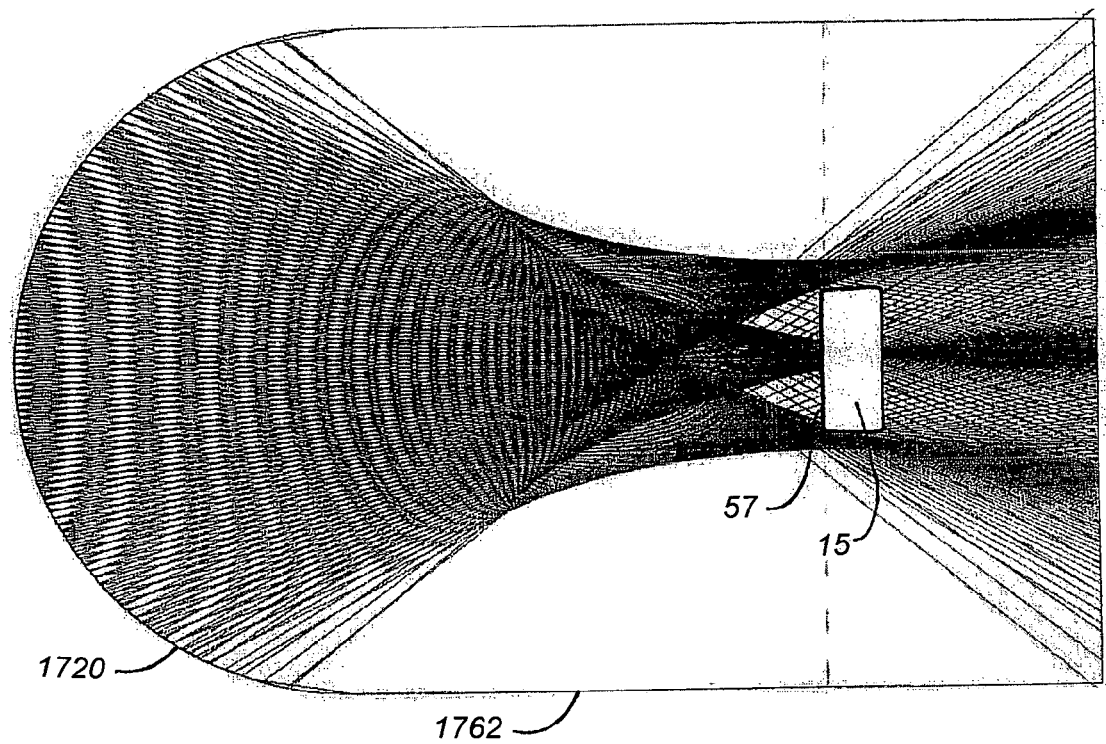
FIGS. 41A and 41B represent two different ray tracings for light incident upon two different photosensors having different lens radii based upon light emitted from an on-axis source and two light sources that are +10 degrees and −10 degrees off-axis.
Figure 41B:
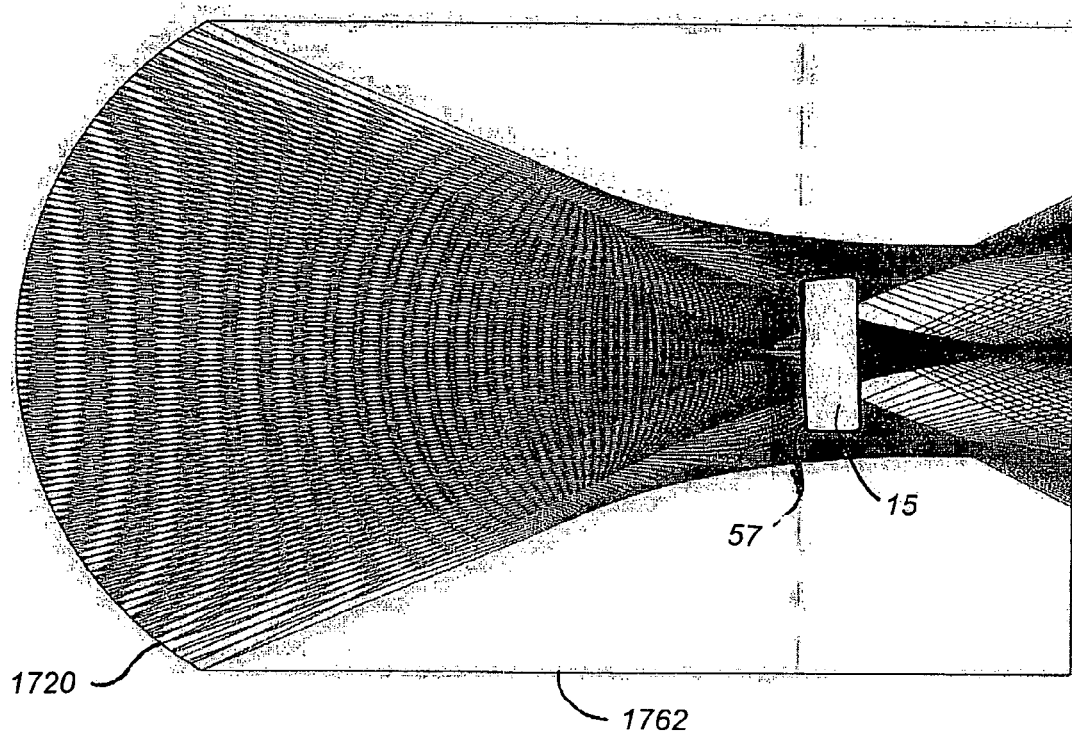

To illustrate the effect of positioning the active sensing area 57 of sensing circuit 15 closer to the lens than its focus point, ray tracings for two different photosensor constructions are shown in FIGS. 41A and 41B. In both devices shown in FIGS. 41A and 41B, the integral lens/encapsulant has a length along its optical axis of 4 mm with the active sensing area 57 of sensing circuit 15 positioned 3 mm back from the forwardmost point of the integral lens. The first photosensor device shown in FIG. 41A has an integral lens with a radius of 1.25 mm in the plane in which the cross section is taken. Light having a wavelength of 550 nm was directed at the lens with sources that were on-axis, and at +10 degrees and −10 degrees off-axis. The photosensor device shown in FIG. 41B is similar to that shown in FIG. 41A with the exception that the radius of the integral lens is 1.45 mm, thus increasing the focal length of the lens. The sensing circuit, however, in the second photosensor device is maintained at 3 mm from the lens. In comparing the two devices, it is apparent that in the first photosensor device shown in FIG. 41A, only the light from the on-axis source location impinges upon the active sensing area of sensing circuit 15. With this construction, the first photosensing device shown in FIG. 41A is essentially blind to off-axis light. The active sensing area of the sensing circuit 15 of the second photosensing device shown in FIG. 41B, however, has light from both the +10 degree and the −10 degree off-axis locations impinging thereupon. Accordingly, the second photosensor device shown in FIG. 41B is more sensitive to off-axis light than the photosensor device shown in FIG. 41A.

To further widen the response profile generally in all directions, diffusant may be added to the lens material in the proportion which is experimentally determined to give the desired effect, or a surface treatment such as texturing may be applied to the lens surface. Texturing of the lens surface preferably comes from replication of a mold surface, but may be created by a coating or secondary operation such as sand blasting or bombardment with some other abrasive material. With transfer molding techniques, a textured surface is often desirable, but with encap molding techniques, textured surfaces may create mold release problems. Thus, compatibility with the fabrication process should be taken into account when choosing a technique to add diffusion. In the process referred to as the encap process, plastic lens material which is in a fluid form is dispensed into pliable mold cups and the completed lead frame assemblies are lowered into the potting material. To complete the assembly, the material is cured and the finished part is withdrawn from the mold and individual parts are separated from one another. Thus, by adding diffusant to the encapsulants of the photosensors shown in FIGS. 41A and 41B, for example, the angular response profile may be increased to counter the effect of off-axis light being focused at a location spaced away from the active sensing area of the sensing circuit.

As will be appreciated by those skilled in the art, less diffusant need be added to the second photosensor shown in FIG. 41B than that shown in FIG. 41A based upon the fact that the sensing circuit is positioned further from the lens at a distance less than the focal length of the lens. It will be further appreciated that the optimal amount of diffusant and the optimal positioning of the sensing circuit within the encapsulant will depend upon the particular application in which the photosensor is employed. In general, the appropriate distance between the lens surface and the active sensing area of the sensing circuit should be selected so that the photosensing device exhibits very nearly the desired field of view, and then diffusant may be added to the encapsulant to both mitigate shadowing caused by lens defects and to expand the field of view to the desired value.

Many balances between offsetting effects may be made in the overall design. In one such balance, the sensor may be placed farther from the lens and closer to the focal points generally narrowing the profile in both directions, and a controlled amount of diffusant or surface treatment may be added to then increase diffusion to widen the profiles to the desired degree. This has a particular benefit if imperfections must be tolerated in the lens surface of the sensor. When a lens is used at its focal point, light from a distant point source may be directed to the sensing surface from much of the lens surface. In such a case, even a relatively large blemish on the lens may have only a minor effect on the resulting device performance.

In contrast, if the lens surface was flat rather than curved, nearly parallel rays from a distant point source which strike the sensor would all pass through an area of the surface which was approximately the same size as the active sensing area itself. With an active sensing surface which is only 100 microns in diameter, a spot or blemish on the flat surface of a comparably small size could block or scatter nearly all of the light from the point source effectively creating a blind spot in the field of view of the sensor. With the bi-radial surface, if strong de-focusing is used, the situation may be much closer to the flat surface than to the focused lens example. In such cases, very small imperfections may block or scatter light from a small area source and in some instances create what are effectively blind spots in the field of view of the sensor. Moving the sensor closer to the focal points enlarges the surface area of the lens through which light from a distant small area source is focused onto the sensor and diffusant softens shadows cast by the blemishes. The two effects both serve to reduce the "blind spot" problem, and hence, allow for the use of such a small sensing circuit.

The lens portion 1720 of the encapsulant 1762 blends into the generally cylindrical portion 1713 which encapsulates the part and the top of the lead frame 1712. Lip 1714 may be used for registration of the part in the application. The lead frame 1712 has legs 1780, 1782, and 1784, which serve to support the part and make electrical connections to it. The sensor chip 15 is bonded to leg 1782 by conductive epoxy and lead wires 1723 and 1724 make electrical connections to legs 1780 and 1784, respectively. In applications, the three leads connect the part to an associated electrical circuit.

Figure 42:
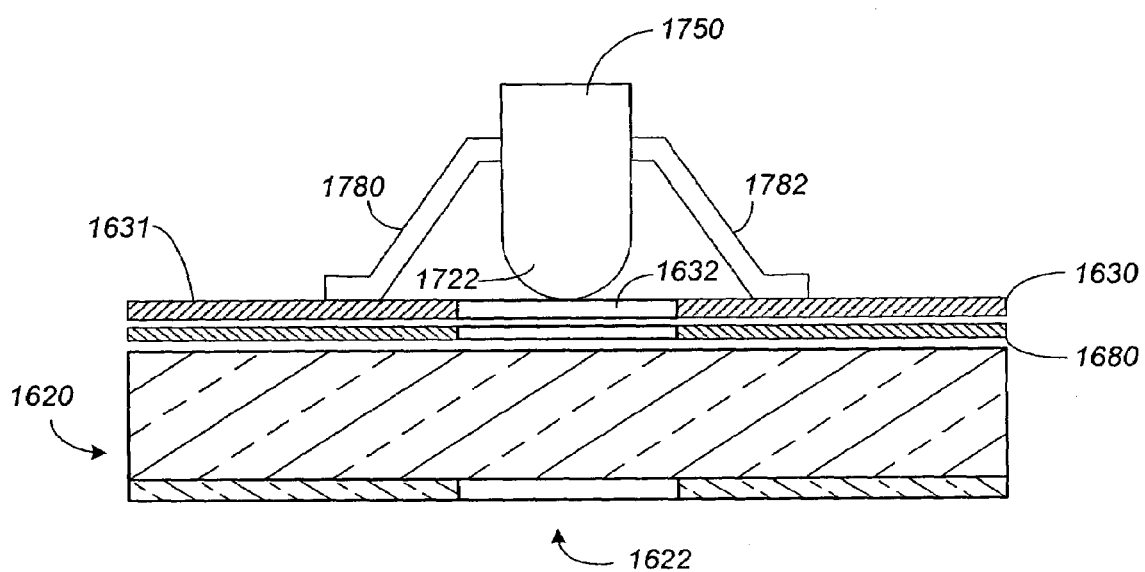
FIG. 42 is a side elevational view of the sensor device shown in FIG. 40 used in a particular implementation as a glare sensor for a rearview assembly.

FIG. 42 shows the sensor device 1750 surface-mounted to the forward facing surface of circuit board 1630 to serve as a glare sensor. As described above, it is desirable to surface-mount the sensor devices rather than using through-hole mounting techniques. It is further desirable to mount the glare and ambient sensors to the same surface of the circuit board. As shown in FIG. 42, sensor device 1750 may be mounted relative to a hole 1632 in circuit board 1630 such that it receives light from the rear of the vehicle through the mirror element 1620. This particular sensor offers the advantage in that the integral lens 1720 is anamorphic and thus a separate secondary optical element may not be beneficial.

Figures 43, 44:
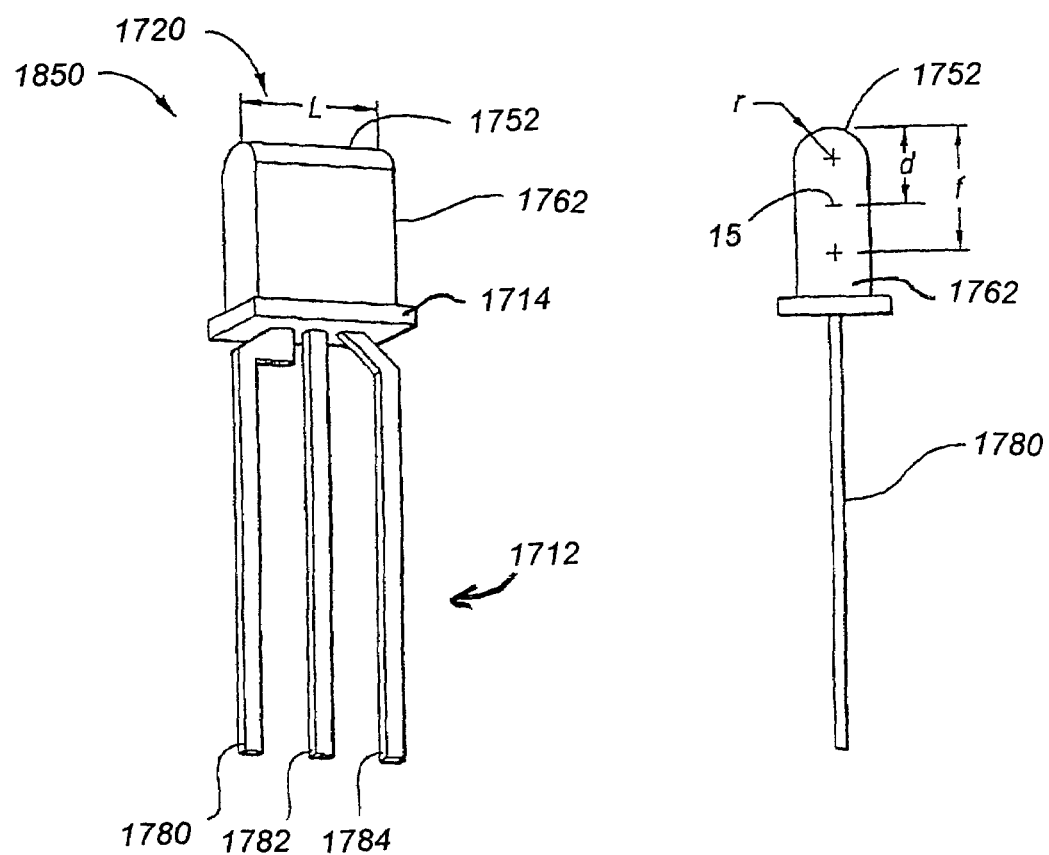
FIG. 43 is a perspective view of a sensor device constructed in accordance with a third embodiment of the present invention.
FIG. 44 is a side elevational view of the sensor device shown in FIG. 43.

FIGS. 43 and 44 illustrate a sensor device 1750 constructed in accordance with a third embodiment of the present invention. As apparent from a comparison of the figures, the third embodiment differs from the second embodiment in that the integral lens 1720 of the encapsulant 1762 has a cylindrical surface 1752 rather than a bi-radial surface. Lens 1720 may have any desired radius and length, and may, for example, have a radius r (FIG. 44) of 1.25 mm and a length L of 5 mm. When mounted in a vehicle with the longitudinal axis of the cylindrical lens 1720 generally normal with the horizon, horizontal compression without corresponding vertical compression is achieved. This permits observance of a wide region of the sky without sensing a correspondingly wide region of the ground, the vehicle roof, or the vehicle hood, when the sensor is used for the sky sensor. Conversely, when mounted horizontally, a wide horizontal view input is achieved. This characteristic can be advantageously used to implement a glare sensor, as described in greater detail below.

Figure 45:
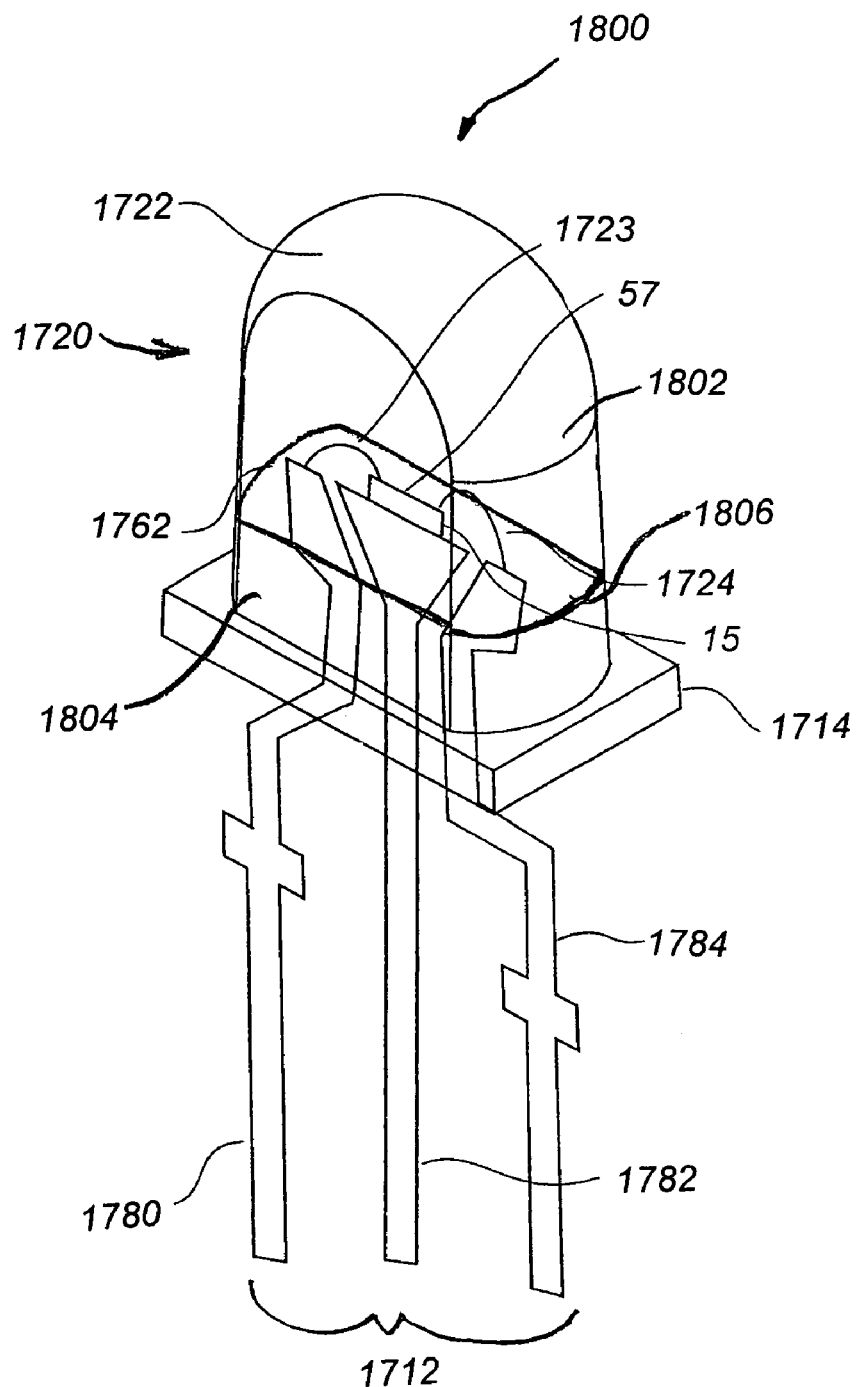
FIG. 45 is a perspective view of a sensor device constructed in accordance with a fourth embodiment of the present invention.

FIG. 45 illustrates a sensor device 1800 constructed in accordance with a fourth embodiment. Sensor device 1800 differs from the first and second embodiments in that the encapsulant is made of two or more different functional zones 1802 and 1804 with a transition region 1806 between zones 1802 and 1804. Two separate functional zones 1802 and 1804 are provided based upon the recognition that different portions of an encapsulant may serve different functions from other portions of the encapsulant such that the first zone 1802 may have at least one different characteristic than the second zone 1804 so as to optimize performance of the function(s) to be performed by that particular zone. For example, first zone 1802 should be at least partially transmissive to the wavelengths of radiation to be sensed by sensing circuit 15, while second zone 1804 need not be transparent to such wavelengths. This allows the sensor device of the present invention to make use of the extraordinary benefits of high performance power semiconductor encapsulation and transfer-molding compounds in the second zone. These characteristics can include a relatively low coefficient of thermal expansion; relatively high thermal conductivity; relatively high $T_g$; relatively high specific heat; relatively low permeability to oxygen, gas, or water vapor; and relatively high physical strength properties. The compounds used for packaging or potting many high-power non-optical electronic devices are superior by a large margin in many of these categories to those traditionally used for conventional sensors. One of the main reasons for the disparity is that the high performance materials under discussion are usually opaque mixtures—not transparent to the band of radiation to be sensed by the sensor device. The opacity of these functionally attractive materials is intrinsically linked to their beneficial properties (by virtue of the performance-enhancing mineral, metal, and metal-oxide fillers, for example), and thus, these materials had not been previously considered for use in sensor components due to their opacity. However, by limiting the use of such materials to a zone of encapsulant 1762 that does not require transparency, the present invention enjoys all the benefits of these material characteristics.

First zone 1802 of encapsulant 1762 is preferably a substantially transparent material to preserve optical performance. First zone 1802 may optionally be partially diffused First zone 1802 may be made of any conventional transparent encapsulant commonly used for sensors or LEDs. First zone 1802 of encapsulant 1762 preferably covers, envelops, protects, and supports sensing circuit 15, the die-attach (if present), and a portion of any wire bonds 1723 and 1724 connected to sensing circuit 15.

First zone 1802 of encapsulant 1762 may be comprised of two or more portions, with the innermost being a silicone or silastic glob-top (not shown) preapplied to sensing circuit 15 prior to the first stage of molding of the encapsulant of the present invention. This innermost portion of first zone 1802 may alternatively be a high performance epoxy, silicone, urethane, or other polymer material possibly including optically translucent or transparent fillers or diffusants.

First zone 1802 of encapsulant 1762 is preferably made of a composition comprising an optical epoxy mixture that is substantially transparent to the radiation sensed by sensing circuit 15. However, other clear materials may also be used, and the materials need not be transparent in bands outside the primary band of sensitivity of the sensing circuit 15.

Second zone 1804 of encapsulant 1762 is preferably made of a material that optimizes the function of that region of encapsulant 1762. As noted above, second zone 1804 need not be transparent. However, a specialized function of zone 1804 is generally to minimize catastrophic failure, stress, and accumulated fatigue from mechanical stresses propagated up electrically conductive leads 1780, 1782, and 1784. Not only may a material that is better suited for this purpose be selected given that it need not be transparent, but also the material may have higher strength properties, including higher tensile and compressional strength, adhesion, and/or cohesion.

Another function served by second zone 1804 of encapsulant 1762 is to serve as a barrier to oxygen, molecular water vapor, or other reagents that may otherwise propagate upward into the device through second zone 1804 or through the interface between encapsulant 1762 and leads 1780, 1782, and 1784. Thus, second zone 1804 should effectively protect sensing circuit 15, the die-attach (if present), wire bonds 1723 and 1724, the encapsulated portions of the lead frame plating, and other internal device constituents from oxygen, molecular water vapor, and other reagents. Because second zone 1804 of encapsulant 1762 need not be transparent, second zone 104 may be constructed with improved barrier properties compared to those present in conventional transparent encapsulants.

Second zone 1804 may also have better thermal characteristics from first zone 1802. To achieve lower device thermal resistance, second zone 1804 preferably has a high thermal conductivity, at least in the critical region of the device surrounding electrical leads 1780, 1782, and 1784 and in thermal coupling to the portion of the leads that supports sensing circuit 15. To preserve relatively high thermal resistance protection from soldering operations, the bottom portion of second zone 1804 of encapsulant 1762 extends no closer to the solderable portion or ends of electrically conductive leads 1780, 1782, and 1784 than the standoffs (if present) or an equivalent point on the leads destined to remain substantially out of contact with molten solder during processing if standoffs are not present.

By forming second zone 1804 of encapsulant 1762 to have a high heat capacity, second zone 104 will help suppress transient temperature spikes during processing or operation. Also, by configuring second zone 1804 to have a low coefficient of thermal expansion, catastrophic failure, stress, and accumulated fatigue from thermal expansion and contraction within the device are minimized.

To achieve different functional characteristics for the first and second zones 1802 and 1804 of encapsulant 1762, the two zones may have different physical properties. Such physical properties may be structural or compositional. Such different structural characteristics may be obtained using the same general composition for both first and second zones 1802 and 1804 but by causing a change in grain size or micro-structural orientation within the two zones. Such structural characteristics may be modified during the molding process by treating the zones differently by annealing, radiation curing, or other radiation treatment Further, the micro-structural orientation may be changed by applying a magnetic field to one or more of the zones forming encapsulant 1762.

In the event two different compositions are utilized to form first and second zones 1802 and 1804, it is preferable that the material compositions are compatible for molding in the same mold, as is discussed further below with reference to the inventive process for making a preferred embodiment of the present invention. By integrally molding first and second zones 1802 and 1804, a cohesive bond may be formed at transition 106 between zones 1802 and 1804. Such a cohesive bond is desirable to improve the strength of the encapsulant as a whole and to prevent oxygen, water vapor, or other reagents from reaching sensing circuit 15 via any interface between zones 1804 and 1806 that otherwise may be present. Further, such a cohesive bond provides continuity of the outer surface. It is desirable that the compositions used for first and second zones 1802 and 1804 partially intermix at transition 1806. Transition 1806 may be a fairly narrow cross section of encapsulant 1762 or may be broader and larger if a composition gradient is formed using the compositions of first and second zones 1802 and 1804.

An additional advantage of making second zone 1804 of encapsulant 1762 opaque is that it is less likely that any back-scattering from any light emitting devices mounted in the same housing or to the same circuit board may reach the sensing circuit 15. Such back-scattering may be a problem when a light emitting device is mounted in the same housing as sensing circuit 15, as is often the case when such sensor devices are mounted in an electrochromic rearview mirror assembly for an automobile. The opaque second zone 1804 also serves to absorb light that enters the sensor device encapsulant and yet passes by the sensing circuit toward the circuit board on which the sensor device is mounted. This may be significant when other sensors are utilized in the same housing or on the same circuit board.

The base epoxy used to form second zone 1804 of encapsulant 1762 may be distinct from the clear lens epoxy used to form first zone 1802 not only in composition, but additionally or alternatively distinct in one or more physical properties (spectral transmittance at a wavelength of interest, diffuse scattering properties at one or more wavelengths of interest, microcrystalline structure, strength, thermal conductivity, $CT_E$, $T_g$, etc.). The transition zone 1806 between first zone 1802 and second zone 1804 may occur at a transition boundary zone, which may be narrow (effecting a more abrupt transition in properties) or broad (effecting a more gradual transition or gradient in properties). As discussed above, the distinction between lens epoxy and base epoxy may be compositional and achieved by using two different material mixtures in the manufacturing process. A narrow transition boundary zone 1806 between zones 1802 and 1804 might then be achieved by ensuring two formulations that are substantially immiscible or by slightly or completely precuring one material before the other is added. A broad boundary zone 1806 might be achieved by not precuring the first material completely prior to adding the second material and by ensuring the formulae of the two materials allow some mixing at their boundary.

In the event that a distinction desired between lens epoxy and base epoxy is not primarily a compositional distinction but rather a physical distinction, then alternate means may be used to accomplish this, if the above-noted means is insufficient. For example, material property enhancement to a compositionally identical base epoxy portion may be achieved by post-treating the base epoxy portion after dispensing into the mold. Such post-treatment may be differential heating (such as by having established a temperature gradient in the mold or by using a stratified oven or stratified heated airflow). Such pretreatment may additionally or alternatively be differential irradiation with zonal IR, UV, visible, microwave, X-ray, or other electromagnetic radiation source or by E-beam or other particle beam. Also, certain microstructural effects (grain migration, lamination, orientation, size, agglomeration, etc.) may be affected by exposing all or part of the device materials to electric fields, magnetic fields, centrifugal/centripetal forces or gravity before, during, or after dispensing.

One material suitable for first zone 1802 of encapsulant 17 is HYSOL® OS4000 transparent epoxy available from Dexter Electronic Materials Division. A material suitable for first zone 1802 of encapsulant 1762 is HYSOL® EO0123 casting compound, which is also available from Dexter. Additional details of how such a multi-zone encapsulant may be made are disclosed in commonly assigned U.S. Pat. No. 6,521,916, entitled "RADIATION EMITTER DEVICE HAVING AN ENCAPSULANT WITH DIFFERENT ZONES OF THERMAL CONDUCTIVITY," filed by John K. Roberts et al. on Apr. 13, 2001, which discloses a similar encapsulant, but for use with an LED. The entire disclosure of this patent is incorporated herein by reference.

Additional details regarding sensor devices shown in FIGS. 40-45 are disclosed in U.S. Pat. No. 6,679,608, the entire disclosure of which is incorporated herein by reference.

Figure 46:
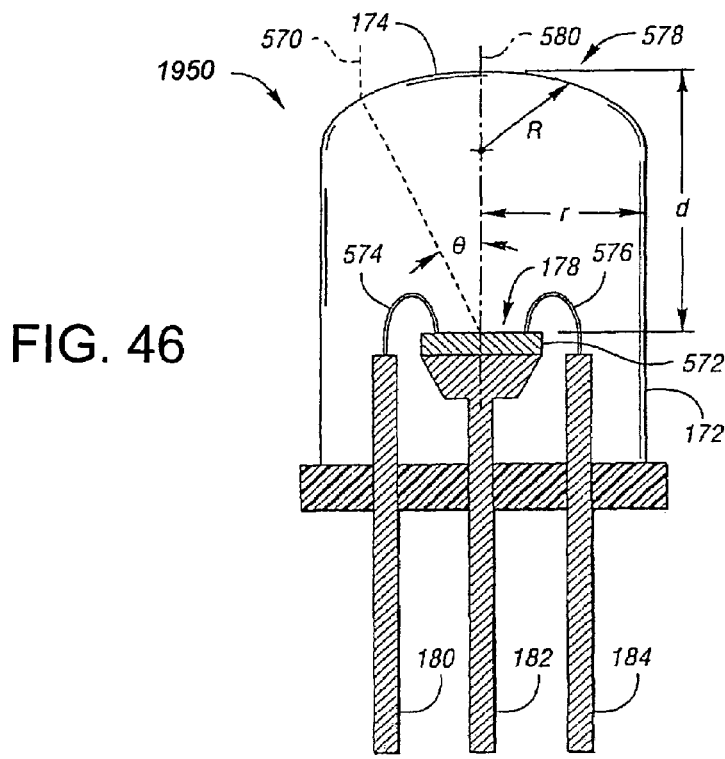
FIG. 46 illustrates an enclosure for a light sensor.

FIG. 46 shows a drawing illustrating a light sensor device 1950 constructed in accordance with a fifth embodiment of the present invention. Light sensor device 1950 includes an enclosure 172 having window 174 for admitting light, one ray of which is indicated by 570. Enclosure 172 admits power pin 180, ground pin 182, and signal pin 184. Semiconductor die 572, contained within enclosure 172, incorporates light transducers 178, 216 and associated electronics as described above. Pins 180, 182, 184 may be wire bonded to die 572, as shown by wire 574 for power pin 180 and wire 576 for signal pin 184, or may be directly bonded to die 572, as shown for ground pin 182.

Enclosure 172 may be an encapsulant of the same type used to construct three-terminal light emitting diodes (LEDs). A preferred format is commonly referred to as the T-1¾ or 5 mm package. Encapsulating electronics in such packages is well known in the art of optical electronics manufacturing.

A lens, shown generally by 578, is preferably used to focus light onto exposed light transducer 178. Lens 578 may be provided by a separate discrete lens positioned between sensing circuit 15 and the source of light rays 570, or the lens may be integral with the encapsulant 172 as shown in FIGS. 40-46. In either case, lens 578 defines the field of view of sensing circuit 15 and provides improved sensitivity through optical gain. The lens can define the sensor field to have a narrow or wide angle.

Figure 47:
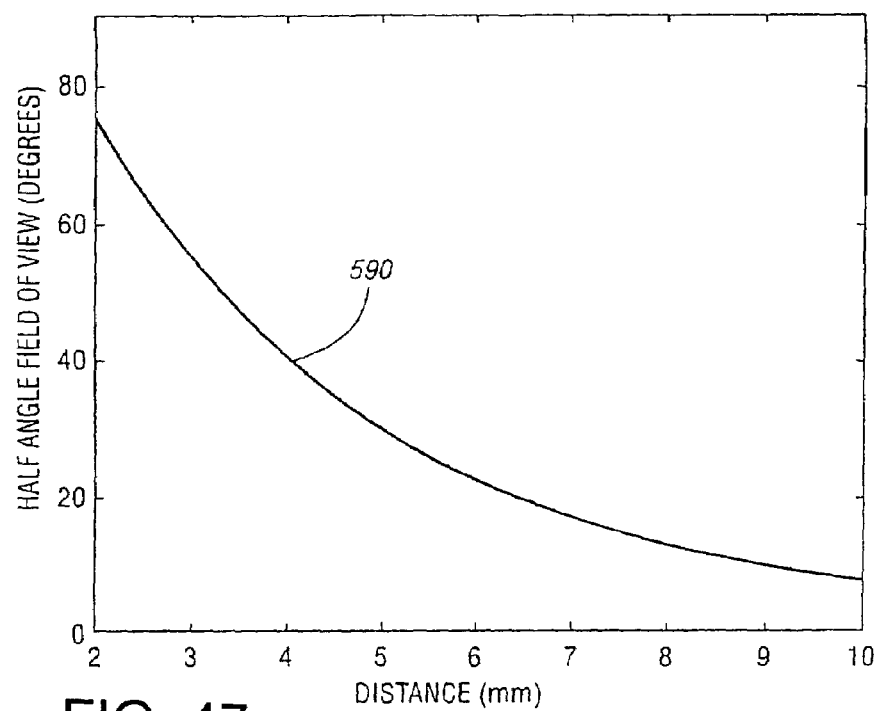
FIG. 47 illustrates a light sensor field of view as a function of light transducer distance from the lens.

Referring now to FIG. 47, a graph illustrating the light sensor field of view as a function of light transducer distance from the lens is shown. The field of view for exposed light transducer 178 in sensing circuit 15 is defined as view angle θ made by marginal ray 570 with respect to optical axis 580 through exposed light transducer 178. The half-angle field of view for spherical lens 578 is expressed by Equation 1:

$$\theta = 90 - \arccos\{r/R\} + n_2/n_1 * \sin\{\arccos\{r/R\} - \arctan\{(d-(R-(R^2-r^2)^{1/2}))/r\}\}$$

where r is the lens aperture radius, R is the radius of curvature of lens 578, $n_2$ is the index of refraction of material within enclosure 172, $n_1$ is the index of refraction outside of enclosure 172, d is the distance from the center of lens 578 to exposed light transducer 178, and θ is measured in degrees. Typically, T-1¾ enclosure 172 is filled with epoxy and sensor circuit 15 operates in air making the ratio of $n_2$ to $n_1$ approximately 1.5. Curve 590 plots half angle field of view θ as a function of distance d for a T-1¾ enclosure having a spherical lens 578 with radius R of 5.0 mm. As light transducer 178 moves farther from lens 578, the field of view decreases.

Figure 48:
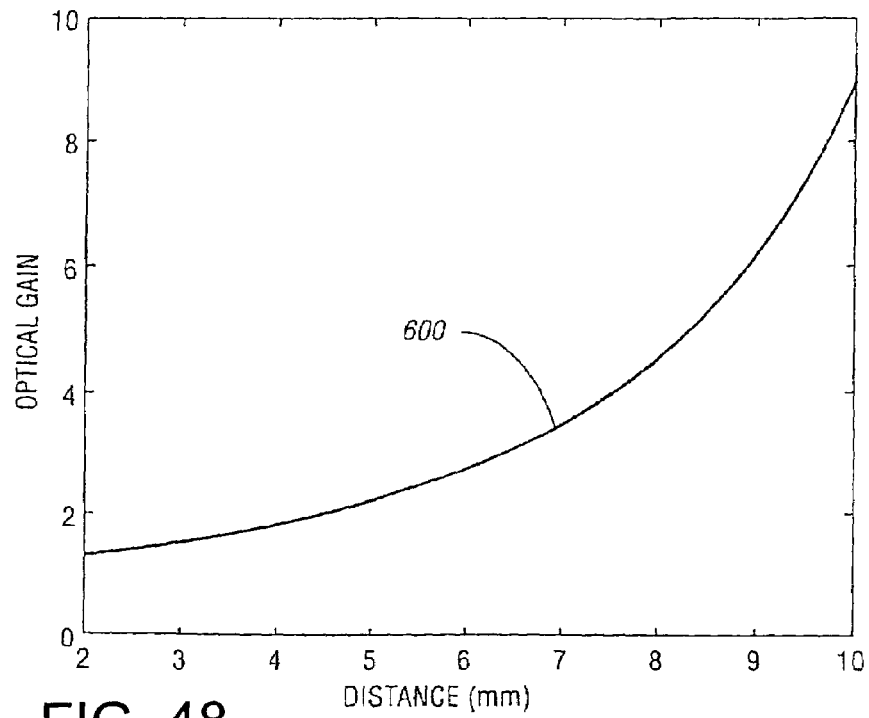
FIG. 48 is a graph illustrating light sensor optical gain as a function of light transducer distance from the lens.

Referring now to FIG. 48, a graph illustrating light sensor optical gain as a function of light transducer distance from the lens is shown. Assuming paraxial approximation for rays 570, the optical gain of lens 578 can be estimated by considering the ratio of additional optical energy collected by light transducer 178 with lens 578 to the optical energy collected by light transducer 178 without lens 578. This can be computed by considering a cone of light with a base at the surface of lens 578 and a point at the focal point f of lens 578. The optical gain G may then be expressed as a function of the ratio of the cross section of the cone to the area of light transducer 178 which reduces to Equation 2:

$$G = f^2/(f-d)^2$$

Curve 600 shows optical gain G as a function of distance d for a T-1¾ enclosure having a spherical lens 578 with radius R of 5.0 mm and a focal length f of 15.0 mm. As light transducer 178 moves farther from lens 578, the optical gain increases.

For use in automatically dimming rearview mirrors, the distance d between lens 578 and light transducer 178 can be adjusted for optimal performance for use as a forward facing ambient light sensor and as a rearward facing glare sensor 62. As described further below, a forward ambient light sensor should have a wide field of view but need not be as sensitive as a glare sensor. A glare sensor should have a narrower field of view but must be more sensitive and, therefore, benefits from a higher optical gain. For the lens described above, a distance d of between 2 mm and 3 mm is suitable for forward ambient light sensor 58 and a distance d of between 6 mm and 7 mm is suitable for a glare sensor. In addition to modifying lens parameters, other lens types such as aspheric, cylindrical, and the like are possible within the spirit and scope of the present invention.

Figure 49:
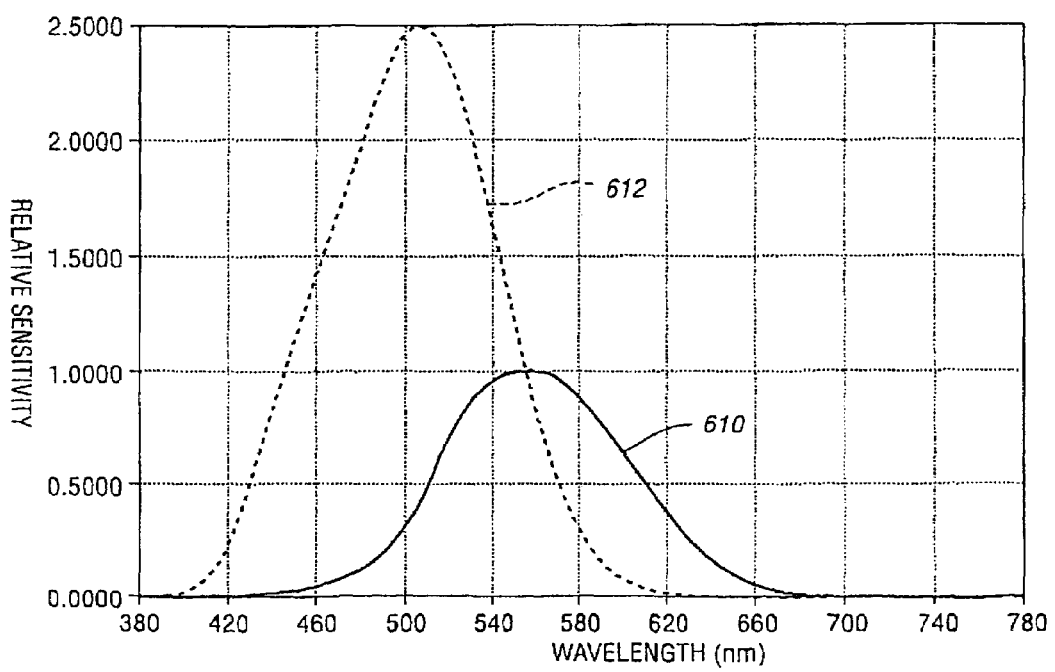
FIG. 49 is a graph illustrating frequency responses of the human eye.

Referring now to FIG. 49, a graph illustrating frequency response of the human eye is shown. Curve 610 represents the relative photopic or daylight frequency response of the human eye. Curve 612 represents the relative scotopic or night frequency response of the human eye. In addition to being more sensitive to light intensity, scotopic response 612 is shifted more towards violet than photopic response 610.

Figure 50:
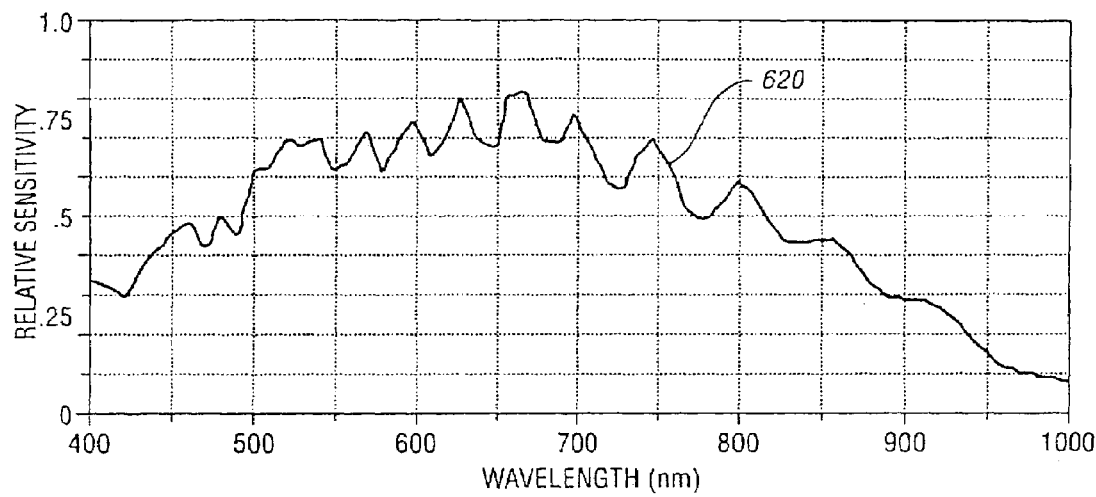
FIG. 50 is a graph illustrating frequency response of a typical light transducer.

Referring now to FIG. 50, a graph illustrating frequency response of a typical light transducer is shown. The relative frequency response of a typical photodiode light transducer 178 is shown as curve 620. When compared to photopic response curve 610 or scotopic response curve 612, the frequency response of exposed light transducer 178 contains significantly more infrared sensitivity. Depending upon the application, a filter may be placed before or incorporated into the sensor device so that the output of exposed light transducer 178 more closely resembles a desired frequency response. The type of filtration required for the light sensor device will depend on the application in which the sensor is used.

Figure 51:
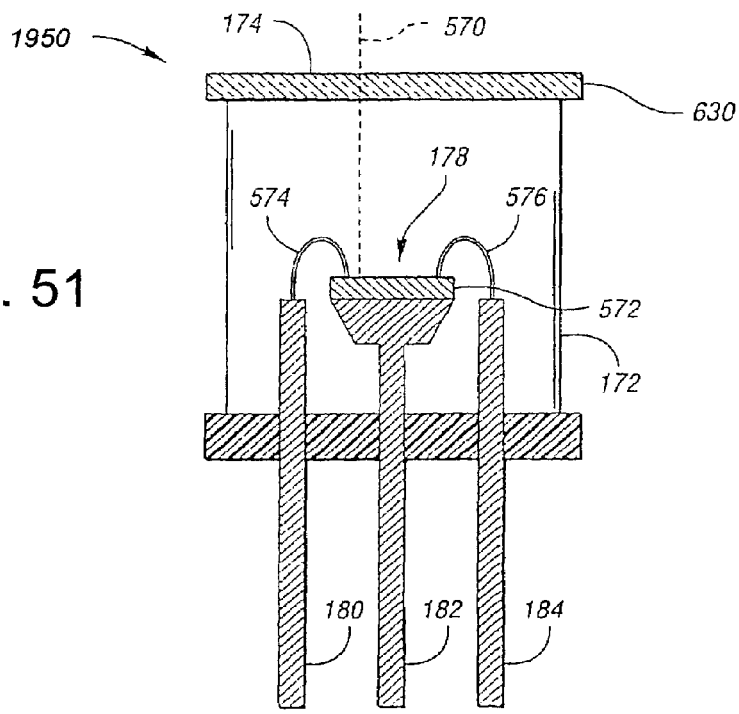
FIG. 51 is a drawing of an enclosure incorporating an infrared filter.

Referring now to FIG. 51, a light sensor package 1950 wherein the enclosure incorporates a filter is shown. Window 174 in enclosure 172 includes filter 630 operative to attenuate some components of light rays 570 striking exposed light transducer 178. For example, filter 630 may be an infrared filter such as a hot mirror commercially available from Optical Coating Laboratories, Inc. of Santa Rosa, Calif. A lens (not shown) may be placed in front of infrared filter 630 to control the image focused on the transducer. Other examples of filters are described in U.S. Pat. No. 4,799,768 to Gahan and U.S. Pat. No. 5,036,437 to Macks.

It is envisioned that the filter 630 could be provided for the sensor device using other constructions. For example, a separate filter (not shown) can be mounted in a common housing with the sensor device at a position in front of the light sensor device. For example, thin glass bandpass filters, such as the BG28 or BG18 filters commercially available from Schott Glass Technologies, Inc. of Duryea, Pa., could be employed. These filters reduce the infrared sensitivity of sensing circuit 15. In yet another embodiment, the spectral characteristics of sensor circuit 15 may be modified by material embedded into enclosure 172, or a thin appliqué attached to the surface of the sensor encapsulant using an adhesive, or by directly depositing a filter onto semiconductor die 572.

The shielded light transducer 216 described above with respect to FIG. 10 may be shielded over the entire optical spectrum by an opaque shield or shielded over a portion of the optical spectrum using a filter. The shield or filter may be integrated into the sensor package. If a filter is utilized, it may be desirable to use a filter that separates infrared (IR) radiation from visible radiation by either blocking all IR radiation to which the shielded light transducer may otherwise be exposed, or passing only IR radiation. If a filter is used that blocks IR radiation, the output of the shielded transducer may be used as a more accurate measure of the light levels to which the driver's eyes would be sensitive. If a filter is used that passes only IR radiation, the output of the shielded light transducer 216 may be subtracted from the other light transducer 178 to yield an output more closely matched to response characteristics of the human eye. The latter approach is more cost effective as filters that pass IR radiation are less costly to construct than filters that block IR radiation.

Figure 52A:
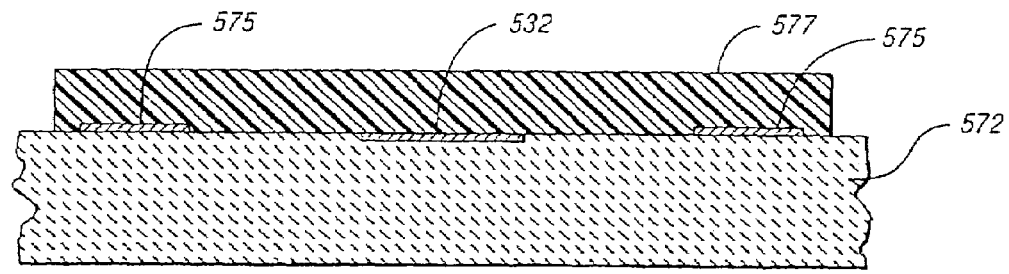
FIGS. 52A-52D illustrate a side view of the light sensor die at four stages during the direct depositing of a film on a sensor transducer.
Figure 52B:
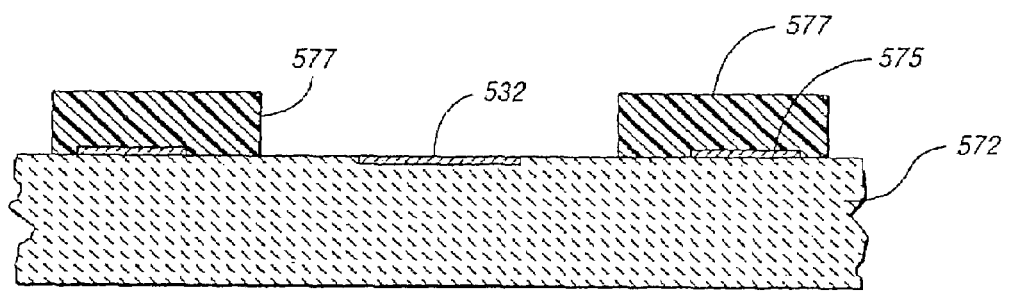
Figure 52C:
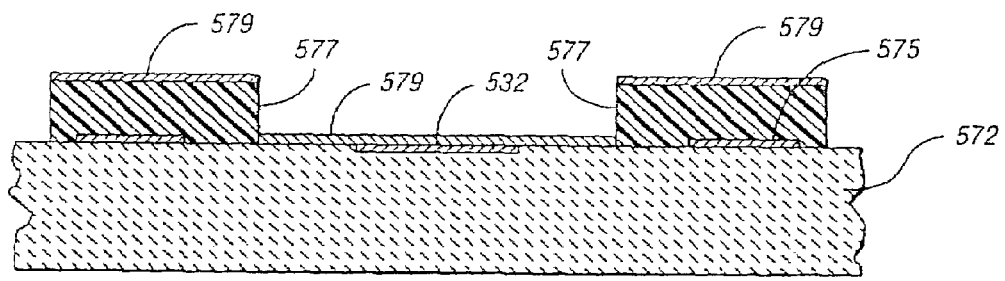
Figure 52D:
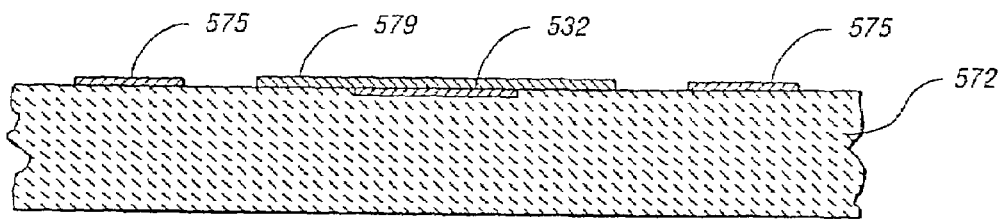

A method by which an interference filter can be directly deposited onto a semiconductor sensing circuit 15 will now be described with respect to FIGS. 52A through 52D. In the first step, a photoresist is deposited over the entire wafer. The photoresist may be any suitable commercially available photoresist material. The photoresist is then patterned to cover only those areas on the surface of the wafer requiring protection from the optical coating deposition such as the bonding pad, as shown in FIG. 52B. The optical film coating 579 is then applied to the surface of the die 572 as shown in FIG. 52C. The thin film 579 is deposited directly on the light sensor in multiple layers. The first layer of the interference filter can be a silicon layer 50 to 80 nm thick, and preferably 65 nm thick. The second layer of the interference filter is a layer of silicon dioxide, 100 to 200 nm thick, and preferably 145 nm thick. The third layer of the interference filter is a silicon layer 50 to 80 nm thick, and preferably 60 nm thick. The fourth layer of the interference filter is a layer of silicon dioxide 100 to 200 nm thick, and preferably 140 nm thick. The fifth layer of the interference filter is a thick layer of silicon dioxide to provide protection, and may be 200 to 500 nm thick. After all five layers are deposited, the photoresist is lifted off using a conventional lift-off process, leaving the film deposited over the light sensitive region, but not over the bonding pads, as shown in FIG. 52D. The resulting die can be encapsulated to provide conventional packaging, such as the T 1¾ package of FIGS. 40-46. The interference filter described above will filter light above 650 nm. Other materials could be applied in a similar manner to provide other filter characteristics.

Figure 53:
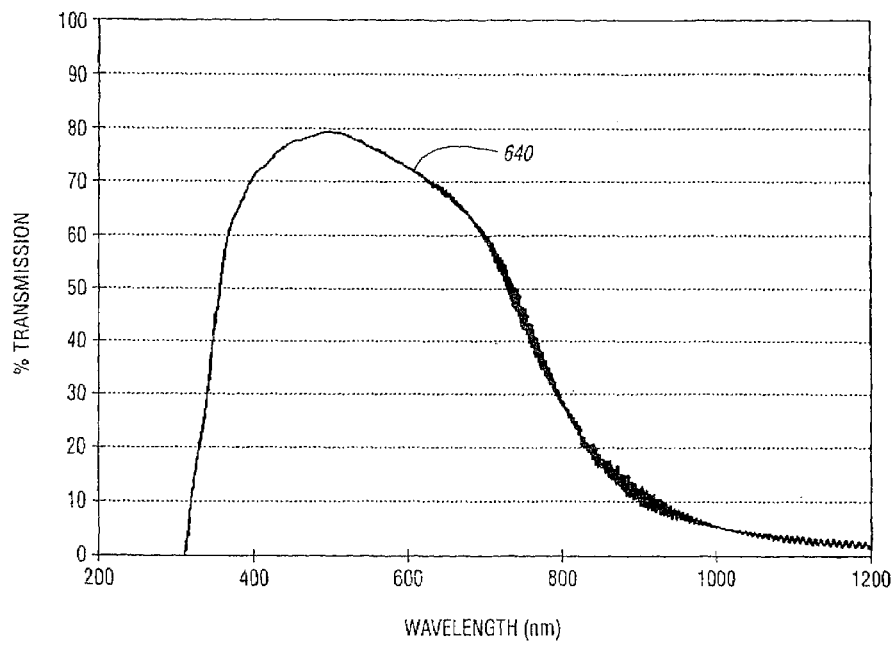
FIG. 53 is a graph of the frequency response of a window film that may be used to implement a light sensor filter.
Figure 54:
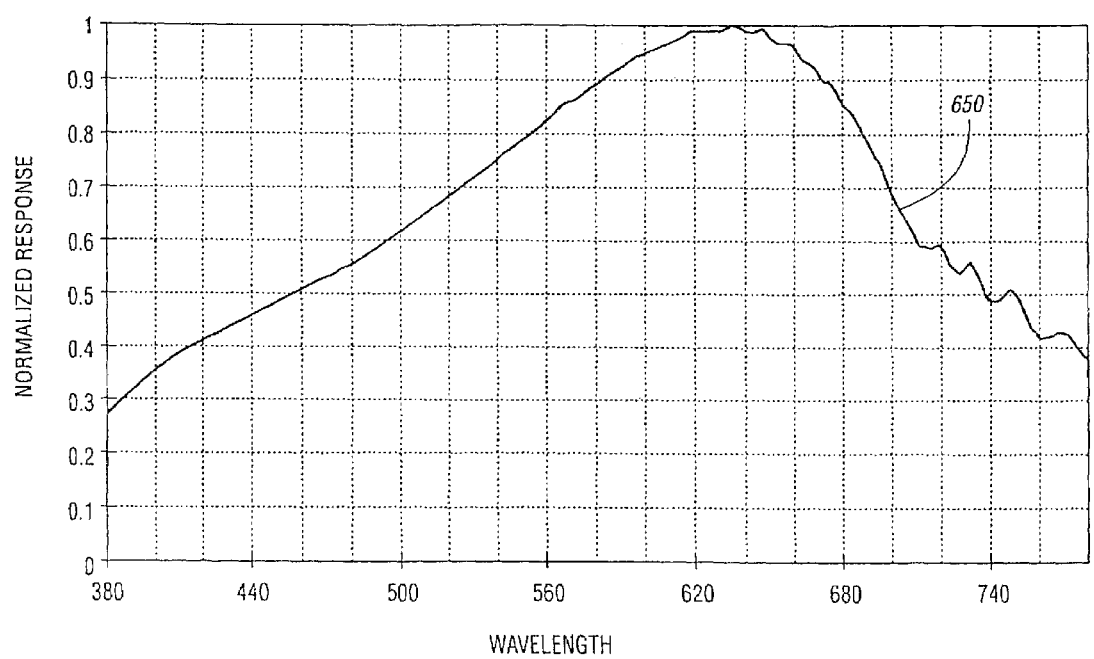
FIG. 54 is a graph of the frequency response of a light sensor incorporating the window film with the frequency response shown in FIG. 53.

Referring now to FIG. 53, a graph of the frequency response of a window film that may be applied to the light sensor filter is shown. A film with desired frequency characteristics such as, for example, XIR-70 from Southwall Technologies of Palo Alto, Calif., may be placed onto the window of the light sensor device. The spectrum of such a film is shown by curve 640. An adhesive such as, for example, 9500 PC from 3M Corporation of Minnesota, is affixed to the film. This adhesive film may then be attached to the surface of sensor circuit 15. Referring now to FIG. 54, curve 650 illustrates the response of sensor circuit 15 onto which has been placed an adhesive film having the frequency response shown by curve 640 in FIG. 53.

Figure 55:
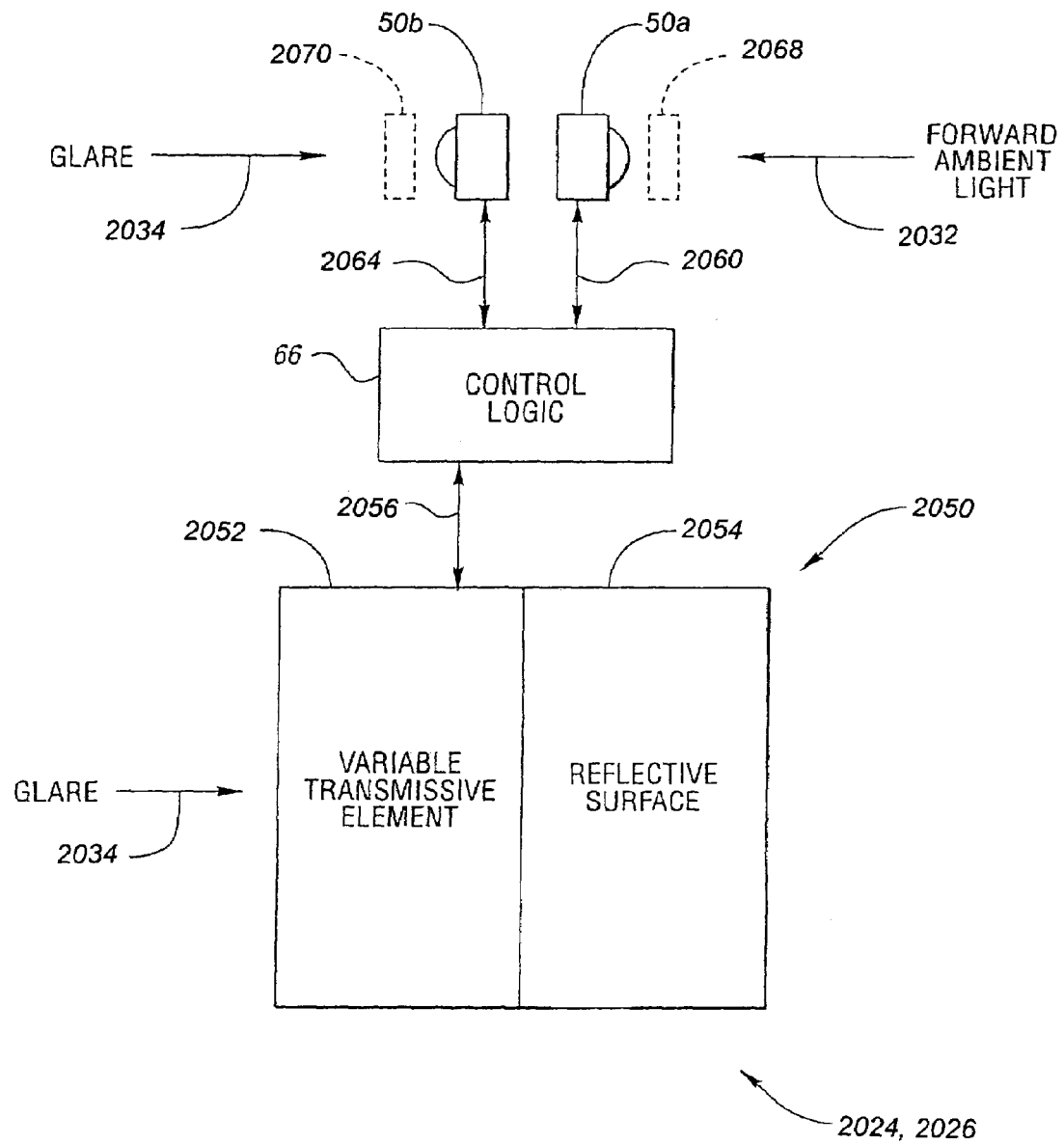
FIG. 55 is a block diagram illustrating circuitry for an automatically dimmed rearview mirror.

Having described the sensor devices in detail as well as various physical constructions for mounting the sensors in rearview assemblies, an electrical system for an electrochromic mirror system employing the sensor devices will now be described in greater detail through some specific examples. Referring first to FIG. 55, an automatically dimmed rearview mirror 2024, 2026 is shown that employs a light sensor. A dimming element, shown generally by 2050, includes variable transmittance element 2052 and reflective surface 2054. Dimming element 2050 is constructed such that reflective surface 2054 is viewed through variable transmittance element 2052. Dimming element 2050 exhibits variable reflectance of light in response to dimming element control signal 2056. Forward ambient light sensor 50a is positioned to receive forward ambient light 2032 from generally in front of the vehicle. Forward ambient light sensor 50a produces discrete ambient light signal 2060 indicating the amount of forward ambient light 2032 incident on forward ambient light sensor 50a over an ambient light integration period. Ambient light can be measured using the cyclical, varying integration periods shown in FIG. 7. Glare sensor 50b is positioned to detect glare 2034 from generally behind the vehicle and may optionally be placed to view glare 2034 through variable transmittance element 2052. Glare sensor 50b produces discrete glare signal 2064 indicating the amount of glare 2034 incident on glare sensor 2062 over a glare integration period. Control logic 66 receives ambient light signal 2060 and determines an ambient light level. Control logic 66 determines the glare integration period based on the level of forward ambient light 2032. Control logic 66 receives glare signal 2064 and determines the level of glare 2034. Control logic 66 outputs dimming element control signal 2056, setting the reflectance of dimming element 2050 to reduce the effects of glare 2034 perceived by the vehicle operator.

Either one of glare sensor 50b and forward ambient light sensor 50a or preferably both sensors are implemented using a semiconductor light sensor with variable sensitivity. Such sensors include light transducers that convert incident light into charge as described herein above. This charge is collected over an integration period to produce a potential that is converted by sensor 50a, 50b into a discrete digital output that does not require analog-to-digital conversion prior to digital processing in control logic 66. Eliminating the ADC conversion reduces the cost of the microprocessor. As can be seen from FIG. 11, the light-to-pulse converter introduces a delay. The delay is the time difference between the sample period and the beginning of the measurement period 420. This delay can be avoided using the analog circuit of FIG. 12A. However, the use of the analog circuit increases in two ways. First, the number of wires in bus 164 may be doubled as a first wire will be used for the integration period input signal and a second wire will be used as the analog output signal from differential amplifier 321. Secondly, the control logic will require an ADC to convert this analog signal to a digital signal usable by the digital control logic. Regardless of whether a digital or analog signal is generated, as mentioned above, one difficulty with silicon-based sensors is the difference in spectral sensitivity between silicon and the human eye. Accordingly, light filter 2068 may be placed before or incorporated within ambient light sensor 50a. Similarly, glare filter 2070 may be placed before or incorporated within glare sensor 50b.

Filters 2068, 2070 attenuate certain portions of the spectrum that may include visible light, infrared, and ultraviolet radiation such that light striking sensors 50a, 50b combines with the frequency response of light transducers within sensors 50a, 50b to more closely approximate the response of the human eye and to compensate for tinting in vehicle windows such as the windshield. For an automatically dimming rearview mirror, an important goal is to decrease the glare experienced by the vehicle operator in low light conditions. In order to preserve night vision, which degrades rapidly when exposed to bright light, particularly in the range of scotopic curve 612, exposed light transducer 50a, 50b should have a frequency response similar to scotopic curve 612 such that the mirror attenuates light that would otherwise negatively impact the night vision of the vehicle operator. If this filter is not used, exposed light transducer 50a, 50b should at least have an attenuated infrared response. This is increasingly more important as high intensity discharge (HID) headlamps, which emit more bluish light than do incandescent or halogen lamps, gain in popularity. Accordingly, the filters 2068 and 2070 preferably provide a filter characteristic similar to scotopic curve 612.

Variable transmittance element 2052 may be implemented using a variety of devices, as mentioned above. Dimming may be accomplished mechanically, using liquid crystal cells, suspended particle devices, or advantageously using an electrochromic cell that varies transmittance in response to an applied control voltage. As will be recognized by one of ordinary skill in the art, the present invention does not depend on the type or construction of dimming element 2050. If dimming element 2050 includes an electrochromic element as the variable transmittance element 2052, reflective surface 2054 may be either incorporated into or external to variable transmittance element 2052. Alternatively, variable transmissive element 2052 may be a display having a variable brightness.

Each interior rearview mirror 2024 and exterior rearview mirror 2026 must include dimming element 2050 for automatic dimming. Preferably, interior rearview mirror 2024 also includes control logic 66, light sensors 50a, 50b, and, if used, filters 2068 and 2070.

Figure 56:
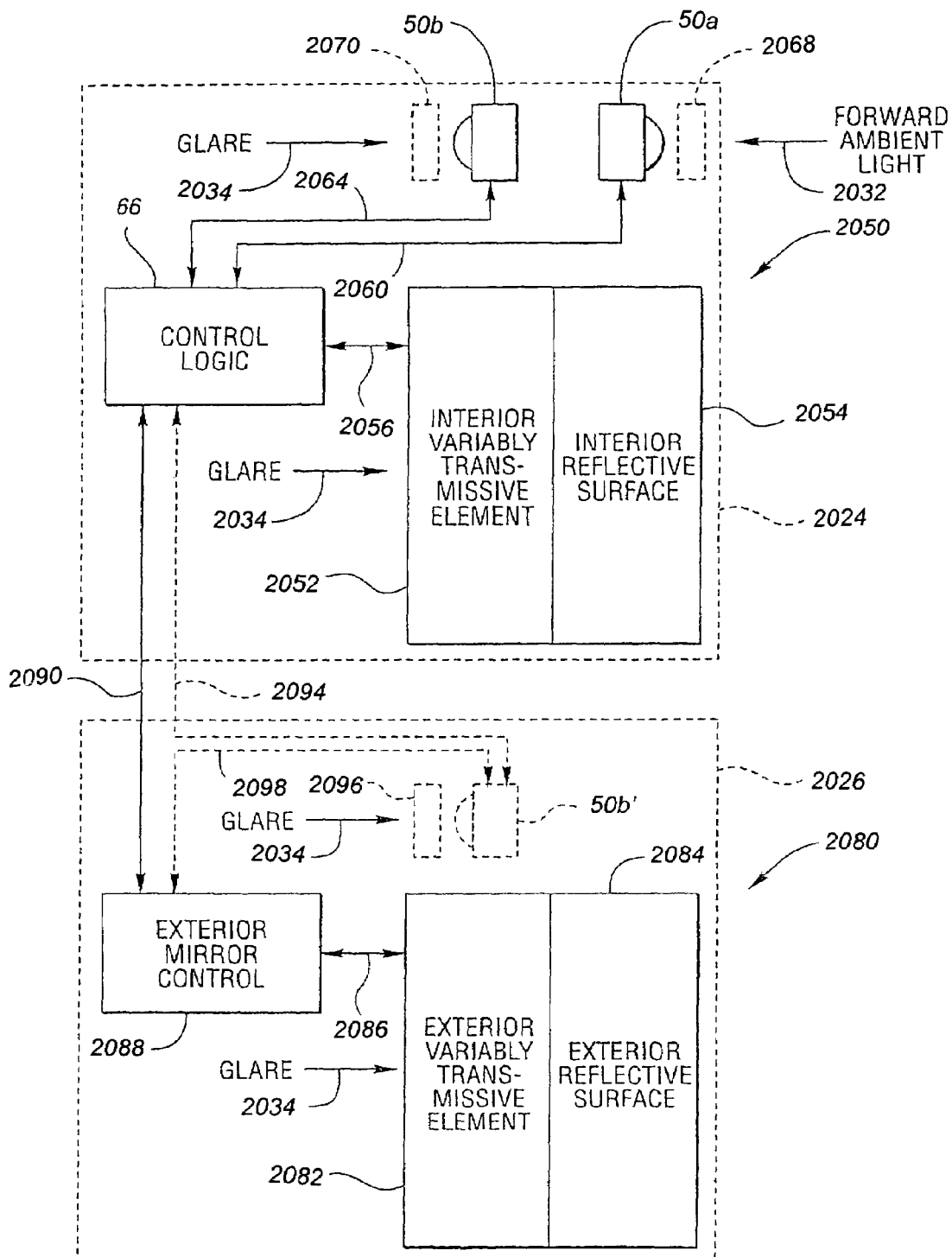
FIG. 56 is a block diagram illustrating a rearview mirror system with interior and exterior rearview mirrors.

Referring now to FIG. 56, a block diagram of a rearview mirror system with interior and exterior rearview mirrors according to embodiments of the present invention is shown. Dimming element 2050 in interior rearview mirror 2024 operates as described above. Each exterior rearview mirror 2026 includes exterior dimming element 2080 having exterior variable transmittance element 2082 operative to attenuate light from a rearward scene both prior to and after reflecting from exterior reflective surface 2084. Exterior dimming element 2080 provides variable reflectance based on exterior dimming element control signal 2086. Exterior dimming element 2080 may operate in any manner described with regard to dimming element 2050 and, preferably, is an electrochromic mirror. Exterior mirror control 2088 generates exterior dimming element control signal 2086. Exterior mirror control 2088 may be part of exterior rearview mirror 2026, interior rearview mirror 2024, or may be located outside of any mirror 2024, 2026. Various embodiments for controlling exterior dimming element 2080 depend on the amount of sensing and control to be included within exterior rearview mirror 2026.

In one embodiment, control logic 66 in interior rearview mirror 2024 determines exterior dimming element control signal 2086 based on output from forward ambient light sensor 50a and glare sensor 50b. Exterior dimming element control signal 2086 may be generated directly by control logic 66 or exterior mirror control 2088 may generate exterior dimming element control signal 2086 based on a reflectance level calculated in control logic 66 and transmitted to exterior mirror control 2088 through inter-mirror signal 2090.

In another embodiment, exterior rearview mirror 2026 includes exterior glare sensor 50b' positioned to receive glare 2034 from the rearward scene and operative to output exterior glare signal 2094 based on the amount of glare 2034 incident on glare sensor 50b' over a glare integration period. Control logic 66 uses exterior glare signal 2094 and ambient light signal 2060 to determine the reflectance level for exterior dimming element 2080. Again, exterior dimming element control signal 2086 may be generated directly by control logic 66 or may be developed by exterior mirror control 2088 based on the reflectance level contained in inter-mirror signal 2090. Exterior glare filter 2096, similar to glare filter 2070, may be placed before exterior glare sensor 50b' or built into exterior glare sensor 2092 to provide exterior glare sensor 50b' with a response closer to the response of the human eye. Inter-mirror signal 2090 and exterior glare signal 2094 may be in the form of a pulse width modulated signal, pulse density signal, serial data stream, or digitized and communicated over an automotive bus such as the CAN bus.

In still another embodiment, exterior glare sensor 50b' produces exterior glare signal 2098 routed directly to exterior mirror control 2088. Exterior mirror control 2088 determines exterior dimming element control signal 2086 based on exterior glare signal 2098 and the level of forward ambient light 2032 determined by control logic 66 and sent to exterior mirror control 2088 through inter-mirror signal 2090.

In yet another embodiment, exterior rearview mirror 2026 determines reflectance for exterior dimming element 2080 independent of glare 2034 or forward ambient light 2032 sensed by interior rearview mirror 2024. In this embodiment, exterior rearview mirror 2026 operates as described above with respect to interior rearview mirror 2024.

Figure 57:
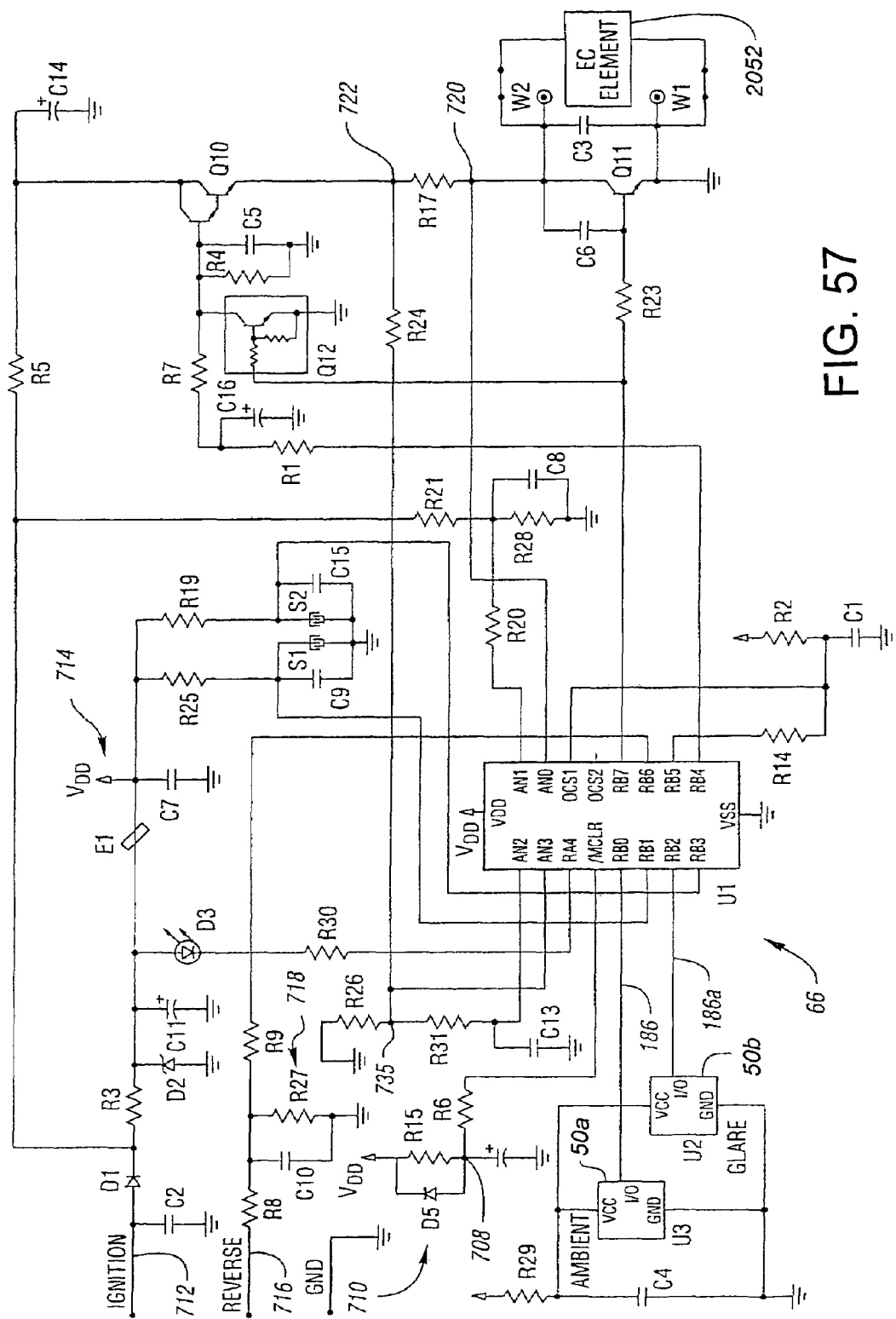
FIG. 57 is a schematic diagram illustrating an embodiment of control logic for an automatically dimming interior rearview mirror.

Referring now to FIG. 57, a schematic diagram illustrating an embodiment of control logic for an automatically dimming interior rearview mirror is shown. The circuit represents an effective yet inexpensive implementation for automatically dimming interior rearview mirror 2024. Similar logic may be used to implement automatically dimming exterior mirror control, headlamp control, moisture detection and moisture removal control, electric window control, heating and cooling control, and the like. Control logic 66 utilizes a small, low cost microcontroller, indicated by U1, such as the PIC16C620A from Microchip Technology, Inc. of Chandler, Ariz. Forward ambient light sensor 50a communicates with microcontroller U1 through interconnection signal 186 connected to microcontroller input RB0. Similarly, glare sensor 50b communicates with microcontroller U1 through separate interconnection signal 186a connected to microcontroller input RB2. As described above, each interconnection signal 186 carries integration period 158 from microcontroller U1 to light sensor 50a, 50b as well as light intensity period 240 from light sensor 50a, 50b to microcontroller U1. Resistor R29 and capacitor C4, which are connected between $V_{DD}$ and ground, provide filtered power for light sensors 50a, 50b.

Parallel resistor R15 and diode D5 are connected between $V_{DD}$ and node 708. Capacitor C12 is connected between node 708 and ground. Resistor R6 connects common node 708 to input/MCLR of microcontroller U1. Components D5, R15, R6, and C12 form a power-on reset circuit shown generally by 710. Power is supplied to control logic 66 through ignition line 712. Diode D1 protects from reversed polarity on ignition line 712 and diode D2 clamps the voltage derived from ignition line 712 to approximately 5 volts. Capacitors C2, C7 and C11, resistor R3, and ferrite element E1 form a power conditioning circuit shown generally by 714. Reverse line 716 is asserted when the vehicle is placed into reverse. Capacitor C10 and resistors R8, R9, and R27 form a reverse signal conditioning circuit, shown generally by 718. Reverse signal conditioning circuit 718 low pass filters reverse line 716 and provides electrostatic discharge protection for digital input pin RB6 on microcontroller U1. Microcontroller U1 uses the signal on reverse line 716 to clear variable transmittance element 2052 whenever the vehicle is placed in reverse. Microcontroller U1 is clocked by an RC oscillator formed by resistor R2 connected between the OSC1 pin and $V_{DD}$ and capacitor C1 connected between the OSC1 pin and ground. Resistor R30 and LED D3 connected in series between $V_{DD}$ and open drain output RA4 of microcontroller U1 form an indicator lamp that may be mounted on interior rearview mirror 2024 to alert the vehicle operator of the operating state of control logic 66. Switches S1 and S2 are connected to digital inputs RB1 and RB3, respectively, of microcontroller U1 to permit selecting control options.

Figure 58:
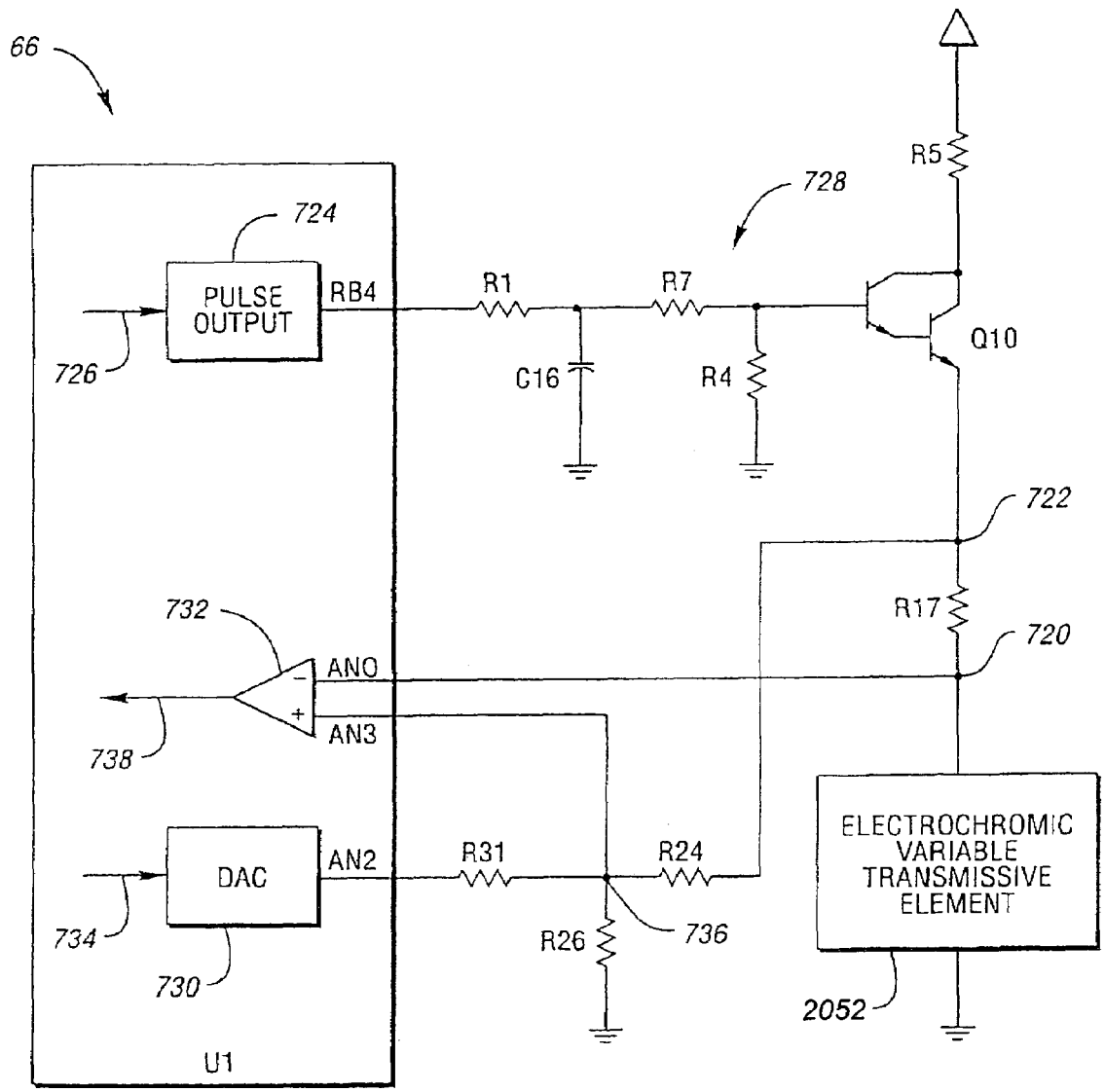
FIG. 58 is a schematic diagram illustrating operation of electrochromic element transmittance control.

Referring now to FIG. 58, a schematic diagram illustrating operation of electrochromic dimmer control is shown. A portion of control logic 66 has been redrawn to more clearly illustrate control of electrochromic variable transmittance element 2052. Electrochromic variable transmittance element 2052 can be implemented using any suitable variable reflectance device, and may, for example, comprise the electrochromic element described in U.S. Pat. No. 4,902,108 entitled "SINGLE-COMPARTMENT, SELF-ERASING, SOLUTION-PHASE ELECTROCHROMIC DEVICES, SOLUTIONS FOR USE THEREIN, AND USES THEREOF" issued to Byker. Electrochromic variable transmittance element 2052 darkens in response to a control voltage applied at input node 720. If the applied control voltage is removed, electrochromic variable transmittance element 2052 will self discharge, passing an increasing amount of light. Electrochromic variable transmittance element 2052 may be rapidly cleared by shorting input node 720 to ground.

Resistor R17 connects input node 720 to the emitter of Darlington pair Q10 at node 722. The collector of Q10 is connected to a power supply through current limiting resistor R5, which may, for example, have an impedance of 27 Ω. The base of Darlington pair Q10 is connected to digital output RB4 of microcontroller U1 through resistors R1 and R7. The base of Q10 is also connected to ground through resistor R4 and through resistor R7 and capacitor C16. Digital output pin RB4 is driven by pulse output 724 in response to pulse control 726 generated by software running on microcontroller U1. Pulse output 724 may produce a pulse signal such as, for example, a pulse width modulated signal. Preferably, pulse output 724 functions as a switch, setting output pin RB4 to either a high voltage or a low voltage once during each transition period as described below. Capacitor C16 and resistors R1, R4, and R7 form a low pass filter, shown generally by 728, to smooth the signal appearing on digital output RB4. This smoothing results in a substantially constant applied control voltage at input node 720 for a fixed desired control level. Additionally, the base-to-emitter diode drops in Q10 together with the voltage divider formed between resistor R4 and the sum of resistors R1 and R7 sets the operating voltage for electrochromic variable transmittance element 2052. Typical values for components are 1 kΩ for R1 and R4, 100 Ω for R7, and 100 µF for C16. With digital output RB4 at 5 volts and nominal current draw by electrochromic variable transmittance element 2052, input node 720 is approximately 1.2 volts.

The performance of control logic 66 can be improved through feedback of the control voltage applied to electrochromic variable transmittance element 2052 taken at input node 720. Microcontroller U1 includes comparison logic to cause pulse output 724 to deliver a low voltage if the applied control voltage is greater than the desired control level and to deliver a high voltage otherwise. Typically, the high voltage is near VDD and the low voltage is near ground. This comparison may be made by comparing a digital number representing the desired control level with the digitized applied control voltage obtained using an analog-to-digital converter (ADC). Alternately, DAC 730 and comparator 732 are used. DAC 730 produces a desired voltage level on analog output AN2 in response to the desired control level on DAC control 734 supplied by software running on microcontroller U1. Resistor R31 is connected between analog output AN2 and node 736 and resistor R26 is connected between node 736 and ground. One input of comparator 732, at analog input AN3, is connected to node 736. The other input of comparator 732, at analog input AN0, is connected to input node 720. The output of comparator 732 indicates if the desired voltage level is greater than the applied control voltage. Values for resistors R31 and R26 are chosen so that the voltage at node 736 is within the range of expected applied control voltages at input node 720 throughout the range of desired control voltages output from DAC 730. Typical values for R31 and R26 are 390 kΩ and 200 kΩ, respectively.

Positive feedback is achieved by connecting resistor R24 between node 736 and node 722. Resistor R17 is used to sense the drive current through electrochromic variable transmittance element 2052 and, hence, is typically a low value such as 10 Ω. Resistor R24 is typically a high value such as 1.3 MΩ. As the drive current through resistor R17 increases, the voltage across resistor R17 increases pulling up the voltage at node 736. This increase in the voltage on the positive input terminal of comparator 732 has the regenerative effect of increasing the duty cycle from pulse output 724. This regenerative effect provides better system response at higher temperatures when electrochromic variable transmittance element 2052 has an increased current draw together with an increase in maximum operating voltage. Positive feedback also offsets the effects of internal resistances within electrochromic variable transmittance element 2052.

Figure 59:
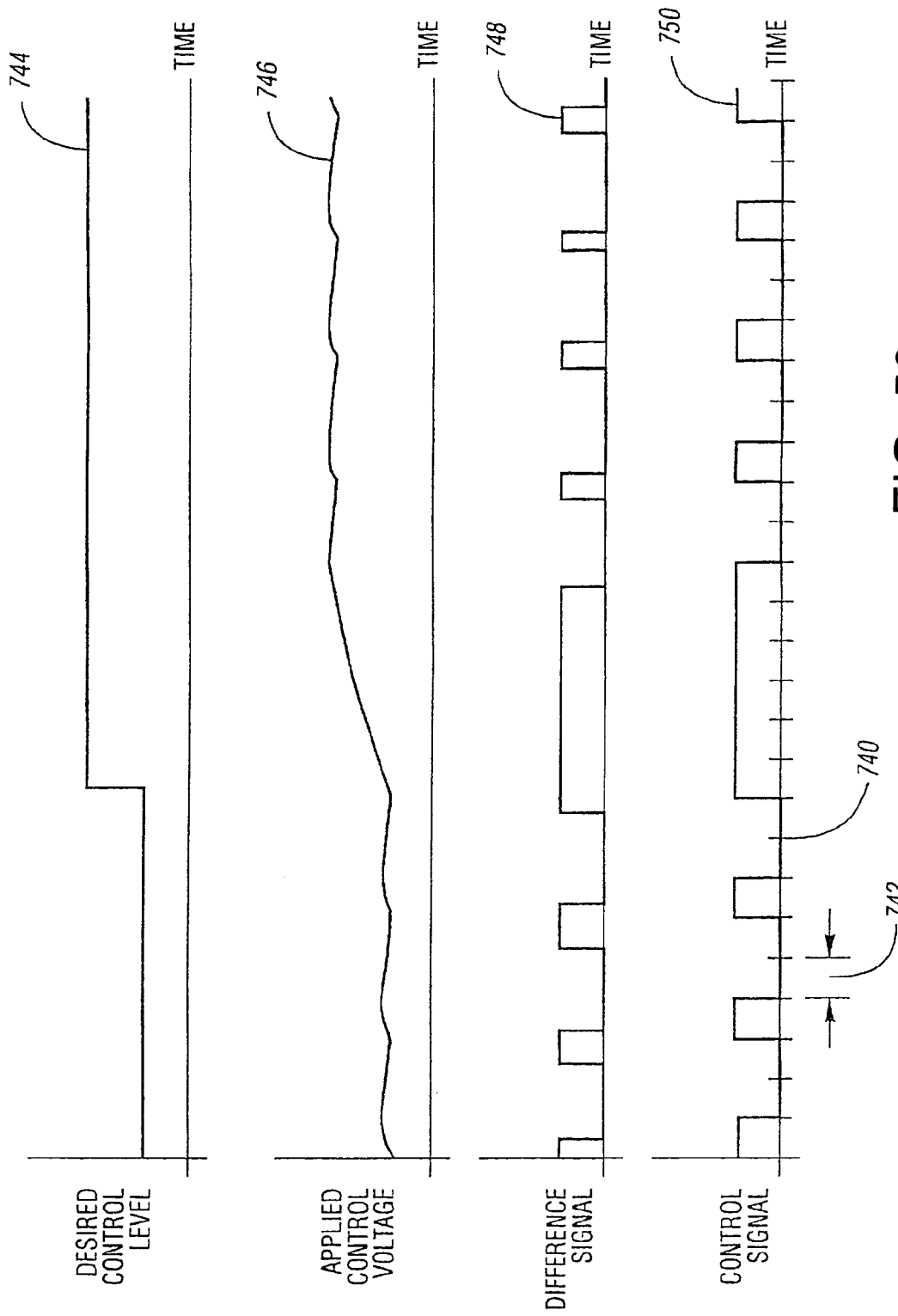
FIG. 59 is a timing diagram illustrating electrochromic element transmittance control.

Referring now to FIG. 59, a timing diagram illustrating electrochromic element transmittance control is shown. During automatic dimming operation, software executing in microcontroller U1 is initiated at transition points, one of which is indicated by 740, separated by fixed transition period 742. Desired control level 744 indicates the desired level of transmittance for electrochromic variable transmittance element 2052. Desired control level 744 may be an analog value or, preferably, is a digital number determined by microcontroller U1. Desired control level 744 is compared to applied control voltage 746 by comparison logic. Comparator 732 accepts applied control voltage 746 and the desired control voltage appearing at node 736. Comparator output 738 produces difference signal 748, which is asserted when the desired voltage level representing desired control level 744 is greater than applied control voltage 746. Comparator output 738 is used to generate control signal 750 on output RB4. If desired control level 744 is greater than applied control voltage 746, digital output RB4 is switched high. If desired control level 744 is less than applied control voltage 746, digital output RB4 is switched low. Preferably, low pass filter 728 filters control signal 750 to produce applied control voltage 746.

The duration of transition period 742 is set to inhibit flicker in electrochromic element 2052 that may be noticed, for example, by the vehicle operator. Transition period 742 may preferably be between two seconds and two microseconds. For the system described above, five milliseconds may be used for transition period 742.

Figure 60:
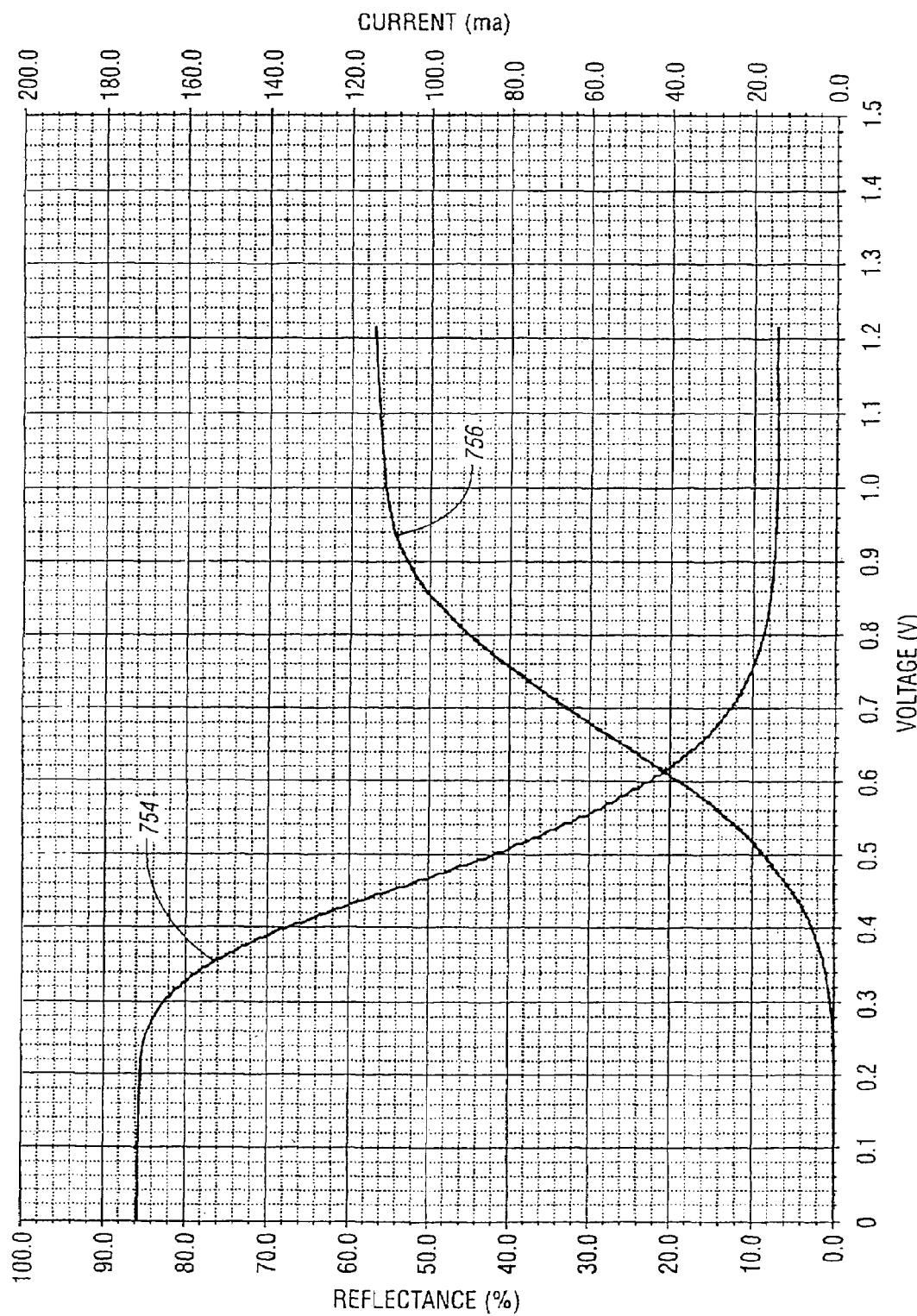
FIG. 60 is a graph indicating dimmer reflectance as a function of dimmer control signal duty cycle.

Referring now to FIG. 60, a graph indicating dimmer reflectance as a function of applied control voltage is shown. Curve 754 plots percent reflectance for dimming element 2050, containing electrochromic variable transmittance element 2052, as a function of applied control voltage 756. Curve 754 indicates a decrease in reflection from about 86% to about 8% as the applied control voltage is increased from about 0.2 volts to about 0.9 volts. FIG. 60 also includes curve 756 illustrating current draw as a function of applied control voltage 756 for typical electrochromic variable transmittance element 2052.

Referring again to FIG. 57, additional circuitry is provided to rapidly clear variably transmissive electrochromic element 2050. Transistor Q11 is connected across variably transmissive electrochromic element 2050 with collector at node 720 and emitter at ground. The base of transistor Q11 is connected through resistor R23 to digital output RB7. When digital output RB7 is asserted, transistor Q11 turns on, acting as a switch to rapidly discharge electrochromic variable transmittance element 2052. Capacitor C6 is connected between the collector and base of transistor Q11 to reduce electromagnetic interference created as transistor Q11 switches. Transistor Q12 is connected between the base of transistor Q10 and ground and controlled by digital output RB7. Transistor Q11 turns on with transistor Q12 to shut off transistor Q10 thereby preventing simultaneously attempting to darken and clear electrochromic variable transmittance element 2052. Resistor R7 is placed between capacitor C16 and the collector of transistor Q12 to limit the discharge current from capacitor C16 through transistor Q12.

Figure 61:
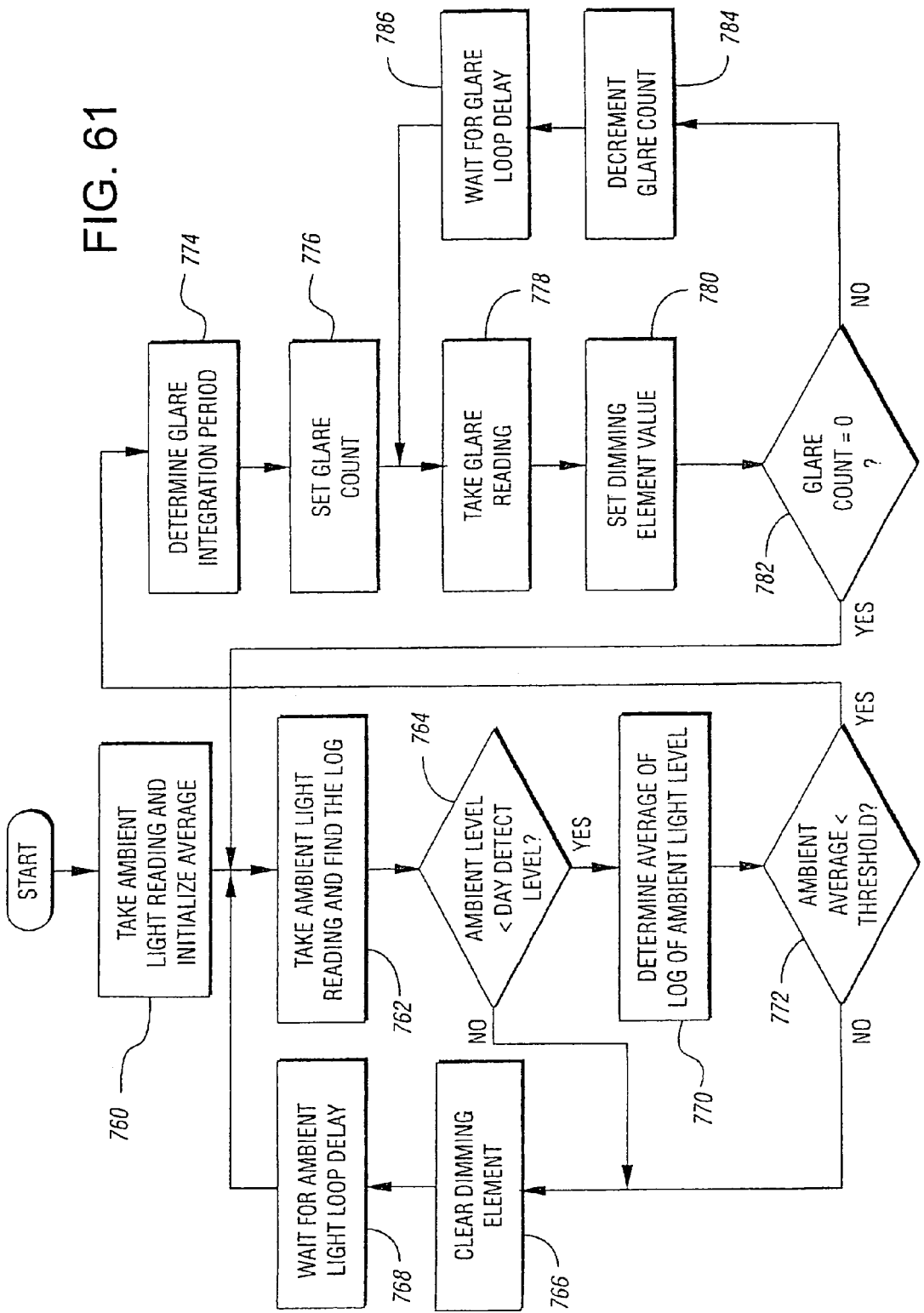
FIG. 61 is a flow diagram illustrating operation of automatically dimming rearview mirror control logic.

Referring now to FIG. 61, a flow diagram illustrating operation of control logic 66 for the rearview mirror 2024, 2026 is shown. As will be appreciated by one of ordinary skill in the art, the operations illustrated in FIG. 61 and other flow diagrams are not necessarily sequential operations. Also, though the operations are preferably implemented by software executing in microcontroller U1, operations may be performed by software, hardware, or a combination of both. The present invention transcends any particular implementation and aspects are shown in sequential flowchart form for ease of illustration.

An ambient light reading is taken and the average ambient light is initialized in block 760. When the automatic dimming system is initially powered up, the average ambient light level is initialized by taking a first reading of forward ambient light 2032 using forward ambient light sensor 50a. Acquiring an ambient light reading and the average ambient light level are described with regard to blocks 762 and 770, respectively, below.

An ambient light reading is taken and the log of the ambient light reading is found in block 762. The use of semiconductor forward ambient light sensor 50a with integral charge collection produces ambient light signal 2060 having good resolution over a wide range of ambient light levels 2032. As described above, this is accomplished by taking various readings of forward ambient light 2032 using different integration periods 242, 248, 254 (FIG. 7). In one embodiment, four separate integration periods are used such as, for example, 600 μs, 2.4 ms, 9.6 ms, and 38.4 ms. Each of these integration periods differs by a factor of four from adjacent periods. Therefore, for example, the 2.4 ms integration period causes forward ambient light sensor 50a to be four times more sensitive to forward ambient light 2032 than does integrating with the 600 μs integration period. Typically, the shortest integration pulse 242 is first used by forward ambient light sensor 50a to produce short signal pulse 244. The width of short signal pulse 244 is measured by control logic 66. Since forward ambient light sensor 50a in complete darkness may still develop short signal pulse 244 having a width less than 100 μs, a minimum threshold is set for accepting short signal pulse 244 as accurately reflecting the level of forward ambient light 2032. Typically, this threshold may be 300 μs. If short signal pulse 244 does not exceed the threshold, the next longest integration period is used by forward ambient light sensor 50a. If the longest integration time does not yield a suitably long signal pulse, forward ambient light 2032 is at an extremely low level and mirror 2024, 2026 can be operated at maximum sensitivity to glare 2034.

Using the logarithm of ambient light signal 2060 permits the use of an inexpensive microcontroller such as U1, which may have only 8-bit internal registers and no multiplication instructions. Since microcontrollers are binary devices, base two logarithms require fewer instructions to compute than base ten logarithms or natural logarithms. An algorithm is now described for obtaining an 8-bit binary logarithm having the most significant 4 bits representing an integer part and the least significant 4 bits a fractional part. The 8-bit ambient light signal 60 resulting from the proper integration period is examined bit by bit, starting with the most significant bit until the first binary one is found. The bit position containing the first binary one becomes the integer portion of the logarithm. The four most significant bits following the bit position containing the first binary one become the fractional portion of the logarithm. This value is incremented by one-sixteenth to better approximate the logarithm. An example of the binary logarithm approximation is now provided. Suppose ambient light signal 2060 is determined to be 44 (00101101 in base two). The most significant asserted bit is bit five, so the integer portion of the resultant value is binary 0101. The next four bits following bit five are 0110 so the fractional part of the resultant value is 0110 for a total value of 0101.0110. After incrementing, the binary logarithm approximation becomes 0101.0111.

Figure 62:
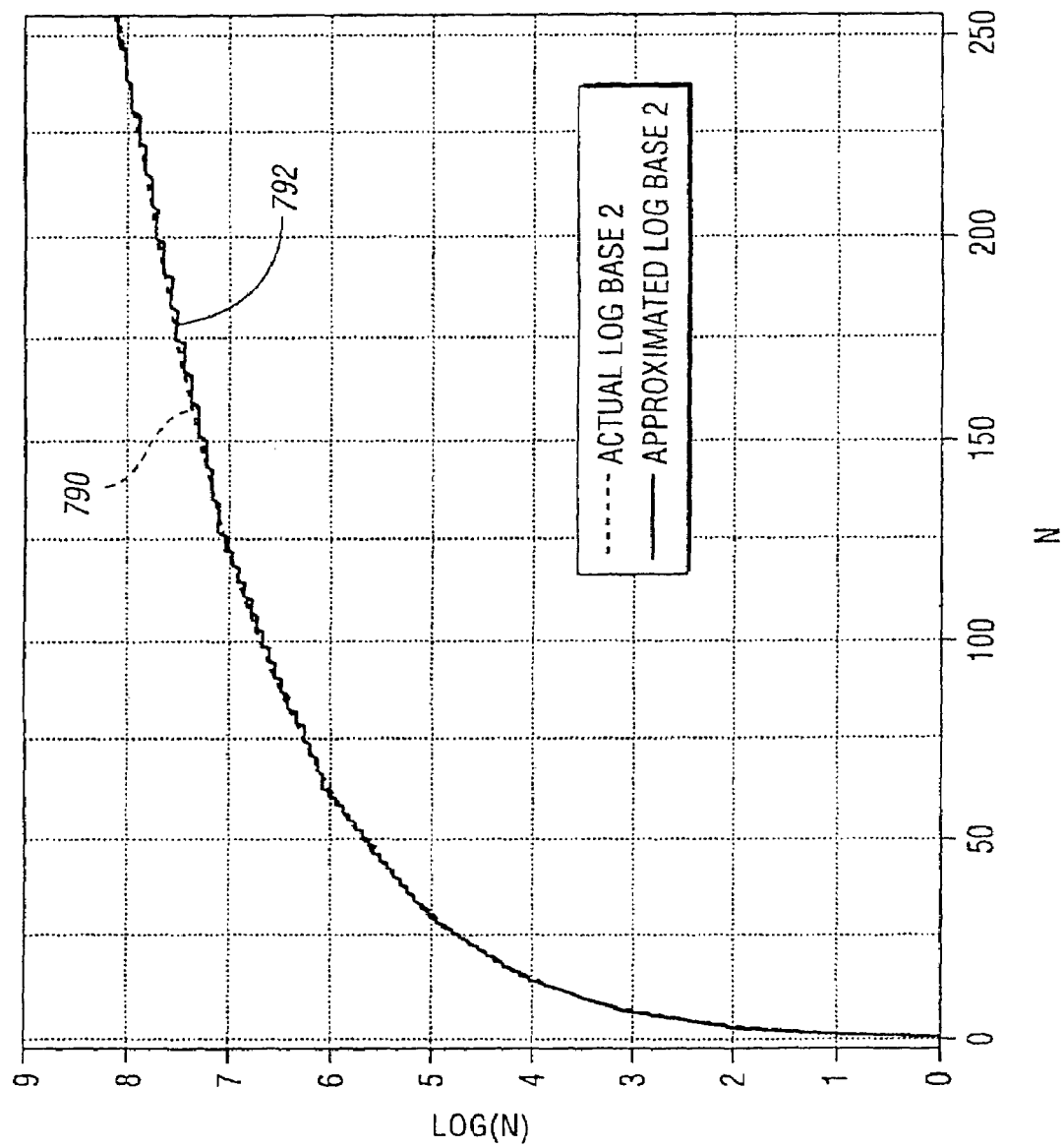
FIG. 62 is a graph illustrating binary logarithmic approximation implemented in an embodiment of control logic for an automatically dimming rearview mirror.

Referring now to FIG. 62, a graph illustrating binary log approximation according to the above algorithm is shown. The binary logarithm is plotted for values of N between 1 and 255. Curve 790 shows the actual binary logarithm. Curve 792 shows the approximated binary logarithm.

Ambient light signal 2060 must be scaled to compensate for different possible integration periods. This may be accomplished by adding a scaling factor to the binary logarithm of ambient light signal 2060. For example, if the longest integration time (38.4 ms) is used to measure forward ambient light 2032, a scale factor of 0 is added. If the next longest integration time (9.6 ms) is used, a scale of factor of 2 is added. If the next longest integration time (2.4 ms) is used, 4 is added. If the shortest integration time (600 µs) is used, 6 is added. Since the largest value resulting from the binary logarithm approximation is 8 (1000.0000), no overflow results from adding the scale factor.

Referring again to FIG. 61, the logarithm of the ambient light level is compared to the day detect level in block 764. The day detect level is a calibrated value stored in microcontroller 66, read only memory, electronically erasable read-only memory, or the like, during manufacture. The day detect level is used to prevent dimming of, or to more rapidly clear dimming element 2050, during rapid transitions from dark to bright such as if the vehicle emerges from a tunnel into daylight If the logarithm of forward ambient light 2032 exceeds a preset day detect level, variable transmittance element 2052 is cleared to set dimming element 2050 to maximum reflectance in block 766. Processing is then delayed in block 768. A wait loop is entered having a time sufficiently long to make the period between taking ambient light readings equal a constant ambient light loop delay. This period may be, for example, 400 ms. Following the wait in block 768, another reading of forward ambient light 2032 is taken in block 762. If the logarithm of forward ambient light 2032 does not exceed the day detect level, an average is obtained in block 770.

The average of the logarithm of ambient light level is determined in block 770. Averaging readings first converted to the logarithm of forward ambient light 2032 reduces the effect of a temporary bright light in front of the vehicle from dramatically skewing the average reading of an otherwise dark forward ambient light 2032. A running average of the log of ambient light signals 2050 may be obtained from a digital low pass filter such as is described by Equation 3:

$$y(n)=x(n)/64+63y(n-1)/64$$

where x(n) is the most recently obtained binary log approximation of ambient light signal 2060 correctly scaled for the integration period, y(n−1) is the previous filter output, and y(n) is the current filter output. The use of averaged logarithms with analog light signals is described in U.S. Pat. No. 5,204,778 entitled "CONTROL SYSTEM FOR AUTOMOTIVE REARVIEW MIRRORS" issued to Jon H. Bechtel.

The average of the log of the ambient light level is compared to a threshold in block 772. The day detect level can be a calibrated value stored in microcontroller 66, read only memory, electronically erasable read-only memory, or the like, during manufacture. If forward ambient light 2032 is sufficiently bright, the vehicle operator will not be dazzled by any reasonable amount of glare 2034, allowing mirror 2024, 2026 to be set to maximum reflectance. Therefore, if the average of the log of ambient light signals 2060 is not less than the threshold, dimming element 2050 is cleared in block 766 and the wait of block 768 is executed. If the average of the log of ambient light signals 2050 is less than the threshold, glare processing occurs beginning in block 774. Typically, the threshold used for comparison in block 772 is less than the day detect level used in the comparison of block 764.

The glare integration period is determined in block 774. The integration period for glare sensor 50b is determined based on ambient light signal 2060. The glare integration period is inversely proportional to the binary antilogarithm of the average of the log of ambient light signal 2060 as described by Equation 4:

$$T_G(n)=\text{antilog}_2(K_1-y(n))-K_2$$

where $T_G(n)$ is the integration period for glare sensor 50b for the filter output at sample time n, $K_1$ is a multiplicative constant, and $K_2$ is an additive constant. Constants $K_1$ and $K_2$ are determined experimentally. If the average of the log of ambient light signal 2060 is below a certain level, a maximum glare sensitivity integration period is used.

A glare count is set in block 776. The glare count indicates the number of glare readings taken between ambient light readings. The product of the glare count and the glare loop delay should equal the time between taking ambient light readings. For example, the glare count may be three and the time between taking glare readings may be 133 ms.

A glare reading is taken in block 778. The pulse width returning from glare sensor 62 as glare signal 2064 is measured for the glare integration period determined in block 774. It is envisioned that a pre-measurement of the glare reading can optionally be made, prior to taking the measurement using the glare integration period determined in step 774, using a very short predetermined integration period similar to the integration period resulting from pulse 240 used for the forward light sensor, and may be an integration period as short as 30 to 40 µs. If this short pre-measurement of glare is greater than a threshold level, the glare sensor is determined to be subject to a very high level of light indicating that the rear sensor is saturated. The mirror may be fully dimmed in response to this condition. If this pre-measurement does not exceed the threshold level, the processing will continue using the glare signal period determined in block 774.

The dimming element value is set in block 780. Glare signal 2064 is used to determine desired control level 744 setting the reflectance for dimming element 2050. This may be accomplished, for example, through the use of a look-up table which associates a lower reflectance with longer glare signal period. The precise relationship between the level of glare 2034 and the setting for variable transmittance element 2052 depends upon factors including the construction of mirror 2024, 2026, the configuration of the vehicle, and preferential settings by the vehicle operator. Desired control level 744 may be used to control variable transmittance element 2052 as described above. For example, a manual actuated mechanism may be provided on the mirror to permit the user to adjust the relationship between the glare level and the transmittance of element 2052.

A check of the glare count is made in block 782. If the glare count is zero, the next ambient light reading is taken in block 762. If the glare count is not zero, the glare count is decremented in block 784. A wait loop is then entered in block 786. The glare loop delay period is set so that glare readings are taken at regular, predetermined intervals.

The use of a cylindrical or bi-radial lens 1720 (FIGS. 40, 43, and 44) for light sensor device to implement the glare sensor 50*b* orientated with the longitudinal axis horizontal provides significant advantages for the automatic control of the electrochromic mirror. The lens radius r (FIG. 44) for this sensor can, for example, be 1.25 mm, producing a focal distance f of 2.5 mm, and the distance d between the exposed surface of the light transducer and the tip of the light sensor encapsulant can be 2.15 mm. The glare sensor 50*b* encapsulant can be transparent, having no diffusant therein. In particular, with the glare sensor positioned in the rearview mirror housing such that the longitudinal axis of the cylindrical lens is oriented horizontally, a wide horizontal viewing angle is achieved.

Figure 63:
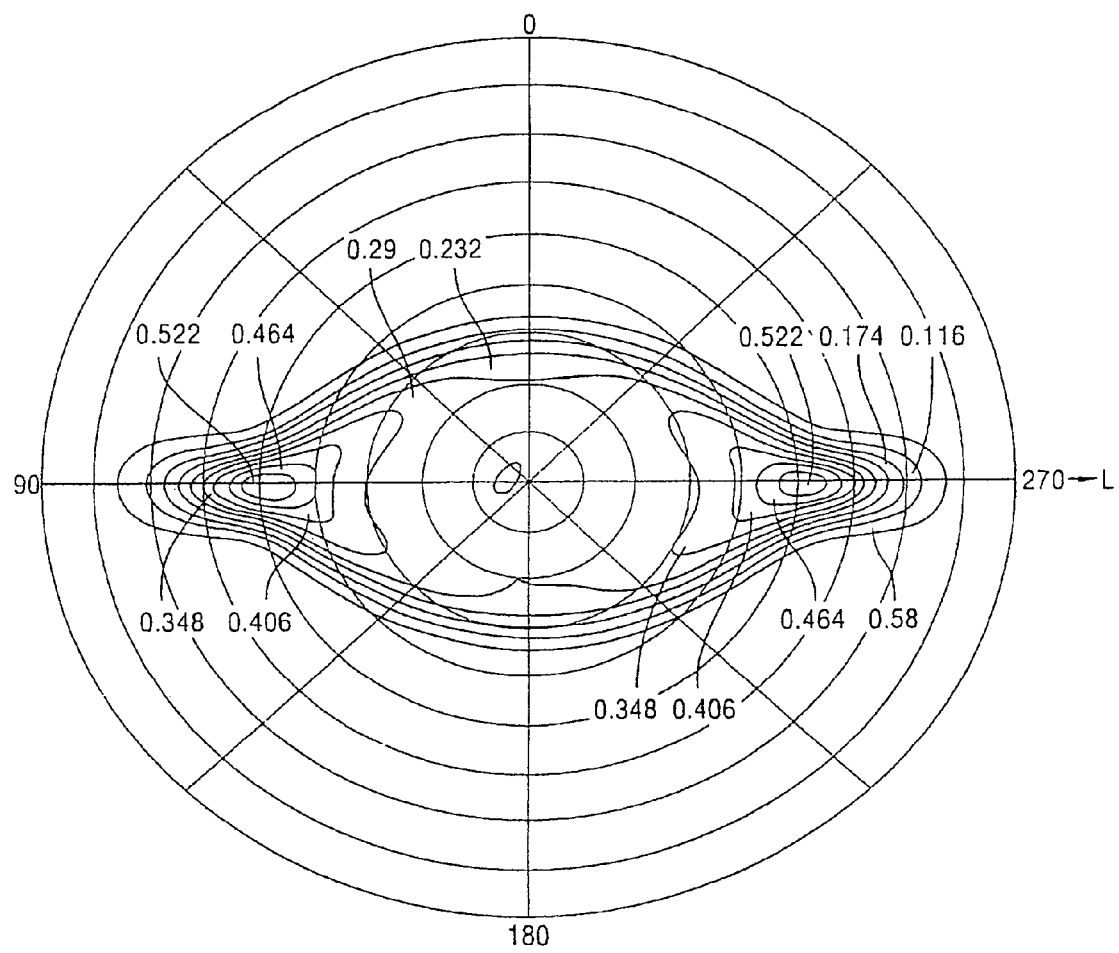
FIG. 63 is a polar iso-candela plot of the light sensor according to FIGS. 43 and 44 having a cylindrical lens.
Figure 64:
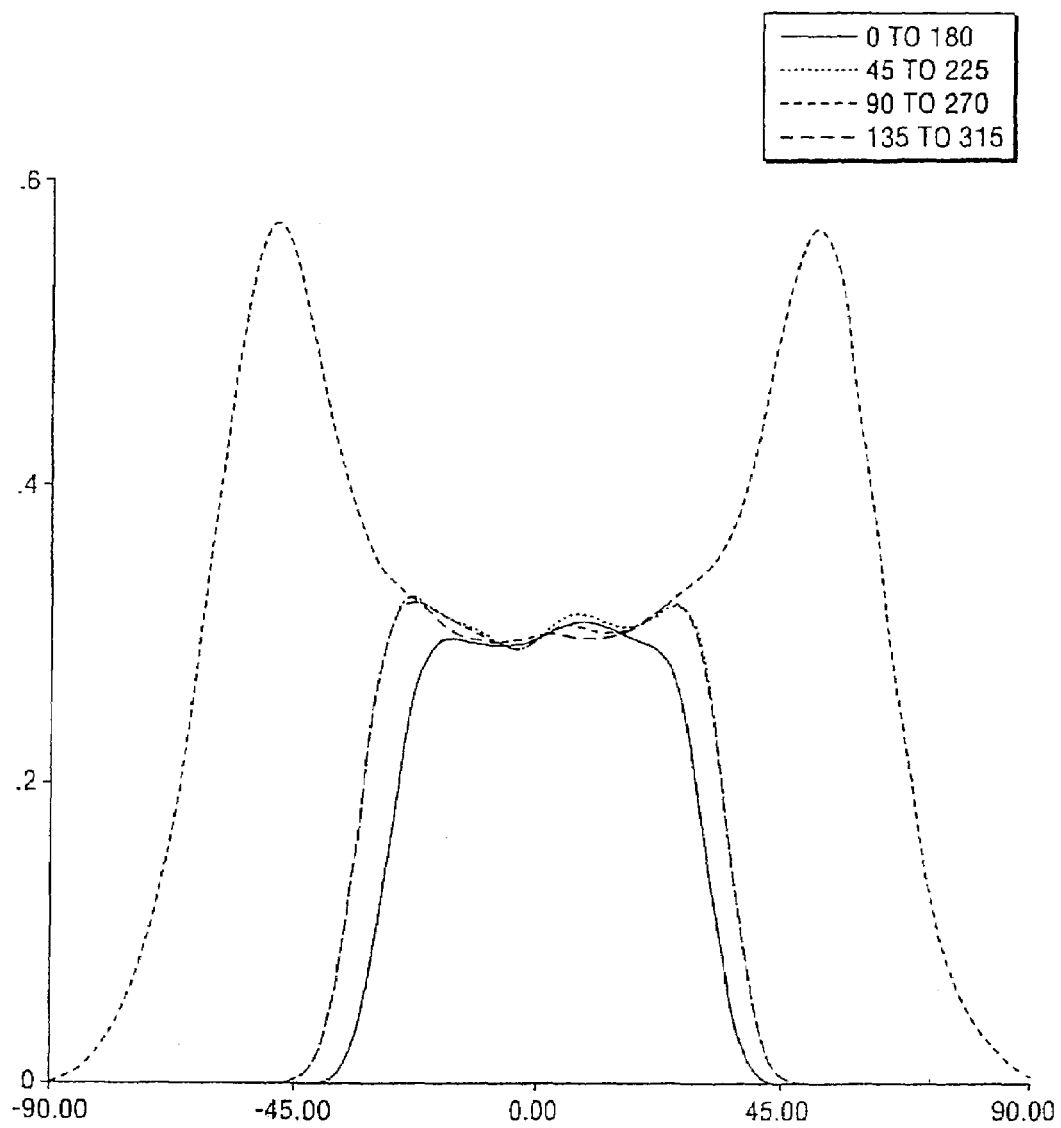
FIG. 64 is a rectangular iso-candela plot according to FIG. 63 viewed orthogonally to the longitudinal axis of the cylindrical lens.

Of particular advantage is the off-axis light sensitivity distribution of the lens 1720, which is shown in FIG. 63. In FIG. 63, the center axis corresponds to the center of the transducer region 532. As can be seen, a cylindrical lens has high off-axis sensitivity along its longitudinal axis. This is better illustrated in the rectangular view of the sensitivity curve shown in FIG. 64. The peak off-axis sensitivity occurs at an angle of approximately 50°. This characteristic can be used to improve detection of light from a passing vehicle, which is of particular interest when the inside mirror controls the outside mirror. In particular, a passing vehicle's headlights will be off axis from the glare sensor located in the interior rearview mirror 2024 even though it is shinning on the exterior rearview mirror 2026. A conventional glare sensor located on the interior mirror will detect diminished light from the passing vehicle, and thus increase the mirror reflectance, when the lights from the passing vehicle no longer shine directly through the rear window. The improved glare sensor device has increased sensitivity to off-axis light, and thus will be increasingly sensitive to lights within viewing angle β. Thus, the reduced reflectivity of mirror 2026 will be maintained until the passing vehicle headlights are no longer visible to the vehicle operator through mirror 2026. Those skilled in the art will recognize that the off-axis distribution of the light sensors can be significantly reduced by adding a diffusant or diffusing projections to the encapsulant, which is preferably done if the cylindrical lens sensor is used to implement ambient sensor 50*a*.

In addition to separately controlling headlamps 1516 (FIG. 24), automatic dimming of mirrors 2024, 2026, and various means for removing moisture from windows such as wipers 1545, climate control 1530 (including a defogger and a defroster), and the like, benefit may be achieved by combining light sensors 50*a*-50*f* and control logic 66 from different applications. For example, control logic 66 can control the state of headlamps 1516 based on the level of light detected by at least one sky ambient light sensor 50*c*. Control logic 66 may also control dimming of at least one rearview mirror 2024, 2026 based on levels of light detected by forward ambient light sensor 50*a* and glare light sensor 50*b*. Control logic 66 may then also turn on headlamps 1516 when the level of light detected by forward ambient light sensor 58 is below a threshold level. This would turn on headlamps 1516 in situations such as tunnels or extended overpasses when overhead lighting may provide sufficient light detected by sky ambient light sensor 50*c* to turn headlamps 1516 off, but the area in front of the vehicle is relatively dimly lit.

In another example, control logic 66 determines the amount of moisture on a cleared area of a window of the vehicle, such as the windshield or the rear window, based on the output from at least one moisture sensor 50*f*. Control logic 66 controls means for removing moisture (collectively the windshield wipers 1545 and the defroster and defogger of climate control 1530) based on the determined amount of moisture. Control logic 66 further controls the dimming of rearview mirror 2024, 2026 based on the amount of moisture and the levels of light detected by forward ambient light sensor 50*a* and glare light sensor 50*b*. This would permit control logic 66 to undim mirror 2024, 2026 if a window through which light was received by forward ambient light sensor 50*a* or glare light sensor 50*b* was covered by moisture such as frost, snow, fog, and the like. Also, for a window cleaned by wipers 1545, readings from forward ambient light sensor 50*a* or glare light sensor 50*b* may be ignored during intervals when one of the wipers 1545 passes in front of light sensor 50*a*, 50*b*.

In still another example where control logic 66 determines the amount of moisture on a cleared area of a window of the vehicle and controls means for removing moisture 1545, 1530, the control of headlamps 1516 may be based on detected moisture as well as the level of light detected by one or more sky ambient light sensors 50*c*. Again, this would permit control logic 66 to set headlamps 1516 to a predetermined state if a window through which light was received by forward skyward light sensor 50*c* was covered by moisture. Also, for a window cleaned by wipers 1545, readings from skyward ambient light sensor 50*c* may be ignored during intervals when one of the wipers 1545 passes in front of light sensor 50*c*.

The present invention may be readily adapted to control other equipment on the vehicle besides or in addition to headlamps 1545, automatic dimming of mirrors 2024, 2026, and various means for removing moisture from windows 1545, 1530. For example, electrically powered windows, sunroofs, moon roofs, convertible tops, and the like may be automatically closed when moisture such as rain is detected. Also, various lighting in addition to headlamps 1516, such as running lights, park lights, puddle lights, courtesy lights, dashboard lights, and the like may be automatically controlled based on one or more of ambient lighting conditions, the detection of moisture, the running state of the vehicle, and the like. The state of passenger compartment heating and cooling systems, including air conditioning, heater, vent positions, windows, and the like may be automatically controlled based on one or more of ambient lighting conditions, the detection of moisture, the running state of the vehicle, internal temperature, external temperature, and the like.

Control logic 66 for receiving light signals 164 from multiple light sensors 50 and generating control signals for equipment of the vehicle may be in one housing or may be distributed throughout the vehicle. Elements of control logic 66 may even be included within light sensors 50. Elements of control logic 66 may be interconnected through a variety of means including discrete wiring, buses, optical fiber, radio, infrared, and the like. Control logic 66 may comprise many cooperating processors or a single multitasking processor. Operations may be implemented in software, firmware, custom hardware, discrete logic, or any combination. The present invention does not depend on the method or means of implementing control logic 66.

It is envisioned that outside fog of the type requiring activation of front and/or rear fog lights could be automatically detected using a reflected light detection system substantially similar to that provided for the moisture detector. To detect such outside fog, a light source and sensor are spaced by a distance such that light from the emitter that will be detected by the sensor is reflected from a point several meters from the vehicle. Under circumstances where the detected reflected light level is substantially constant, greater than a threshold level, and continuously detected over a substantial period of time, front and/or rear vehicle fog lamps can be turned on automatically.

Thus, it can be seen that an improved equipment control system is disclosed. The system is easier to manufacture since variations in the performance of the light sensors can be compensated for in the microcontroller. The mirror is readily manufacturable by automated means. Additionally, the system can be provided at a lower cost as low cost control logic can be utilized. The system reliably detects light over a wide light range and with significantly reduced temperature dependence.

The above description is considered that of the preferred embodiment only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. A rearview assembly for use in a vehicle, said rearview assembly comprising:
    a housing adapted to be mounted to the vehicle;
    a rearview element disposed in said housing for providing an image to the driver of the rearward view from the vehicle, said rearview element comprising a reflective surface, wherein a substantially transparent window is formed in said reflective surface; and
    a glare sensor subassembly mounted behind said window in said rearview element so as to sense light passing through said window of said rearview element, said glare sensor subassembly comprising a non-imaging glare sensor device and a secondary optical element positioned between said glare sensor device and said rearview element, said secondary optical element comprising a component providing a lens function, wherein said glare sensor device comprises:
    a support structure;
    a sensing circuit mounted on said support substrate for sensing light and generating an electrical output signal in response thereto; and
    an encapsulant encapsulating said sensing circuit on said support structure, said encapsulant being configured to define a lens portion for focusing incident light onto an active surface of said sensing circuit, and a light collector portion surrounding the lens portion for collecting and redirecting light that is not incident on the lens portion onto the active surface of said sensing circuit, wherein said light collecting portion includes a parabolic surface.

2. The rearview assembly of claim 1, wherein said parabolic surface redirects incident light towards said sensing circuit by total internal reflection.

3. A rearview assembly for use in a vehicle, said rearview assembly comprising:
    a housing adapted to be mounted to the vehicle;
    a rearview element disposed in said housing for providing an image to the driver of the rearward view from the vehicle; and
    a glare sensor device mounted behind said rearview element so as to sense light passing through said rearview element, said glare sensor device comprising:
    a support structure;
    a sensing circuit mounted on said support substrate for sensing light and generating an electrical output signal in response thereto; and
    an encapsulant encapsulating said sensing circuit on said support structure, said encapsulant being configured to define a lens portion for focusing incident light onto an active surface of said sensing circuit, and a light collector portion surrounding the lens portion for collecting and redirecting light that is not incident on the lens portion onto the active surface of said sensing circuit, wherein said light collecting portion includes a parabolic surface.

4. The rearview assembly of claim 3, wherein said support structure is a portion of a lead frame.

5. The rearview assembly of claim 4, wherein said portion of the lead frame includes at least two leads electrically coupled to said sensing circuit, and wherein said leads are retained by said encapsulant.

6. The rearview assembly of claim 3, wherein said lens portion is elliptical.

7. The rearview assembly of claim 6, wherein said light collecting portion includes an annular light receiving surface that lies in a plane perpendicular to the major axis of said elliptical lens portion and is disposed around said elliptical lens portion.

8. The rearview assembly of claim 3, wherein said parabolic surface redirects incident light towards said sensing circuit by total internal reflection.

9. The rearview assembly of claim 3 and further comprising a secondary optical element mounted between said glare sensor device and said rearview element.

* * * * *